United States Patent
Georgy et al.

(10) Patent No.: US 11,968,591 B2
(45) Date of Patent: Apr. 23, 2024

(54) MAINTENANCE OF A LOCATION FINGERPRINT DATABASE FOR AN AREA

(71) Applicant: InvenSense, Inc., San Jose, CA (US)

(72) Inventors: Jacques Georgy, Calgary (CA); Chris Goodall, Calgary (CA); Gennadii Berkovich, Calgary (CA); Abdelrahman Ali, Calgary (CA); Zhengrong Cheng, Calgary (CA); Salah Abdelnaby, Calgary (CA)

( * ) Notice: Subject to any disclaimer, the term of this patent is extended or adjusted under 35 U.S.C. 154(b) by 0 days.

(21) Appl. No.: 16/735,765

(22) Filed: Jan. 7, 2020

(65) Prior Publication Data

US 2020/0304953 A1 Sep. 24, 2020

Related U.S. Application Data

(60) Provisional application No. 62/820,823, filed on Mar. 19, 2019.

(51) Int. Cl.
| | |
|---|---|
| *H04W 4/029* | (2018.01) |
| *H04W 4/02* | (2018.01) |
| *G01R 33/10* | (2006.01) |
| *G01S 5/02* | (2010.01) |
| *G01S 5/16* | (2006.01) |
| *G01S 5/18* | (2006.01) |

(52) U.S. Cl.
CPC ........... *H04W 4/029* (2018.02); *H04W 4/026* (2013.01); *H04W 4/027* (2013.01); *G01R 33/10* (2013.01); *G01S 5/0252* (2013.01); *G01S 5/16* (2013.01); *G01S 5/18* (2013.01)

(58) Field of Classification Search
CPC ..... H04W 4/029; H04W 4/026; H04W 4/027; G01R 33/10; G01R 33/02; G01R 33/072; G01S 5/0252; G01S 5/16; G01S 5/18; G01S 5/02522; G01S 5/0294; G01S 5/02527
USPC ...................................................... 455/456.1
See application file for complete search history.

(56) References Cited

U.S. PATENT DOCUMENTS

| | | | |
|---|---|---|---|
| 9,451,404 B2* | 9/2016 | Al-Najjar | H04W 4/023 |
| 10,271,179 B1* | 4/2019 | Shima | G01S 5/0278 |
| 2013/0162481 A1* | 6/2013 | Parvizi | G01S 5/0205 |
| | | | 342/452 |
| 2014/0249771 A1* | 9/2014 | Yang | G01S 5/0252 |
| | | | 702/150 |
| 2015/0198694 A1* | 7/2015 | Waters | G01S 19/46 |
| | | | 342/451 |
| 2015/0198721 A1* | 7/2015 | Waters | G01S 5/02524 |
| | | | 342/357.29 |
| 2017/0010098 A1* | 1/2017 | Georgy | G01C 21/005 |
| 2018/0220264 A1* | 8/2018 | Alsehly | H04W 4/023 |
| 2018/0279251 A1* | 9/2018 | Wigren | G01S 11/06 |

(Continued)

*Primary Examiner* — Rafael Perez-Gutierrez
*Assistant Examiner* — Frank E Donado

(57) ABSTRACT

In a method of maintenance of a location fingerprint database for an area, signal measurement data is collected together with motion sensor data from each of a plurality of portable devices transiting a portion of the area of the location fingerprint database. The motion sensor data is collected by a sensor assembly in each of the plurality of portable devices. Offline non-causal processing is used to process the collected motion sensor data into reference positions associated with the portion of the area. The collected signal measurement data is employed together with the reference positions to update the location fingerprint database.

32 Claims, 16 Drawing Sheets

700

COLLECT SIGNAL MEASUREMENT DATA TOGETHER WITH MOTION SENSOR DATA FROM EACH OF A PLURALITY OF PORTABLE DEVICES TRANSITING A PORTION OF THE AREA OF THE LOCATION FINGERPRINT DATABASE, WHEREIN THE MOTION SENSOR DATA IS COLLECTED BY A SENSOR ASSEMBLY IN EACH OF THE PLURALITY OF PORTABLE DEVICES
710

↓

USE OFFLINE NON-CAUSAL PROCESSING TO PROCESS THE COLLECTED MOTION SENSOR DATA INTO REFERENCE POSITIONS ASSOCIATED WITH THE PORTION OF THE AREA
720

↓

EMPLOY THE COLLECTED SIGNAL MEASUREMENT DATA TOGETHER WITH THE REFERENCE POSITIONS TO UPDATE THE LOCATION FINGERPRINT DATABASE
730

(56) References Cited

U.S. PATENT DOCUMENTS

2018/0332558 A1\* 11/2018 Chan ..................... H04W 24/02
2021/0204241 A1\* 7/2021 Zhang ................... H04W 64/00

\* cited by examiner

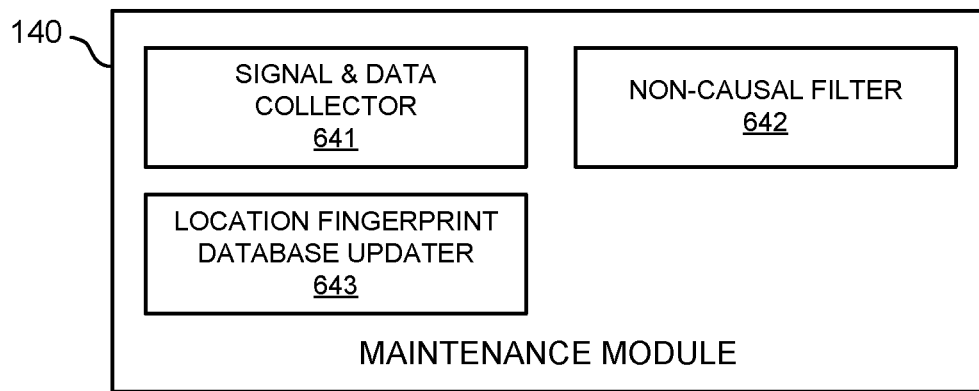

COLLECT SIGNAL MEASUREMENT DATA TOGETHER WITH MOTION SENSOR DATA FROM EACH OF A PLURALITY OF PORTABLE DEVICES TRANSITING A PORTION OF THE AREA OF THE LOCATION FINGERPRINT DATABASE, WHEREIN THE MOTION SENSOR DATA IS COLLECTED BY A SENSOR ASSEMBLY IN EACH OF THE PLURALITY OF PORTABLE DEVICES
710

USE OFFLINE NON-CAUSAL PROCESSING TO PROCESS THE COLLECTED MOTION SENSOR DATA INTO REFERENCE POSITIONS ASSOCIATED WITH THE PORTION OF THE AREA
720

EMPLOY THE COLLECTED SIGNAL MEASUREMENT DATA TOGETHER WITH THE REFERENCE POSITIONS TO UPDATE THE LOCATION FINGERPRINT DATABASE
730

ACCESSING A PLURALITY OF INITIAL LOCATION FINGERPRINT DATABASES COMPRISING AT LEAST A STABLE LOCATION FINGERPRINT DATABASE AND AN UNSTABLE LOCATION FINGERPRINT DATABASE
1810

COLLECTING SIGNAL MEASUREMENT DATA TOGETHER WITH MOTION-BASED DATA FROM EACH OF A PLURALITY OF PORTABLE DEVICES TRANSITING A PORTION OF THE AREA OF THE UNSTABLE LOCATION FINGERPRINT DATABASE
1820

DETERMINING REFERENCE POSITIONS ASSOCIATED WITH LOCATIONS IN THE UNSTABLE LOCATION FINGERPRINT DATABASE BY USING THE AT LEAST ONE STABLE LOCATION FINGERPRINT DATABASE TO PROCESS THE COLLECTED SIGNAL MEASUREMENT DATA AND THE MOTION-BASED DATA INTO THE REFERENCE POSITIONS
1830

EMPLOYING THE REFERENCE POSITIONS AND THE SIGNAL MEASUREMENT DATA TO REVISE UNSTABLE DATA IN THE UNSTABLE LOCATION FINGERPRINT DATABASE
1840

SUBSEQUENT TO EMPLOYING THE REFERENCE POSITIONS AND THE SIGNAL MEASUREMENT DATA TO UPDATE UNSTABLE DATA IN THE AT LEAST ONE UNSTABLE LOCATION FINGERPRINT DATABASE, INTERPOLATING INFORMATION BETWEEN THE REFERENCE POSITIONS OF THE UNSTABLE FINGERPRINT DATABASE
1850

FIG. 18B

MAINTENANCE OF A LOCATION FINGERPRINT DATABASE FOR AN AREA

CROSS-REFERENCE TO RELATED APPLICATION—PROVISIONAL

This application claims priority from and benefit of U.S. Provisional Patent Application Ser. No. 62/820,823, filed Mar. 19, 2019, which is entitled "UPDATING FINGERPRINT DATABASES USING MOTION SENSOR DATA,", and which is assigned to the assignee hereof and is incorporated by reference in its entirety.

CROSS-REFERENCE TO RELATED APPLICATION

This application is related to U.S. patent application Ser. No. 16/735,761, filed on Jan. 7, 2020, which is entitled "REVISING AN UNSTABLE LOCATION FINGERPRINT DATABASE FOR AN AREA," by Gennadii Berkovich et al., and which is assigned to the assignee hereof and is incorporated by reference in its entirety.

BACKGROUND

Portable electronic devices, such as those configured to be handheld or otherwise associated with a user, are employed in a wide variety of applications and environments. Increasingly, such devices are equipped with one or more sensors or other systems for determining the position or motion of the device. Notably, devices such as smartphones, tablets, smart watches or other devices may feature Global Navigation Satellite Systems (GNSS) receivers, low cost Micro Electro-Mechanical Systems (MEMS) inertial sensors, barometers, and magnetometers. One important type of information that may be determined is the navigation solution for the portable device, which may include position, velocity and attitude, position and attitude, position and velocity, position and speed, attitude alone or other combinations of these quantities. The navigation solution may also include other related quantities, such as the quantities used to estimate the errors in input data. Reference-based techniques employ an absolute source of navigational information, such as GNSS as noted, but other examples of absolute navigational information include WiFi® positioning, cellular tower positioning, Bluetooth® low energy (BLE) positioning beacons and the like, which generally rely on trilateration and/or triangulation strategies. However, some mass market applications require seamless positioning capabilities in all kinds of environments such as malls, offices or underground parking lots. In the absence of GNSS signals, an Inertial Navigation System (INS) may be used by employing techniques such as dead reckoning to help determine position. INS is a self-contained and/or "non-reference based" technique that utilizes inertial sensors within the moving object and does not depend upon external sources of information that can become interrupted or blocked. Motion sensors are self-contained within the moving object and measure motion, such as through the use of gyroscopes to measure the object's rate of rotation/angle and accelerometers to measure the object's specific force (from which acceleration is obtained). Using initial estimates of position, velocity and orientation angles of the moving object as a starting point, the INS readings can subsequently be integrated over time to provide a navigation solution. Typically, measurements are integrated (mathematical integration which is a calculus operation) once for gyroscopes to yield orientation angles and twice for accelerometers to yield position of the moving object incorporating the orientation angles. Thus, gyroscope measurements will undergo a triple integration operation during the process of yielding position. Integrated navigation techniques usually integrate (i.e., combine) reference-based or absolute navigational information with self-contained or non-reference based navigation information. Integrated navigation techniques may employ state estimation techniques, such as a Kalman filter, an extended Kalman filter, a particle filter, or others, which have characteristics including a prediction phase and an update phase (which may also be termed a measurement update phase). A state estimation technique also uses a system model and measurement model(s) based on what measurements are used. The system model is used in the prediction phase, and the measurement model(s) is/are used in the update phase.

Due to the integration operations (the mathematical integration, as in calculus), motion sensor-based techniques may fail to provide an adequate performance standalone, particularly over longer durations due to significant performance degradation from accumulating sensor drifts and biases. As such, positioning technologies relying solely on motion sensors may not satisfy all requirements for seamless indoor and outdoor navigation applications. As a result, alternative positioning techniques that can provide coverage in areas where access to other reference-based positioning is degraded or denied have been developed. One class of techniques is known as "fingerprinting," and relies on recording patterns of signals (e.g., one or more of acoustic signals, radio signals, wireless networking signals, magnetic signals, and optical signals) at known locations within an area for which position information may be desired. These fingerprinting techniques can be used to create of a location fingerprint database for an area, which can be used as a map to determine location of a device within the area. For example, when a device subsequently measures a pattern of received signals that is correlated with a known location in a location fingerprint database, that location may be used to determine the position of the device and/or to aid another positioning technique, such as through integration with the INS techniques noted above. A suitable example of signals that may be used for fingerprinting may be based on the communication signals for an IEEE 802.11 Wireless Local Area Network (WLAN), commonly referred to as "WiFi." However, many different electromagnetic signals and other types of signals are suitable for location determinations using fingerprinting, including: other wireless communication signals such as Bluetooth® and radio frequency identification (RFID), environmental signals such as magnetic fields, acoustic signal intensity, or optical signal intensity.

As noted, a location fingerprint database must be built to correlate the signal patterns with known locations. Unfortunately, building these databases is a time-consuming and resource-intensive procedure. Generally, one or more surveys are performed during which the signal fingerprints are recorded. In part, the quality of the survey depends on planning the routes taken while the survey is conducted. Using the planned routes, one or more surveyors, which may be one or some combination of persons or automated machines, collect measurements of signals while logging position. The routes must be designed to cover the desired area, and the planning and traversing of the routes may constitute a tedious and expensive process.

BRIEF DESCRIPTION OF DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers. It should be noted that components and flow diagram blocks shown in dashed line are optional and may or may not be included.

FIG. 6 is a block diagram of a maintenance module in accordance with various embodiments.

FIG. 7 illustrates a flow diagram of a method of maintenance of a location fingerprint database for an area, in accordance with various embodiments.

FIGS. 18A and 18B illustrate a flow diagram of an illustrative method of revising an unstable location fingerprint database for an area, in accordance with various embodiments.

DESCRIPTION OF EMBODIMENTS

Figure 1:
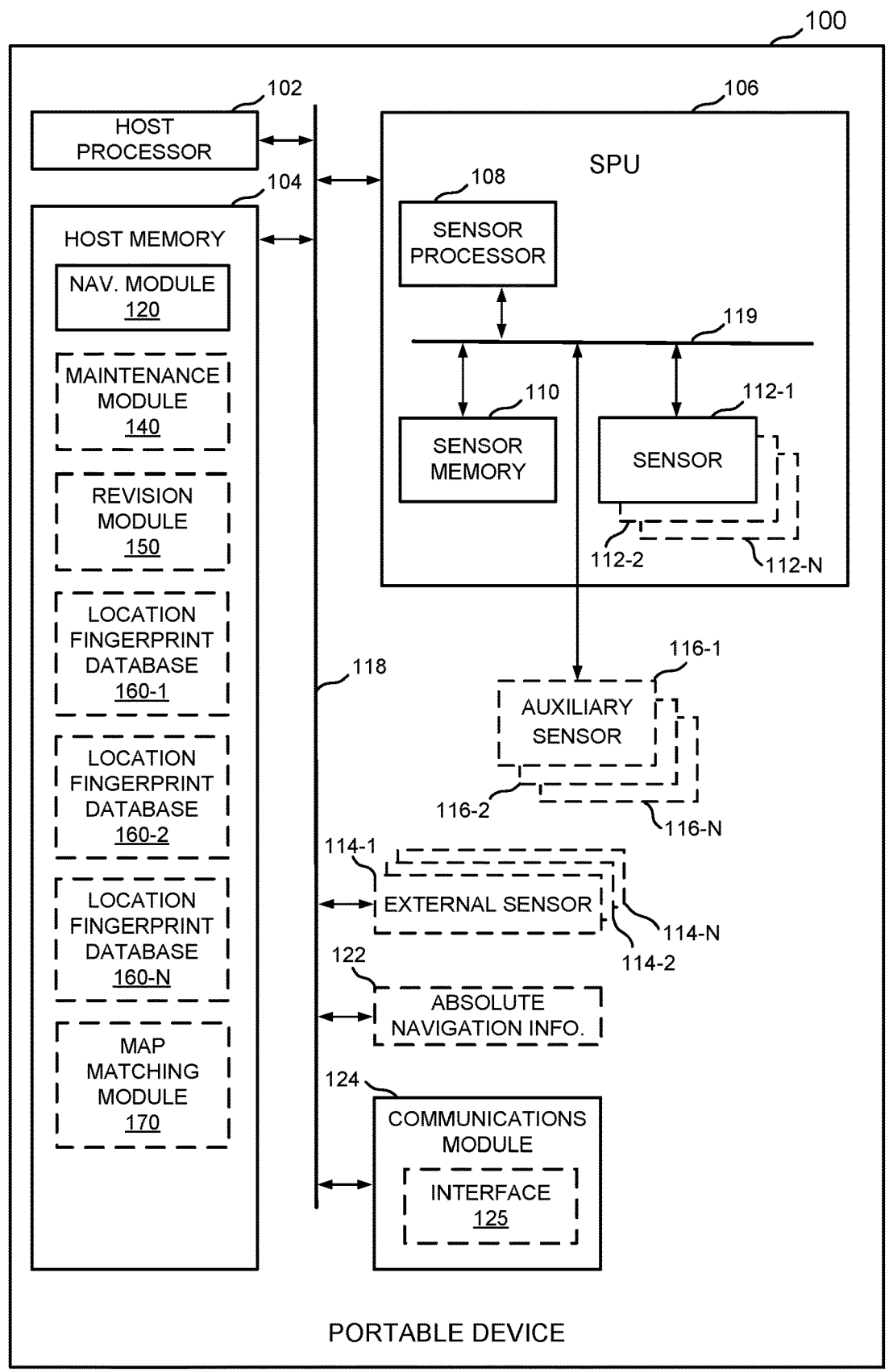
FIG. 1 is a schematic block diagram of portable device, in accordance with various aspects embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Overview of Discussion

Generally speaking, many reasons or types of changes can cause degradation of a location fingerprint database; such degradation decreases the positioning accuracy provided using said location fingerprint database for an area it serves. Fingerprint databases are especially sensitive to environment changes. For example, a magnetic fingerprint database for an indoor area of a building may change if the magnetic field in the area changes due to building reconstruction, restructuring or modification. A radio signal location fingerprint database for an area, may be sensitive to changes in placement to the sources of the radio signals and may also be sensitive to placement or movement of items which block propagation or reflect radio signals. For example, if the radio signals are from WiFi access points, the radio signal location fingerprint database will be sensitive to change of placement of physical WiFi access points (APs), removal of APs, or adding new APs. Virtual access points (VAPs) are widely used because they allow the creation of several Basic Service Set Identifiers (BSSIDs) for a single physical AP and provide different security options for different users. BSSIDs are derived from the MAC address of the physical AP. In case of VAPs, change of position of one physical AP can affect several BSSIDs in WiFi signal location fingerprint database and may cause significant degradation of the WiFi fingerprint database that decreases positioning accuracy. Similarly, a radio signal location fingerprint database based on BLE beacons will be sensitive to changes in the locations of the BLE beacons, removal of BLE beacons, or addition of new BLE Beacons. Other types of location fingerprint databases have their own sensitivities to changes. For example, an acoustic signal location fingerprint database is sensitive to additions, subtractions, or changes to an environment of items which generate sound or impact the propagation of sound. Similarly, an optical signal location fingerprint database is sensitive to the additions, subtractions, or changes to an environment of items which generate light or impact the propagation of light.

Such changes lead to necessity of upkeeping location fingerprint databases, e.g., by periodical resurvey of a venue or area of the location fingerprint database (or a portion thereof). A full resurvey may be costly and require a periodical spending of considerable labor and time resources. Conventionally, this same planning used for an initial survey may be required with performing upkeep of a location fingerprint database for an area. This may be impractical in many contexts such as a major retailer that may have thousands of stores or an underground transportation network spanning through a whole city. The impracticality may be due to expense, size of the area, time required, frequency in which upkeep is required, or other factors. One method to avoid laborious resurvey and the associated planning is based on use of everyday activity of plurality of persons inside an area of the location fingerprint database while they are moving (i.e., in a shopping mall, an airport, a parking garage, etc.); each person carries a portable device 100 capable of providing measurements. This method is known as "crowdsourcing" and is very attractive because it does not require special resurvey of the area covered by the location fingerprint database. However, a problem that it presents is how to determine correct reference locations at instants of crowdsourced measurements when a location fingerprint database is no longer accurate.

Crowd sourcing or other methods to determine reference positions significantly rely on inertial sensor measurements and prognosis algorithms like (pedestrian) dead reckoning (PDR). However, low-cost inertial sensors of mobile devices may not guarantee position determination with desired accuracy because dead reckoning algorithms can quickly accumulate large position errors, in addition to other challenges of portable navigation with any varying orientation and use case.

Herein, more accurate methods for determining reference positions are described for crowdsourcing. These methods can be used for a variety of purposes, including but not limited to: bridging gaps or interpolating data to fill smaller holes in existing location fingerprint databases; maintaining, updating and/or revising a location fingerprint database (such as healing a location fingerprint database); and building a new location fingerprint database. These methods can be used with planned survey routes, unplanned survey routes, and crowd sourced survey routes. That is, they may be used with pre-planned or ad hoc survey data collection.

According to the techniques of this disclosure, systems and methods are provided for maintenance of a location fingerprint database for an area as well as revising an unstable location fingerprint database for an area. The discussion below is divided into four sections. Section 1 describes notation and nomenclature which may be applied to Sections 2, 3, and 4. Section 2 describes a variety of hardware including: an example portable device, an example server computer, and some arrangements of systems which may be utilized in to implement aspects of various embodiments. As part of this hardware discussion some depictions of areas associated with location fingerprint databases are introduced. Section 3 describes methods for maintenance of a location fingerprint database for an area. The methods described in Section 3 may be implemented using the hardware described in Section 2. Section 4 describes methods for revising an unstable location fingerprint database for an area. The methods described in Section 4 may be implemented using the hardware described in Section 2.

Section 1

Notation and Nomenclature

It is to be understood that the terminology used herein is for the purpose of describing particular embodiments of this disclosure only and is not intended to be limiting. It is also to be understood that terms of art as used herein are to be given their accepted meanings known to one of ordinary skill in the art. Where appropriate, terms may also be given explicit definitions in the specification to convey their intended meaning.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the disclosure in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "collecting," "using," "employing," "building," "bridging," "determining," "updating," "revising," "modifying," "collecting," "accessing," "rejecting," "comparing," "replacing," "merging," "continuing collection," "predicting," "matching," "map-matching," "off-line map-matching," "non-causal processing," "smoothing," "forward processing," "forward smoothing," "backward processing," "backward smoothing," "multi-pass smoothing," "utilizing," "receiving," "off-line processing," "processing," "interpolating," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example portable devices and computers described herein may include components other than those shown, including well-known components.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of methods described herein. The non-transitory processor-readable data storage medium may form part of a computer program product, which may include packaging materials.

With regard to software, the embodiments and techniques described herein may be implemented in software as various interconnected functional blocks or distinct software modules. This is not necessary, however, and there may be cases where these functional blocks or modules are equivalently aggregated into a single logic device, program or operation with unclear boundaries. In any event, the functional blocks and software modules implementing the embodiments described herein, or features of the interface can be implemented by themselves, or in combination with other operations in either hardware or software, either within the device entirely, or in conjunction with the device and other processor enabled devices in communication with the device, such as a server.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor. For example, a carrier wave may be employed to carry computer-readable electronic data such as those used in transmitting and receiving electronic mail or in accessing a network such as the Internet or a local area network (LAN). Of course, many modifications may be made to this configuration without departing from the scope or spirit of the claimed subject matter.

The various illustrative logical blocks, modules, circuits and instructions described in connection with the embodiments disclosed herein may be executed by one or more processors, such as one or more motion/sensor processing units (MPUs/SPUs), digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU and a microprocessor, a plurality of microprocessors, one or more microprocessors in conjunction with an SPU core, or any other such configuration. Herein, an SPU may be referred to as an MPU (Motion Processing Unit) when its integrated sensors comprise inertial sensors.

Unless defined otherwise, all technical and scientific terms used herein have the same meaning as commonly understood by one having ordinary skill in the art to which the disclosure pertains.

Reference throughout this document to "one embodiment," "certain embodiments," "an embodiment," "various embodiments," "some embodiments," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics of any embodiment may be combined in any suitable manner with one or more other features, structures, or characteristics of one or more other embodiments without limitation.

Finally, as used in this specification and the appended claims, the singular forms "a, "an" and "the" include plural referents unless the content clearly dictates otherwise.

Section 2

Devices and Systems

FIG. 1 is a schematic block diagram of portable device 100, in accordance with various aspects embodiments. Portable device 100 may be utilized in various aspects of maintenance of a location fingerprint database for an area and/or revision of an unstable location fingerprint database for an area. As will be appreciated, portable device 100 may be implemented as a device or apparatus, such as a handheld device that can be moved in space by a surveyor and its motion, location and/or orientation in space therefore sensed. For example, such a handheld device may be a mobile phone (e.g., smartphone, cellular phone, a phone running on a local network, or any other telephone handset), tablet, personal digital assistant (PDA), video game player, video game controller, navigation device, wearable device (e.g., glasses, watch, belt clip), fitness tracker, virtual or augmented reality equipment, mobile internet device (MID), personal navigation device (PND), digital still camera, digital video camera, binoculars, telephoto lens, portable music, video or media player, remote control, or other handheld device, notebook computer, laptop computer, or a combination of one or more of these devices. Such devices may be associated with a platform that conveys the device. The platform may be a human surveyor, as in the example of a smartphone being carried as the surveyor walks or otherwise traverses a route through an area associated with a location fingerprint database. The platform may also be considered a vehicle or vessel that conveys the surveyor and the device.

In some embodiments, the platform conveying the device may be driven by a human user, involving any suitable guidance or control, including direct or remote control. Alternatively, the platform itself may be automated and may convey the device without the need for a human operator. Still further, the device may be dedicated to the function of surveying and in some embodiments may be capable of automated motion on its own without a separate platform. Accordingly, the dedicated device may be propelled or guided by a human surveyor or may be automated, such as in the form of a robot or drone. The surveyor may be on a pre-planned survey route through an area or the surveyor may by an ad hoc surveyor (perhaps unbeknownst to the surveyor) that just happens to be transiting through an area and collecting the motion data/motion-based data and signal measurement data (e.g., non-inertial measurement data such as magnetometer measurements, radio signal measurements (signals from any radio signal source), broadcast radio station signal measurements (i.e., from broadcasting radio signals such as those broadcast from Amplitude Modulated (AM) and/or Frequency Modulated (FM) commercial radio stations), wireless networking signal measurements, optical signal measurements, acoustic signal measurements, etc.) needed to perform maintenance or a revision for a location fingerprint data for the area. An example of an ad hoc surveyor is one who has been crowdsourced.

During a survey, magnetometer measurements may be taken on one or more axes at any suitable rate, but as a demonstrative example in some embodiments the rate of 20-50 Hz may be utilized as it typically permits a sufficient amount of magnetometer measurements to be accumulated relatively quickly. During a survey, scan rates for radio signal measurements, broadcast radio station signal measurements (from radio signals broadcasting from one or more commercial radio stations such as those broadcasting talk/music), and wireless networking signal measurements may be accomplished at any suitable rate. The scan(s) may record received signal strength (RSS). In some embodiments, by way of demonstrative example, a scan for WiFi wireless networking received signal strength indicator (RSSI) may be at 0.2 or 0.3 Hz, however other scan rates may be utilized. An RSSI is typically paired with a BSSID for a networking signal measurement. Similarly, for other radio signal measurements and broadcast radio station signal measurements, an RSSI is typically paired with another identifier such as the frequency of the radio signal or broadcasting radio station signal (such as those broadcast from Amplitude Modulated (AM) and Frequency Modulated (FM) commercial radio stations). Because some types of radio frequency scans may be performed at a lower scan rate than magnetometer scan rates, it could take considerably longer to gather the same number of RSSI scans as compared to the number of magnetic measurements that can be gathered in fixed amount of time. Other types of signals such as optical signals, or acoustic signals may be measured at any suitable rate. When enough survey data is collected from enough unique portable devices 100, such as via crowdsourcing, the disparity between the amount of data for particular types of signal measurements from received from any single portable device 100 has no consequence with respect to the methods described herein.

Although device 100 may be transported or conveyed in the direction of movement of the platform depending on the embodiment, its orientation and motion within the platform may vary whether in a constrained or in non constrained manner. Returning to the example of the smartphone, it may be held in the surveyor's hand and employed in a variety of orientations or carried in a pocket, holster, bag or other manners. In other examples, device 100 may be strapped to the platform, such as fixed to a robot or vehicle, or may be non-strapped. When non-strapped, the mobility of device 100 may be constrained or unconstrained within the platform and as a result, circumstances may exist such that the device can be tilted to any orientation with respect to the surveyor or platform. For example, a device 100 may be constrained within a platform by being deposited in a cradle, holder or the like. Depending on the design, some motion may still be possible, but that motion is nevertheless constrained in a substantial manner. Likewise, a constrained device 100 may repositioned while still being constrained, such as when rotated from portrait to landscape or vice versa. Thus, device 100 is constrained, but may be able to pivot around an axis. Constrained devices 100 are not considered strapped because their mounting is not permanent and/or allow some types of motion. Conversely, an unconstrained device 100 is not connected in a constraining way to the platform, such as when the device is being held and freely manipulated by a user rather than being placed in a holder, cradle, or belt-clip for example. It should be understood that constrained and unconstrained are used to represent relatively different degrees of restriction. Thus, while being unconstrained may refer to being held by a user, the device 100 is nevertheless not floating freely in space but is less restricted than a device 100 held in a cradle or belt-clip for example.

As shown, device 100 includes a host processor 102, a host memory 104, a sensor processing unit 106, and a communications module 124 which are all communicatively coupled, such as by bus 118. In some embodiments, device 100 may also include one or more external sensors 114 and/or an absolute navigation information 122.

Host processor 102 may be any suitable processor(s). For example, host processor 102 can be one or more microprocessors, CPUs, DSPs, GPUs, general purpose microprocessors, ASICs, ASIPs, FPGAs or other processors that run software programs associated with the functions of device 100. These programs may be stored in memory, such as host memory 104 (or elsewhere).

Host memory 104 may be any combination of computer readable medium such as electronic memory or other storage medium such as hard disk, optical disk, etc. Multiple layers of software and/or stored data can be provided in host memory 104 for use with host processor 102. For example, an operating system layer can be provided for device 100 to control and manage system resources in real time, enable functions of application software and other layers, and interface application programs with other software and functions of device 100. Similarly, different software application programs such as menu navigation software, games, camera function control, navigation software, communications software, such as telephony or wireless local area network (WLAN) software, or any of a wide variety of other software and functional interfaces can be provided. In some embodiments, multiple different applications can be provided on a single device 100, and in some of those embodiments, multiple applications can run simultaneously.

As depicted, host memory 104 includes a navigation module 120 in one embodiment. In other embodiments, host memory 104 may additionally or alternatively include one or more other modules or stored data such as: maintenance module 140, revision module 150, and/or local storage of all or portions of one or more location fingerprint databases 160 (160-1, 160-2 . . . 160-N).

Sensor processing unit (SPU) 106 is a sensor assembly included with device 100. SPU 106 includes a sensor processor 108, a sensor memory 110, and at least one sensor 112 (e.g., 112-1, 112-2 ... 112-N) which are communicatively coupled, such as by bus 119. When sensor processing unit 106 comprises integrated inertial sensors 112 it may also be referred to as a motion processing unit (MPU).

Sensor processor 108 may be any suitable processor(s). For example, sensor processor 108 can be one or more microprocessors, CPUs, DSPs, GPUs, general purpose microprocessors, ASICs, ASIPs, FPGAs or other processors that run software programs, which may be stored in memory, such as sensor memory 110 (or elsewhere), associated with the functions of SPU 106. Sensor processor 108 operates to control and configure included sensors such as sensor(s) 112 and in some embodiments auxiliary sensor(s) 116. Sensor processor 108 may also run software programs for portable device 100. For example, different software application programs such as navigation software and location fingerprint mapping, location fingerprint maintenance, and/or location fingerprint revision software may be implemented in logic or in firmware, software, or a combination thereof that executes instructions upon sensor processor 108. It should be appreciated that in some embodiments, the functions described as being performed by sensor processor 108 may also or alternatively be performed by host processor 102 or another communicatively coupled processor.

Sensor memory 110 can be any suitable type of computer readable medium, including but not limited to electronic memory (e.g., read only memory (ROM), random-access memory (RAM), or other electronic memory). Sensor memory 110 may store algorithms, routines or other instructions for processing data output by sensor(s) 112 and/or other sensors as described below using logic or controllers of sensor processor 108, as well as storing raw data and/or motion data output by sensor 112 or other sensors. Sensor memory 110 may be incorporated with or in the same package, integrated circuit, or on the same circuit board as other components of sensor processing unit 106.

Sensor(s) 112 may be one or more inertial sensors such as a gyroscope and/or an accelerometer for measuring motion of device 100 in space and may include one or more sensors for measurement of one or more of: acoustic signals, radio signals, wireless networking signals, magnetic signals, and optical signals. Sensor(s) 112 may be incorporated with or in the same package, integrated circuit, or on the same circuit board as other components of sensor processing unit 106.

In an embodiment where sensor(s) 112 include at least one inertial sensor, depending on the configuration, SPU 106 measures one or more axes of rotation and/or one or more axes of acceleration of the device 100 in which SPU 106 is disposed. In such embodiments, sensor processing unit 106 may be considered a motion processing unit. In various embodiments, a sensor(s) 112 may include one or some combination of rotational motion sensors and linear motion sensors. For example, the rotational motion sensor(s) may be gyroscopes to measure angular velocity along one or more orthogonal axes and the linear motion sensor(s) may be one or more accelerometers to measure specific forces along one or more orthogonal axes. In one aspect, three gyroscopes and three accelerometers may be employed, such that a sensor fusion operation performed by sensor processor 108, or other processing resources of device 100, combines data from sensor 112 to provide a six-axis determination of motion. As desired, sensor 112 may be implemented using Micro Electro-Mechanical System (MEMS) to be integrated with SPU 106 in a single package. Example details regarding suitable configurations of host processor 102 and SPU 106 may be found in, commonly owned U.S. patent application Ser. No. 11/774,488, filed Jul. 6, 2007, and Ser. No. 12/106,921, filed Apr. 11, 2008, which are hereby incorporated by reference in their entirety. Suitable implementations for SPU 106 in device 100 are available from InvenSense, Inc. of Sunnyvale, California Although described in the context of one or more sensors being MEMS based, the techniques of this disclosure may be applied to any sensor design or implementation.

In some embodiments, sensor processing unit 106 may output the raw data from inertial sensors 112. Herein, this raw data is referred to as "motion sensor data." Herein, "motion-based data" is a broader category which includes both raw data from inertial sensors 112 and processed data from inertial sensors 112. In some embodiments, sensor processing unit 106 may process the raw data from inertial sensors 112 to determine inertial-based data such as displacements and changes of orientation of the portable device 100 in within which SPU 106 is disposed. After processing, such displacements and changes of orientation may be output from SPU. In some embodiments, by way of demonstrative example, preprocessed inertial-based data (i.e., displacement and/or change of orientation) may have a rate of 1-2 Hz when collected from or provided by a portable device 100, however other rates are possible and anticipated.

In some embodiments, one or more sensors 112 may be an acoustic sensor, such as a microphone or a plurality of microphones, which measure acoustic signals such as the frequency and/or amplitude of sound in an environment in which device 100 is operated. In some embodiments, the acoustic sensor(s) may also measure a directional location from device 100, of a measured sound. The sounds measured may be human audible sounds or sounds that are above or below the frequency range of human hearing. The acoustic signals may be sonic, subsonic, ultrasonic, or some combination. For location fingerprinting uses, an acoustic signal measurement may be associated with contemporaneous measurement of the position of device 100 (i.e., during a current epoch of a navigation measurement for determining a reference position).

In some embodiments, one or more sensors 112 may be a magnetic signal sensor, such as a Hall effect or Lorentz field magnetometer or combination thereof. A magnetometer or magnetometers, when included as a sensor 112, may capture measurements along three orthogonal axes and output data to be fused with inertial sensors, gyroscope and accelerometer, data to provide a nine-axis determination of motion (i.e., as inertial data) or as a record of environmental data which is non-inertial. A magnitude of a magnetic field is one type of signal data which may be measured by a magnetic signal sensor 112. A change in the Lorentz force is another type of data which may be measured. For location fingerprinting uses, a magnetic signal measurement may be associated with contemporaneous measurement of the position of device 100 (i.e., during a current epoch of a navigation measurement for determining a reference position).

In some embodiments, one or more sensors 112 may be a barometric sensor, such as an air pressure sensor or barometer. When included, a barometric sensor to provide an altitude determination that may be fused with the other sensor data (e.g., gyroscope, accelerometer, magnetometer) to provide a ten-axis determination of motion or as a record of environmental data which is non-inertial. For location fingerprinting uses, a barometric pressure measurement may be associated with contemporaneous measurement of the position of device 100 (i.e., during a current epoch of a navigation measurement for determining a reference position). The measured barometric pressure may be associated with a reference barometric pressure for the region (i.e., from an airport, weather service, or previously measured by the same portable device 100). An offset from the reference barometric pressure may be measured or recorded.

In some embodiments, one or more sensors 112 may be a radio signal sensor, which may be used to measure the frequency of a radio signal, amplitude of a radio signal, and/or directional location of a radio signal from device 100 of a radio signal. The radio signal may be any type of radio signal from any radio signal source including, but not limited to, a broadcast radio station signal (from radio signals broadcasting from one or more commercial radio stations), a broadcast television station signal, a broadcast amplitude modulated radio signal from a commercial radio station, a broadcast frequency modulated radio signal from a commercial radio station, a wireless networking/communication radio signal, a cellular telephony radio signal, etc. It should be noted that radio signals from commercial radio and television broadcast stations are typically from large fixed antennas which are seldom moved (due to their size), and thus may be less susceptible to changes when used for fingerprinting than signals from sources which may be easily moved. More than one type of data may be measured from a radio signal and different types of signal data measured from a radio signal may be associated (e.g., paired, tripleted, etc.) in time or in other manner with one another.

In some embodiments, a radio signal sensor 112 may be included which is specialized to measure frequencies associated with wireless networking signals, which may include but are not limited to: WiFi signals specified by various Institute of Electrical and Electronics Engineers (IEEE) 802.11 protocol standards; signals from wireless local area network (WLAN) technologies such as Universal Terrestrial Radio Access (UTRA); wireless personal area network signals (e.g., Zigbee, Bluetooth, Bluetooth Low Energy, beacons, etc.) such as those specified by various IEEE 802.15.4 protocols or similar commercial standards; signals from Code Division Multiple Access (CDMA) networks, Global System for Mobile Communications (GSM), WiMAX signals such as those specified in the IEEE 802.16 protocols; signals from Long Term Evolution (LTE) networks. RSS or RSSI are examples of types of data that may be measured and collected from a radio signal. A BSSID is one type of data which may be measured and collected from a wireless networking radio signal. A received channel power indicator (RCPI) is one type of data that may be measured and collected from a wireless networking radio signal. For location fingerprinting uses, a radio signal measurement and/or a wireless networking signal measurement may be associated with contemporaneous measurement of the position of device 100 (i.e., during a current epoch of a navigation measurement for determining a reference position).

In some embodiments, one or more sensors 112 may be an optical signal sensor, which measures the frequency of light, amplitude of light, received intensity of light, and/or directional location of light from device 100. The light measured may be in a human visible spectrum or in a spectrum, such as near infrared or ultraviolet, which is not visible to humans. For location fingerprinting uses, an optical signal measurement may be associated with contemporaneous measurement of the position of device 100 (i.e., during a current epoch of a navigation measurement for determining a reference position).

Alternatively, or in addition, device 100 may implement a sensor assembly in the form of one or more external sensor(s) 114 (114-1, 114-2 ... 114-N). This is optional and not required in all embodiments. An external sensor 114, when included, may represent one or more sensors as described above in conjunction with sensors 112. As used herein, "external" means a sensor that is not integrated with SPU 106. An external sensor 114 typically "belongs to" the host (i.e., portable device 100) and may be coupled with SPU 106 via host bus 118.

Also, alternatively or in addition, SPU 106 may receive data from one or more auxiliary sensors 116 (116-1, 116-2 ... 116-N) configured to measure one or more aspects about the environment surrounding device 100. This is optional and not required in all embodiments. An auxiliary sensor 116, when included, may represent one or more sensors as described above in conjunction with sensors 112. An auxiliary sensor 116 is typically connected directly to SPU 106, not via host bus 118.

In the embodiment shown, host processor 102, host memory 104, SPU 106 and other components of device 100 may be coupled through bus 118. Similarly, in the embodiment shown, components of SPU 106 may be coupled through bus 119. Bus 118 and 119 may be the same or different types of busses, and each may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. For example, additional buses may be used to couple the various components of device 100, such as by using a dedicated bus between host processor 102 and host memory 104.

Navigation module 120, in some embodiments, operates on host processor 102 to derive navigation solutions for device 100 as a route or path is traversed through an area associated with a location fingerprint database. That is, navigation module 120 comprises a set of suitable instructions stored in host memory 104 that may be read and executed by host processor 102. Although it should be realized that other implementations may also be employed. The navigation solution(s) used to derive the surveyor trajectory may include any suitable information related to the position, motion and/or orientation of portable device 100. A navigation solution may include position, velocity and attitude, position and attitude, position and velocity, position and speed, attitude alone or other combinations of these quantities. The navigation solution may also include other related quantities, such as the quantities used for the errors in input data. The term navigation used in this application is not limited to online or real-time navigation solutions, it may also include offline or post-processing solutions among others. Although discussed primarily in the context of dead reckoning, which may be considered a self-contained strategy, navigation module 120 may employ a reference-based strategy, another self-contained strategy, or any combination of strategies to provide any desired degree of location awareness capabilities. For example, navigation module 120 may employ inertial navigation techniques utilizing sensor data, such as from sensor 112, external sensor 114, and/or auxiliary sensor 116, as obtained for a current sensor epoch to derive a navigation solution for that epoch. In some embodiments, the navigation solutions derived by navigation module 120 represent contemporaneous determinations of information for device 100. Although some transmission, some possible buffering, and processing time may be required, the results are at least near real-time (there could be some possible latencies) and may use any information available up until the time each navigation solution is derived. In other embodiments, the navigation solutions may be derived by navigation module 120 or equivalent processing resources at a subsequent time as an offline or post-processing operation. Still further, navigation module 120 may also be configured to determine a motion mode that indicates the surveyor's motion patterns, which may include without limitation, walking, driving, running, flying, going up/down stairs, riding an elevator, walking/standing on an escalator, and other similar motion patterns.

Absolute navigation information 122, when included, provides navigation module 120 with information to facilitate a reference-based strategy, such as a Global Navigation Satellite System (GNSS) receiver, including without limitation the Global Positioning System (GPS), the Global Navigation Satellite System (GLONASS), Galileo and/or Beidou, as well as WiFi™ positioning, personal area network signals, cellular tower positioning, Bluetooth® positioning beacons or other similar methods when deriving a navigation solution. This is optional and not required in all embodiments.

Navigation module 120 may also be configured to use information from a wireless communication protocol to provide a navigation solution determination using signal trilateration. Any suitable protocol, including cellular-based and wireless local area network (WLAN) technologies such as Universal Terrestrial Radio Access (UTRA), Code Division Multiple Access (CDMA) networks, Global System for Mobile Communications (GSM), the Institute of Electrical and Electronics Engineers (IEEE) 802.16 (WiMAX), Long Term Evolution (LTE), IEEE 802.11 (WiFi) and others may be employed.

Communications module 124, which is typically included in device 100, is for transmitting and/or receiving information, including the positions derived by navigation module 120 and location fingerprinting data measured by sensors 112, 114, and/or 116. In some embodiments, communications module 124 may include one or more interfaces 125 which allow it to communicate with, access information from, and/or provide information to other devices 100, one or more location fingerprint databases, and/or one or more computers such as server 200.

An interface 125 may be an application program interface or other type of interface which allows communication between two platforms such as between two hardware platforms, between two software platforms, or between a hardware platform and a software platform. Herein, an interface 125 may be configured to receive signal measurement data together with motion sensor data and/or motion-based data from each of one or more other portable devices 100 transiting a portion of the area of a location fingerprint database. Similarly, an interface 125 may be configured to communicate signal measurement data together with motion sensor data from or to a server computer 200.

Multiple layers of software may be employed as desired and stored in any combination of host memory 104, sensor memory 110, or other suitable location. For example, a motion algorithm layer can provide motion algorithms that provide lower-level processing for raw sensor data provided from the motion sensors and other sensors. A sensor device driver layer may provide a software interface to the hardware sensors of device 100. Further, a suitable application program interface (API) may be provided to facilitate communication between host processor 102 and SPU 106, for example, to transmit desired sensor processing tasks.

Since one of the functions of device 100 when traversing through an area associated with a location fingerprint database is to record signal measurements at multiple positions along the route traversed, a variety of strategies may be employed depending on the type of location fingerprint database being generated and the nature of the signals being recorded. For a WiFi signal location fingerprint database, device 100 may record the representative characteristics of radio frequency signals used for wireless networking, such as received signal strength indication (RSSI) for transmissions from access points within range using communications module 124, provided it is equipped for a WiFi protocol. Likewise, communications module 124 may also be used to record measurements for radio frequency signals related to other wireless communication protocols, radio signals, or beacons, as warranted. Alternatively, or in addition, a dedicated sensor may be used to record the radio and/or wireless networking fingerprint measurements, such as in the form of sensor 112, external sensor 114, and/or auxiliary sensor 116. In one example, when generating a magnetic signal location fingerprint database, a sensor 112, an external sensor 114, an auxiliary sensor 116, or another sensor may be a magnetometer. In another example, when generating an optical signal location fingerprint database, a sensor 112, an external sensor 114, an auxiliary sensor 116, or another sensor may be an optical sensor. In yet another example, when generating an acoustic signal location fingerprint database, a sensor 112, an external sensor 114, an auxiliary sensor 116, or another sensor may be an acoustic sensor such as a microphone or an arrangement of microphones. Likewise, for other signals which may be used in fingerprinting, any appropriate sensor may be employed.

Maintenance module 140, when included, operates on host processor 102 to maintain a location fingerprint database for an area. Maintenance module 140 comprises a set of suitable instructions stored in host memory 104 (or elsewhere) that may be read and executed by host processor 102. Although it should be realized that other implementations may also be employed and that maintenance module 140 may be implemented on other processors including processors outside of portable device 100. The operation of maintenance module 140 is described in greater detail in Section 3 of this detailed description.

Revision module 150, when included, operates on host processor 102 to revise a location fingerprint database for an area, and in particular is operable to revise an unstable location fingerprint database for an area. Revision module 150 comprises a set of suitable instructions stored in host memory 104 (or elsewhere) that may be read and executed by host processor 102. Although it should be realized that other implementations may also be employed and that revision module 150 may be implemented on other processors including processors outside of portable device 100. The operation of revision module 150 is described in greater detail in Section 4 of this detailed description.

A location fingerprint database 160 (e.g., 160-1, 160-2 . . . 160-N), when included, comprises organized data which correlates previously recorded signal patterns with known reference positions. Many different types of the signal patterns are discussed herein, but the signal pattern may be for any type of signal used for location fingerprinting. In one embodiment, for example, location fingerprint database 160-1 comprises a radio signal location fingerprint database for a first area; location fingerprint database 160-2 comprises a magnetic signal location fingerprint database for a second area; and location fingerprint database 160-N comprises an optical signal location fingerprint database for a third area. Location fingerprint databases 160-1, 160-2 . . . 160-N may be for the same or different areas. The areas covered may or may not have overlap. These are only examples and may be different in other embodiments. In various embodiments, a portable device 100 may locally store all, some, or none of the data for a particular location fingerprint database 160. In some embodiments, there may be no location fingerprint databases 160 stored locally on a portable device 100. When a particular location fingerprint database 160 (e.g., 160-2) is stored remotely from portable device 100, in some embodiments, portable device 100 may access this remotely location fingerprint database if and as required via communications module 124 and/or interface 125.

Map matching module 170, when included, operates on host processor 102 to map reference positions to map coordinates in existing maps in order to more accurately geolocate the reference positions and/or navigation solutions in a manner which is geographically constrained by comparison with an existing map which encompasses the area of the navigation solution, reference position, etc. As a simplified explanation, consider an example where a reference position initially corresponds to being within a wall with respect to a map of a building's floor plan. Because the interior of a wall is inaccessible to a surveyor with a portable device 100, the reference location may be constrained by map matching module 170 to an area that is accessible such as a hallway which is bounded by the wall. Map matching module 170 comprises a set of suitable instructions stored in host memory 104 (or elsewhere) that may be read and executed by host processor 102. Although it should be realized that other implementations may also be employed and that map matching module 170 may be implemented on other processors including processors outside of portable device 100. The operation of map matching module 170 is described in greater detail in Section 3 of this detailed description.

Figure 2A:
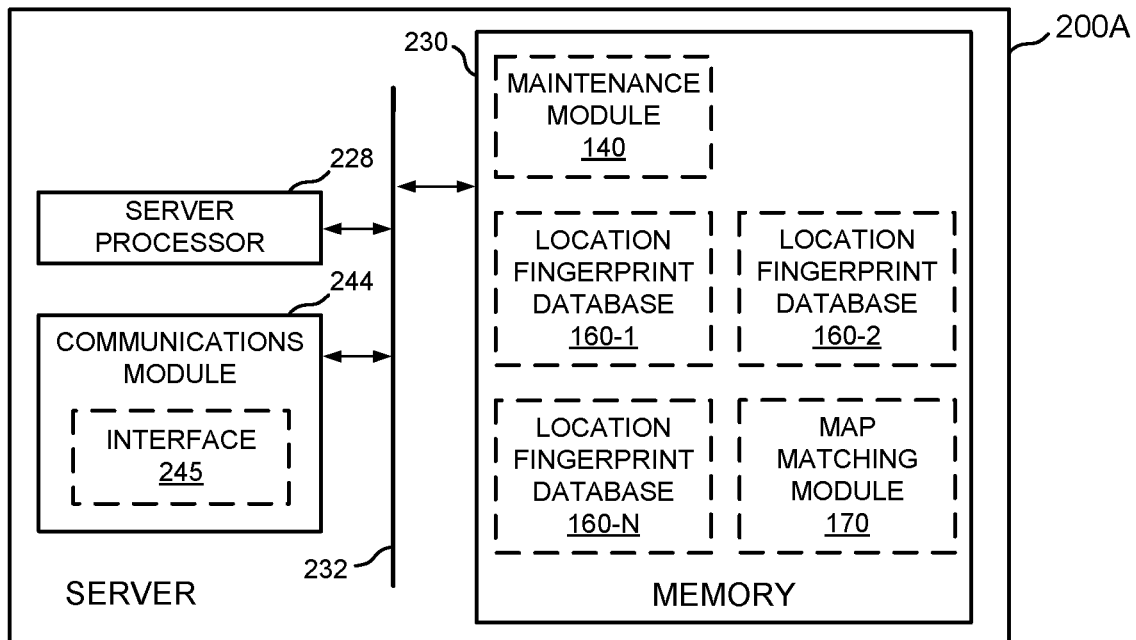
FIGS. 2A-2C are alternative schematic block diagrams of a computer, in accordance with various embodiments.
Figure 2B:
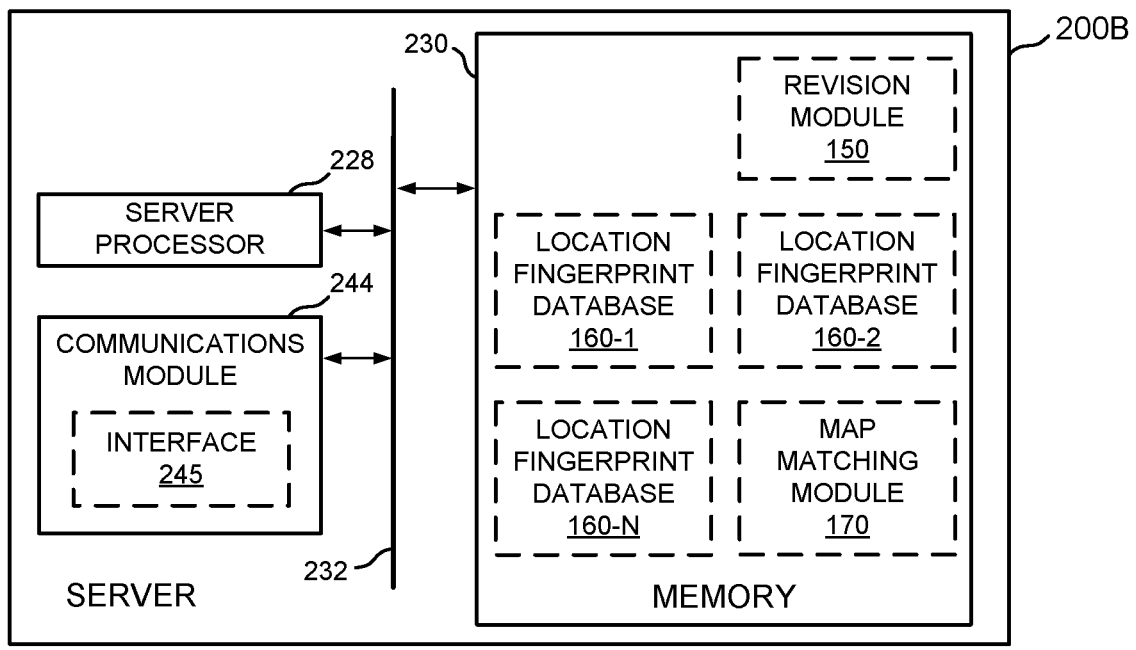
Figure 2C:
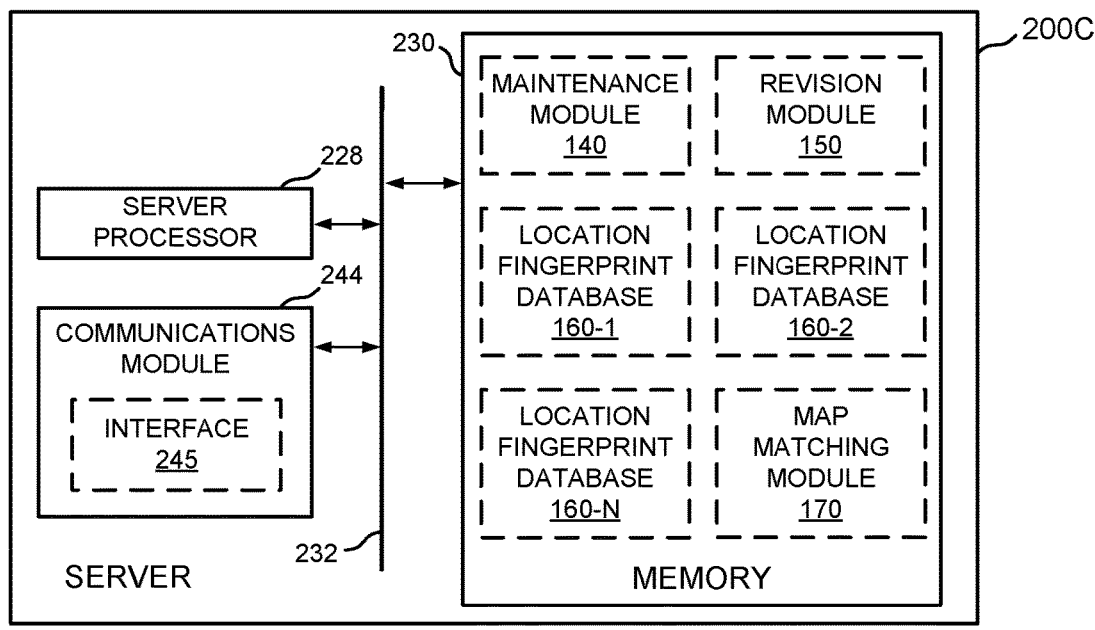

FIGS. 2A, 2B, and 2C are alternative schematic block diagrams of a computer 200, in accordance with various embodiments. One suitable architecture of this computer is computer server 200, which is depicted using high level schematic blocks in FIG. 2A and may include a server processor 228 that is in communication with server memory 230 over a bus 232. As will be described in further detail below, server processor 228 may execute instructions stored in memory 230, including those that may describe a survey route to traverse to collect data for maintenance of a location fingerprint database for an area. Server 200 may also include a communications module 244 to receive raw or processed sensor data or positions from a portable device 100. FIG. 2A includes maintenance module 140 but not revision module 150 in memory 230 of computer 200A. FIG. 2B includes revision module 150 but not maintenance module 140 in memory 230 of computer 200B. FIG. 2C includes both maintenance module 140 and revision module 150 in memory 230 of computer 200C.

Server processor 228 may be any one or more of the types of processors previously described in conjunction with host processor 102. In some embodiments, server 200 is located local to (i.e., within the area of) the location fingerprint database(s) being maintained/revised. In some embodiments, server 200 is located remotely from (i.e., outside of the area of) the location fingerprint database(s) being maintained/revised. Server 200 and processor 228 can be considered "remote processing resources," when they are physically remote from any portable device 100 that is within the area and/or used to collect motion data, motion-based data, and/or signal measurement data in the area. In various embodiments, "physically remote" may mean that server 200 and processor 228 are in the same in the area of the location fingerprint database(s) being revised/maintained, but not physically connected with a portable device 100 that is within the area and/or being used to collect motion data, motion-based data, and/or signal measurement data in the area. In various embodiments, "physically remote" may mean that server 200 and processor 228 are located outside of the area of the location fingerprint database(s) being revised/maintained and not physically connected with a portable device 100 that is within the area and/or used to collect motion data, motion-based data, and/or signal measurement data in the area. In some embodiments server 200 is cloud-based and located remotely from the area of the location fingerprint database(s) being revised/maintained. In some embodiments, server 200 is an "edge server" located in the cloud, but near to the area of the location fingerprint database(s) being maintained/revised or even located locally within the area associated with the location fingerprint database(s) being maintained/revised. Being an edge server can reduce communication delay. When server 200 is an "edge server," processor 228 can be considered an "edge processor."

In some embodiments, an edge processor can work as a kind of data filtering. When implemented, this data filtering function "cleans" the data before sending it to the cloud. As one example, if a user succeeds in survey for a particular route then the edge processor will send the data collected from this survey to the cloud. However, if the user does not conduct a successful survey for the particular route, then the edge processor will not send data for this survey to the cloud.

Server memory 230 may be any one or combination of the types of memory previously described in conjunction with host memory 104. Bus 232 may be any suitable bus and, for example, may be any of the types of buses previously described in conjunction with bus 118. Communications module 244 operates in the same fashion as the previously described communications module 124. Interface 245, when included in communications module 244 or elsewhere in server 200 operates in a similar fashion as the previously described interface 125.

When included interface 245 facilitates communication with and access of location fingerprint databases and other applications/devices which are located remotely from server 200. Herein, an interface 245 may be configured to receive signal measurement data together with motion sensor data and/or motion-based data from each of one or more portable devices 100 transiting a portion of the area of a location fingerprint database.

Memory 230 may be any suitable type of computer readable media (such as those described herein) and may serve as storage for any of a variety of modules and/or data. As depicted in some embodiments, memory 230 may include one or more of maintenance module 140 and revision module 150. When included, maintenance module 140, revision module 150, and/or map matching module 170 operate in the manner described herein, except that they provide instructions for execution on server processor 228. In some embodiments, memory 230 may store all or portions of one or more location fingerprint databases 160 (e.g., 160-1, 160-2 . . . 160-N).

Figure 3:
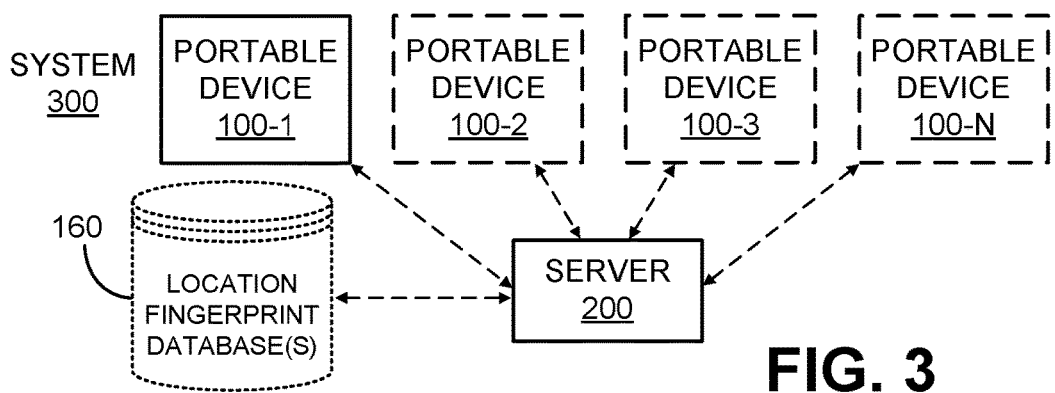
FIG. 3 is a schematic block diagram of a system for maintenance/revision of a location fingerprint database for an area, in accordance with various embodiments.

FIG. 3 is a schematic block diagram of a system 300 for maintenance/revision of a location fingerprint database for an area, in accordance with various embodiments. System 300 comprises one or more portable devices 100 (e.g., 100-1, 100-2, 100-3 . . . 100-N) in communication with server computer 200. In some embodiments system 300 may further include or communicate with one or more location fingerprint databases 160 which are located remotely from the server computer 200. By way of example and not of limitation, in various embodiments, server 200 may be any of the types of computers 200 discussed herein including: a remote processing resource, cloud-based server, and an edge server. Communications between a portable device 100 and server 200 may employ any suitable protocol and may be facilitated by communications module 124 and communications module 244. For example, a shorter range, low power communication protocol such as Bluetooth®, ZigBee, ANT (Adaptive Network Topology) or a wired connection may be used or a longer range communication protocol, such as a transmission control protocol, internet protocol (TCP/IP) packet-based communication, accessed using a wireless local area network (WLAN), cell phone protocol or the like may be used. In general, system 300 may embody aspects of a networked or distributed computing environment. Each portable device 100 may communicate either directly or indirectly with server 200, such as through multiple interconnected networks. As will be appreciated, a variety of systems, components, and network configurations, topologies and infrastructures, such as client/server, peer-to-peer, or hybrid architectures, may be employed to support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for communications made incident to the techniques as described in various embodiments. In system 300, device 100 communicates raw sensor data, including the signal measurement data (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) being recorded, raw or processed motion (inertial) data, and/or navigation solutions derived to server 200. In some embodiments as noted above, device 100 determines navigation solutions in real-time as an area is traversed or in post-processing after an area is traversed. Alternatively, only raw sensor data may be sent to server 200, which may derive the positions of device 100 and correlate them with the recorded signals. In some embodiments, only preprocessed motion-based data (i.e., displacements and/or changes in orientation) may be sent from a portable device 100 to server 200, or else only the raw motion data needed to compute displacements and/or changes in orientation may be sent. When the position determinations (i.e., reference position determinations) are performed by server 200, they may also be derived in real-time, given any communication delay, or may be performed at a subsequent time such as for example in an offline or post-processing operation as noted above. It will be appreciated that strategies involving real-time navigation solution determination benefit by allowing assessment of the adequacy of the route traveled through an area as it is being traversed.

Figure 4:
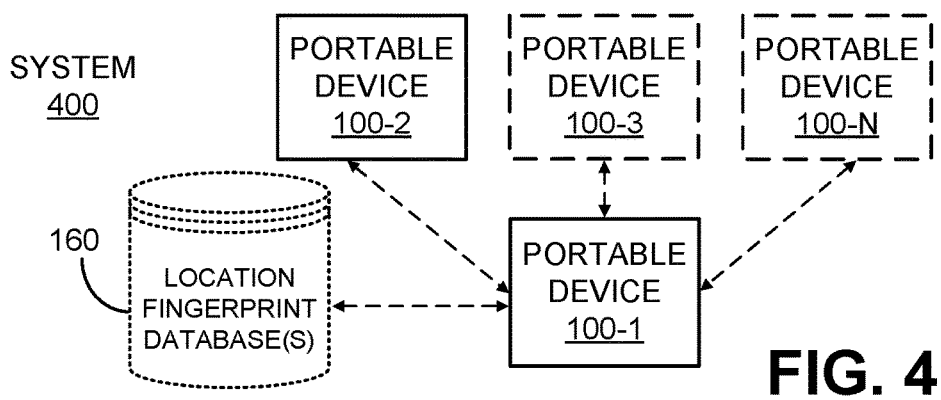
FIG. 4 is a schematic block diagram of a system for maintenance/revision of a location fingerprint database for an area, in accordance with various embodiments.

FIG. 4 is a schematic block diagram of a system 400 for maintenance/revision of a location fingerprint database for an area, in accordance with various embodiments. System 400 comprises one or more portable devices 100 (e.g., 100-2, 100-3 . . . 100-N) in communication with central or coordinating portable device 100-1. In some embodiments system 400 may further include or communicate with one or more location fingerprint databases 160 which are located remotely from the central/coordinating portable device 100-1. Communications between a portable device 100 (e.g., 100-2) and another portable device (e.g., 100-1) may employ any suitable protocol and may be facilitated by communications modules 124 in the respective portable devices 100. For example, a shorter range, low power communication protocol such as Bluetooth®, ZigBee, ANT (Adaptive Network Topology) or a wired connection may be used or a longer range communication protocol, such as a transmission control protocol, internet protocol (TCP/IP) packet-based communication, accessed using a wireless local area network (WLAN), cell phone protocol or the like may be used. In general, system 400 may embody aspects of a networked or distributed computing environment. One or more subordinate portable devices 100 (e.g., 100-2, 100-3 . . . 100-N) may communicate either directly or indirectly with a coordinating portable device 100 (e.g., 100-1), such as through multiple interconnected networks. As will be appreciated, a variety of systems, components, and network configurations, topologies and infrastructures, such as client/server, peer-to-peer, or hybrid architectures, may be employed to support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for communications made incident to the techniques as described in various embodiments. In system 400, subordinate portable device 100 communicates raw sensor data, including the signal measurement data (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) being recorded, raw or processed motion (inertial) data, and/or navigation solutions derived to a coordinating portable device 100. Likewise, a coordinating portable device 100 may collect and process its own raw sensor data, including the signal measurement data (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) being recorded, raw or processed motion (inertial) data, and/or navigation solutions. In some embodiments as noted above, a coordinating portable device 100 determines navigation solutions in real-time as an area is traversed or in post-processing after an area is traversed. Alternatively, only raw sensor data may be sent to a coordinating portable device 100, which may derive the reference positions of a subordinate portable device 100 and correlate them with the recorded signals. In some embodiments, only preprocessed motion-based data (i.e., displacements and/or changes in orientation) may be sent from a subordinate portable device 100 to a coordinating portable device 100, or else only the raw motion data needed to compute displacements and/or changes in orientation may be sent. When the position determinations are performed by the coordinating portable device 100 (e.g., 100-1), they may also be derived in real-time, given any communication delay, or may be performed at a subsequent time such as for example in an offline or post-processing operation as noted above. It will be appreciated that strategies involving real-time navigation solution determination benefit by allowing assessment of the adequacy of the route traveled through an area as it is being traversed.

Any or all of the functions described with respect to portable device 100 and server 200 may be performed by any number of discrete devices in communication with each other or may be performed by a portable device 100 itself in other suitable system architectures. Accordingly, it should be appreciated that any suitable division of processing resources may be employed whether within one device or among a plurality of devices. Further, aspects implemented in software may include but are not limited to, application software, firmware, resident software, microcode, etc., and may take the form of a computer program product accessible from a computer-usable or computer-readable medium providing program code for use by or in connection with a computer or any instruction execution system, such as host processor 102, sensor processor 108, server processor 228, a dedicated processor or any other processing resources of device 100, server 200 or other remote processing resources, or may be implemented using any desired combination of software, hardware and firmware.

Figure 5A:
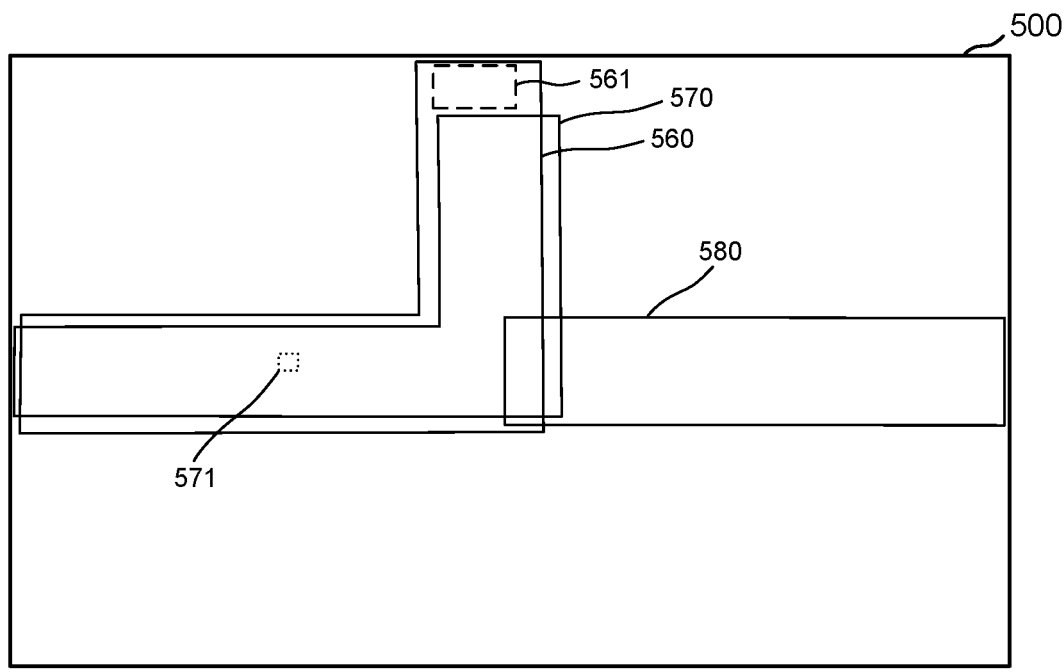
FIG. 5A is a plan view of structure overlaid with three different areas associated with three respective location fingerprint databases, in accordance with various embodiments.

FIG. 5A is a plan view of structure 500 overlaid with three different areas 560, 570, and 580 associated with three respective location fingerprint databases, in accordance with various embodiments. Structure 500 may be any structure such as an airport terminal, a retail store, a mall, an office building, a factory, a warehouse, a hospital, a home, a school, etc. For purposes of example and not of limitation, for discussion herein it can be presumed that each of the depicted areas are indoors (i.e., beneath the roof of structure 500), though the technology disclosed herein is not limited to indoor use. Also, for purposes of example and not of limitation, it may be presumed that area 560 is associated with location fingerprint database 160-1, area 570 is associated with location fingerprint database 160-2, and area 580 is associated with location fingerprint database 160-N. Dashed box 561 represents a gap in the data for location fingerprint database 160-1 within area 560, while dotted box 571 represents a hole in the data for location fingerprint database 160-2 within area 570.

Figure 5B:
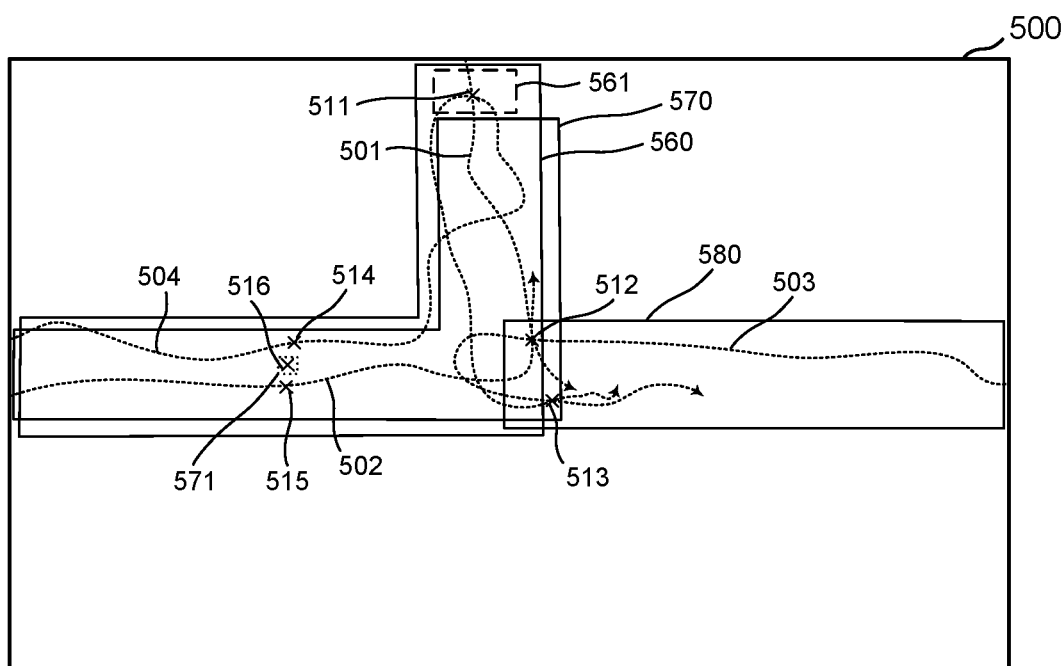
FIG. 5B is a plan view of structure overlaid with three different areas associated with three respective location fingerprint databases and further overlaid with transit paths of a plurality of portable devices, in accordance with various embodiments.

FIG. 5B is a plan view of structure 500 overlaid with three different areas (560, 570, and 580) associated with three respective location fingerprint databases (160-1, 160-2, and 160-N respectively) and further overlaid with transit paths 501, 502, 503, 504 of a plurality of respective portable devices 100, in accordance with various embodiments. For purposes of example and not of limitation, it can be presumed herein that transit path 501 corresponds with portable device 100-1, transit path 502 corresponds with portable device 100-2, transit path 503 corresponds with portable device 100-3, and transit path 504 corresponds with portable device 100-N. It should be appreciated that there could be a greater or lesser number of transit paths and respective portable devices 100. Each of the X's (511, 512, 513, 514, and 515) marks the location of a reference position which is determined by either maintenance module 140 or revision module 150. The X labeled 516 represents an example of a reference position interpolated in conjunction with a stable fingerprint database. It should be appreciated that there may be less (e.g., one) reference position or more reference positions (e.g., 100's or 1000's) and that the number illustrated has been purposely limited so as not to obscure what is being illustrated and explained.

According to one embodiment, X's 511, 512, 513, 514, and 515 represent some of many reference positions which can be processed from motion sensor data/motion-based collected along transit paths 501, 502, 503, and 504. Reference positions may also be obtained, in some embodiments from one or more stable location fingerprint databases. A reference position may be in the form of a latitude and longitude or any suitable positioning system (i.e., a coordinate system, offsets from another known position, etc.) for specifying a location. Reference position 516 is an example of a reference position interpolated in conjunction with a stable fingerprint database. As can be seen, transit paths 503 and 504 both intersect substantially at reference position 513, providing additional surveyed data substantially at reference position 513. Similarly, transit paths 501 and 504 intersect substantially at reference position 511, providing additional surveyed data substantially at reference position 511. Additionally, transit paths 501, 502, and 503 intersect substantially at reference position 512, providing additional surveyed data substantially at reference position 512.

Section 3: Maintenance of a Location Fingerprint Database for an Area

FIG. 6 is a block diagram of a maintenance module 140, in accordance with various embodiments. Maintenance module 140 may be utilized in embodiments which perform maintenance of a location fingerprint database for an area. As depicted, maintenance module 140 includes signal and data collector 641, non-causal filter 642, and location fingerprint database updater 643.

Signal and data collector 641 of maintenance module 140 collects motion data (e.g., inertial sensor measurements from accelerometers and/or gyroscopes) from motion sensors (e.g., 112, 114, and/or 116) of portable device 100 and/or from a plurality of other portable devices 100. Signal and data collector 641 of maintenance module 140 also collects signal measurement data (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) of signals detected by signal measurement sensors (e.g., 112, 114, and/or 116) of portable device 100 and/or from a plurality of other portable devices 100. The motion data may be collected by a sensor assembly, such as SPU/MPU 106, in portable device 100 and/or in other portable devices 100. The collected motion data and signal measurement data are associated with transiting a portion of an area of a location fingerprint database which is being maintained. The collection may be as part of a formal survey or an ad hoc survey based on data collected by device that happens to transit the portion of the area being maintained. An example of an ad hoc survey may be crowdsourced data. The motion data, motion-based data, and/or signal measurement data collected by a portable device 100 may be output or accessed all or in portion. For example, only the portion of the motion data, motion-based data, and/or signal measurement data collected in relation to a particular area of interest of a location fingerprint database (such as one being revised or maintained) may be output or accessed.

Non-causal filter 642 of maintenance module 140 performs offline non-causal processing to process the collected motion sensor data into reference positions associated with the portion of the area. Any suitable type of non-causal processing may be utilized to process the data. A non-causal system is a system whose output at a certain time is function of past, present and future inputs as compared to that time. For contrast, a causal system is a system whose output at a certain time is function of past and present inputs as compared to that time. Non-causal processing can be achieved when all sensor data is logged (saved) and used after the fact, such as in offline processing or post processing. The sensors data are logged over a first period of time, such as when a trajectory is being traversed by a user and his/her portable device in a portion of the area, and then used after the first period of time (at a time subsequent to the first period of time) when it is available as a whole over the full first period of time (from the start to finish of the first period of time). So, when the non-causal processing (such as non-causal filtering) happens after the first period of time, every epoch of time inside the first period of time is available and can be utilized for the non-causal processing. As an illustrative example, if epochs of time t1, t2 and t3 are all during the first period of time, and are all saved and available, then the non-causal processing can provide an output pertaining to epoch t2 by using input information from epoch t1 and/or t2 and/or t3; while on the contrary causal processing can provide an output pertaining to epoch t2 by using input information from epoch t1 and/or t2, but not from t3. In some embodiments the collected motion sensor readings are processed using offline forward, backward, and/or multiple pass smoothing. Filtering may be performed in each of these types of non-causal processing of the sensor readings. In some embodiments, the non-causal processing may be utilized together with offline map matching, which is explained in detail below.

Location fingerprint database updater 643 of maintenance module 140 operates to employ the collected signal measurement data (e.g., signal measurement data collected from the environment) together with the reference positions to update the location fingerprint database 160 which is being maintained. The maintenance may comprise using collected signal measurements (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) together with reference positions to perform at least one of: bridging gaps in coverage in existing location fingerprint databases; determining if a location fingerprint database is stable or unstable; updating an unstable location fingerprint database; reinforcing or supplementing data in a stable location fingerprint database; determining if a location fingerprint database is stable or unstable, and consequently updating a location fingerprint database that has been determined to be unstable; building a new location fingerprint database that did not exist before; and/or building a new location fingerprint database that did not exist before using some other exiting location fingerprint database.

Illustrative Methods of Operation

FIG. 7 illustrates a flow diagram 700 of a method of maintenance of a location fingerprint database for an area, in accordance with various embodiments. Procedures of this method will be described with reference to elements and/or components of one or more of FIGS. 1-6. It is appreciated that in some embodiments, the procedures may be performed in a different order than described, that some of the described procedures may not be performed, and/or that one or more additional procedures to those described may be performed. Flow diagram 700 includes some procedures that, in various embodiments, are carried out by one or more processors (e.g., sensor processor 108, host processor 102, server processor 228 or the like) under the control of computer-readable and computer-executable instructions that are stored on non-transitory computer-readable storage media (e.g., host memory 104, sensor memory 110, server memory 230, or the like). It is further appreciated that one or more procedures described in flow diagram 700 may be implemented in hardware, or a combination of hardware with firmware and/or software.

With reference to FIG. 7, at procedure 710 of flow diagram 700, in various embodiments, signal measurement data is collected together with motion sensor data from one or more portable devices (e.g., portable devices 100) transiting a portion of the area of the location fingerprint database which is being maintained. Signal and data collector 641 of maintenance module 140 may perform the collection of the motion data (e.g., inertial sensor measurements from accelerometers and/or gyroscopes) and the signal measurement data. The location fingerprint database being maintained is one of a stable location fingerprint database and an unstable location fingerprint database. By "collected together" what is meant is that each portable device 100 measures the signal measurement data contemporaneously with motion sensor data that is used to determine a reference position such that the two are associated in time and location of collection. In various embodiments, the motion sensor data is measured by a sensor assembly such as sensor processor 108 in each of the plurality of portable devices. The signal measurement data and motion sensor data are, in some embodiments, crowdsourced. Being crowdsourced means that they are obtained from one or more portable devices 100 that happen to be transiting the area or have transited through the area and collected the signal measurement data together with motion sensor data. The signal measurement data may be for one or a plurality of types of signals. Some non-limiting examples of types of signal measurement data collected include measurements of one or more of: optical signals, magnetic signals, radio signals, wireless networking signals, and acoustic signals. The motion sensor data comprises data from at least one of an accelerometer and a gyroscope of each portable device 100 which from which signal measurement data and motion sensor data are collected. Motion sensor data may optionally include other sensor data, such as odometer or barometer data among others. In various embodiments the collected signal measurement data and motion sensor data may be stored in a memory of the portable device 100 for processing locally on the mobile device, sent to another portable device 100 for processing, or provided to a communicatively coupled computer (e.g., server 200) for processing. With reference to FIG. 5B, transit paths 501, 502, 503, and 504 represent paths which four portable devices (respectively 100-1, 100-2, 100-3, and 100-N) have traveled while transiting area 570 (which is an area associated with location fingerprint database 160-2).

With continued reference to FIG. 7, at procedure 720 of flow diagram 700, in various embodiments, offline non-causal processing is used to process the collected motion sensor data into reference positions associated with the portion of the area. Non-causal filter 642 may perform the filtering to process the collected motion sensor data into reference positions. The offline non-causal processing can comprise using one or more of: offline backward smoothing, offline forward smoothing, and offline multi-pass smoothing. Offline map matching may also be used to process the collected motion sensor data into reference positions associated with the portion of the area. One or more of the offline non-causal processing techniques can also be paired with the offline map matching to process the collected motion sensor data into reference positions associated with the portion of the area. As previously mentioned, the offline non-causal processing may be performed on a processor in either a portable device 100 or in a separate computer 200. With reference to FIG. 5B, X's 511, 512, 513, 514, and 515 represent some of many reference positions which can be processed from motion sensor data collected along transit paths 501, 502, 503, and 504.

With continued reference to FIG. 7, at procedure 730 of flow diagram 700, in various embodiments, the collected signal measurement data is employed together with the reference positions to update the location fingerprint database which is being maintained. This means employing the signal measurement data that is collected together with the motion sensor data used to determine a particular reference position. Location fingerprint database updater 643 may perform the updates to the entry or entries in the location fingerprint database that is being updated.

In some embodiments, the update may comprise building out a new location fingerprint database for the area. The build out may comprise extending the area of the location fingerprint database. The build out may additionally or alternatively comprise building out a new location fingerprint database using an existing fingerprint database, wherein the new location fingerprint database comprises fingerprints of a type of signal measurement different than the type of signal comprised in the existing location fingerprint database. For example, the new location fingerprint database may comprise magnetic fingerprints for the same area as an existing location fingerprint database which comprises networking signal fingerprints. Thus, a reference position might be increased from having one type of location fingerprint signal associated with it to having two different types of location fingerprint signals associated with it. With reference to FIG. 5B, this may comprise building out a location fingerprint database similar to the footprint of area 570, but for a different type of signal measurement than used for location fingerprint database 160-2 which is associated with area 570. In another embodiment, where location fingerprint databases 160-1 and 160-2 already exist, building out a new location fingerprint database may comprise using reference positions 512 and 513 and their associated signal measurement data to extend the location fingerprint database 160-N for the footprint encompassed by area 580 such as by adding new reference positions 512 and 513 (and their associated signal measurement data) into location fingerprint database 160-N.

In some embodiments, the update may comprise bridging a gap which exists in the location fingerprint database. For example, with reference to FIG. 5B, a gap 561 exists in data of the location fingerprint database 160-1 for area 560. Signal measurement data for reference location 511 may be used alone or with other reference positions and corresponding signal measurement data to bridge all or a portion of gap 561. The bridging may also involve the use of interpolation, but typically relies more on non-causal processing to fill generated information between two reference positions. In some embodiments, bridging a gap which exists in the location fingerprint database may further first comprise identifying the existence of the gap (determine that a gap exists) and identify the location and extent (boundary) of such gap in the location fingerprint database. In some embodiments, bridging a gap which exists in the location fingerprint database may further comprise identifying if data from a user of a portable device that transited the area did transit the gap (transited within the extent of the gap). In some embodiments, bridging a gap which exists in the location fingerprint database may further comprise using the reference positions of a user of a portable device that transited the gap to generate location fingerprint data for at least a portion of the gap and amend the existing location fingerprint database that had the gap to fill the at least portion of the gap. Such an example of gap in location fingerprint database is illustrated by gap 561 in location fingerprint database 160-1 associated with the footprint encompassed by area 560. It should be appreciated that a "hole" is much smaller data void in a location fingerprint database than a "gap." Hole 571 is one such example, and it may be filled with data by the same mechanisms used to fill a gap or, because it is smaller, interpolation between surrounding reference positions (e.g., 514 and 515) may be used.

In some embodiments, the update may comprise determining the location fingerprint database is unstable by comparing signal measurement data associated with a reference position of the reference positions with existing signal measurement data in the location fingerprint database which corresponds to the reference position. If the compared signal measurement data differ beyond a pre-specified amount, then the existing data is determined to be unstable. In an embodiment, where the existing signal measurement data is determined to be unstable, it may be the location fingerprint database may be updated by replacing the existing signal measurement data with the collected signal measurement data which is associated with the reference position. In some embodiments, when the location fingerprint database is known to be unstable, updating the location fingerprint database comprises replacing the existing signal measurement data in the location fingerprint database which corresponds to the reference position with the signal measurement data associated with the reference position. In other words, the updating is performed in response to knowing of the location fingerprint database being unstable.

Figure 8:
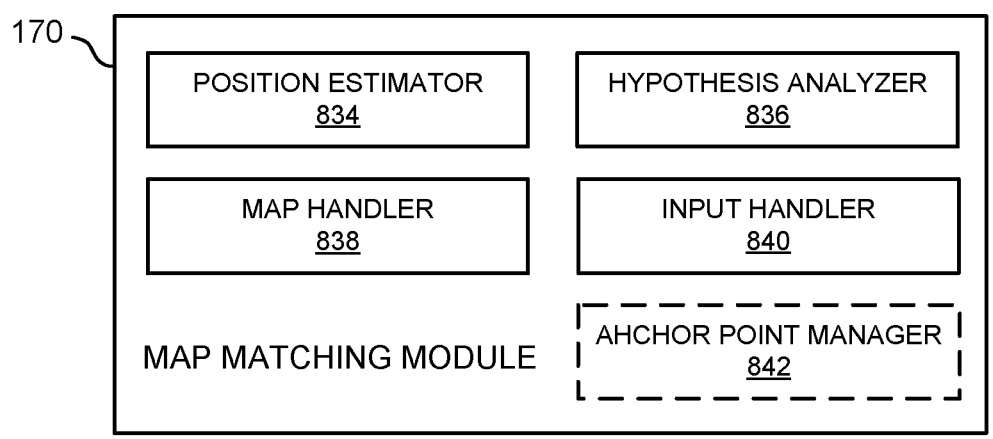
FIG. 8 is a block diagram of an illustrative map matching module, in accordance with various embodiments.

In some embodiments, the employment of the collected signal measurement data together with the reference positions to update the location fingerprint database comprises determining the location fingerprint database is stable by comparing signal measurement data associated with a reference position of the reference positions with existing signal measurement data in the location fingerprint database which corresponds to the reference position, and responsive to determining the location fingerprint database is stable (due to a comparison which matches within a pre-specified margin of error), merging the existing signal measurement data with the signal measurement data associated with the reference position. In some embodiments, when the location fingerprint database is known to be stable, the matching is not required, and updating the location fingerprint database is accomplished by merging the existing signal measurement data in the location fingerprint database which corresponds to the reference position with the collected signal measurement data associated with the reference position. In other words, the update/merge is performed in response to knowing of the location fingerprint database being stable.

Map Matching FIG. 8 is an exemplary block diagram of an illustrative map matching module 170, in accordance with various embodiments. Navigation module 120, maintenance module 140, and/or revision module 150 may employ real-time or off-line (i.e., not in real-time) map matching to aid in the derivation of navigation solutions, determination of reference position locations, and the like in a non-causal manner which constrains a navigation solution, reference position, or the like to a position determined with reference to an existing map. The map matching technique of FIG. 8 is an illustrative example, other suitable offline matching techniques may be employed in a similar fashion. In some embodiments, map matching module 170 may comprise functional blocks including: position estimator 834, hypothesis analyzer 836, map handler 838, input handler 840, and an optional anchor point manager 842.

As an example only and without limitation, a user may be carrying a smartphone while traversing an area associated with a location fingerprint database. The area may be within a venue, such as within a store while the user is shopping. The smartphone may derive navigation solutions for the multiple epochs (i.e., one solution for each of the multiple sensor epochs) for the period the phone was traversing the area (plurality of sensor epochs) representing the trajectory of the user through the store. In one aspect, the smartphone may use any suitable real-time technique to generate those navigation solutions, including an inertial navigation routine employing dead reckoning, a reference-based location service utilizing a source of absolute navigation information, a location beaconing system or any other suitable technique, or combinations thereof. Although of substantial benefit, these real-time solutions may nonetheless suffer from inaccuracies or limitations. Again, without limitation, an inertial dead reckoning system may be subject to drift over time due to the characteristics of currently-employed sensors or a source of absolute navigation information such as a global navigation satellite system (GNSS) may suffer from poor reception in indoor environments.

Accordingly, the techniques of this disclosure utilize the series of navigation solutions derived over the given time period at a subsequent time to enhance at least one of the navigation solutions by non-causal processing, or by non-causal processing and an offline map matching routine. Multiple hypotheses may be generated and managed using the estimated position information and map information for an area corresponding to the area occupied by the user when the navigation solution was derived. Based on the hypotheses, the estimated position information may be updated and used to enhance at least one of the navigation solutions. The enhanced navigation solution may be used as a reference position.

The techniques for enhancing a navigation solution of a portable device 100 using map information involve obtaining motion sensor data for the portable device. The portable device 100 derives navigation solutions for the multiple epochs for the period the phone was traversing the area using the motion sensor data (plurality of sensor epochs). Subsequently, the offline map matching routine may be performed to enhance the navigation solution at at-least some of the epochs. In some embodiments, the portable device may have sufficient processing capabilities and/or other resources available to perform the offline map matching routine locally, such as in the background when greater access to the processing capabilities is available. However, in other embodiments, the portable device may communicate the navigation solutions for the epochs (one solution per epoch for each of a plurality of epochs), which may include any or all of the associated sensor data, to a remote server that may have greater processing capabilities and/or superior access to map information to be used in the offline map matching routine. The enhancement may involve matching the derived navigation solution to a map, such as a navigation map or blueprint, to disciple the derived navigation solution to being only in possible or likely positions (e.g., on a road rather than in a field next to a road, in a hallway rather than inside a wall next to a hallway). Following enhancement, the navigation solution may be used for any suitable purpose, such as a reference position, and need not involve the user directly, such as for the analysis of consumer metrics and behavior. However, the enhanced navigation solution(s) may also be returned to the portable device, also for any suitable purpose, such as to provide the user with more accurate navigation information regarding the trajectory or to help improve future navigation performance of the portable device.

In one embodiment, a portable device 100 communicates raw sensor data or navigation solutions derived for a plurality of sensor epochs over a first period of time (i.e., one solution per epoch for each of a plurality of epochs) to server 200. Subsequent to the first period of time, server 200 may then perform an offline map matching routine using the navigation solutions from portable device 100 to provide an enhanced navigation solution for at least one of the sensor epochs. As will be described in further detail below, server processor 228 may execute instructions stored in memory 230 as map matching module 170.

With continued reference to FIG. 8, position estimator 834 may use navigation solutions for a plurality of sensor epochs provided by navigation module 120 to estimate position information for portable device 100. The estimated position information may also be updated using information from hypothesis analyzer 836, which may be configured to generate, evaluate and combine multiple hypotheses regarding possible positions of portable device 100 using the estimated position and information from map handler 838. Hypothesis analyzer 836 may also be configured to analyze the navigation solutions and determine a motion mode that indicates the user's motion patterns in a similar manner to that described above with regard to navigation module 120. Either or both navigation module 120 and hypothesis analyzer 836 may determine a motion mode, but hypothesis analyzer may have advantages associated with the availability of both past and future information for motion detection at a given time and/or may have greater processing resources available to perform more sophisticated algorithms, and correspondingly may be give greater weight if conflicting detections exist. In turn, map handler 838 may be configured to access external information regarding an area encompassing a location of portable device 100 when the navigation solutions were derived and present the information in a form usable by hypothesis analyzer 836. Input handler 840 may perform preliminary processing of the navigation solutions derived by navigation module 120, including filtering, categorizing motion segments, and/or detecting motion characteristics. An optional anchor point manager 842 may, optionally, identify one or more anchor points having known position information that may be associated with one or more of the navigation solutions.

By processing the generated hypotheses, such as combining using appropriate weighting and averaging, electing a selected hypothesis, electing a group of hypotheses and combining only these using appropriate weighting and averaging, or other suitable operations, the output from hypothesis analyzer 836 may be used by position estimator to update the estimated position information. The estimated position information and/or updated estimated position information may include, in addition to position information, velocity and/or heading information, as well as any other information related to the motion or position of portable device 100 and may also include map entity information. The updated estimated position may then be used as an enhanced navigation solution or as a reference position for at least one sensor epoch. The updated estimated position may be fed back to navigation module 120 for use in deriving an enhanced navigation solution for at least one epoch. In some embodiments, values from the updated estimated position information and the navigation solution may be used in an enhanced navigation solution or as a reference position.

Figure 9:
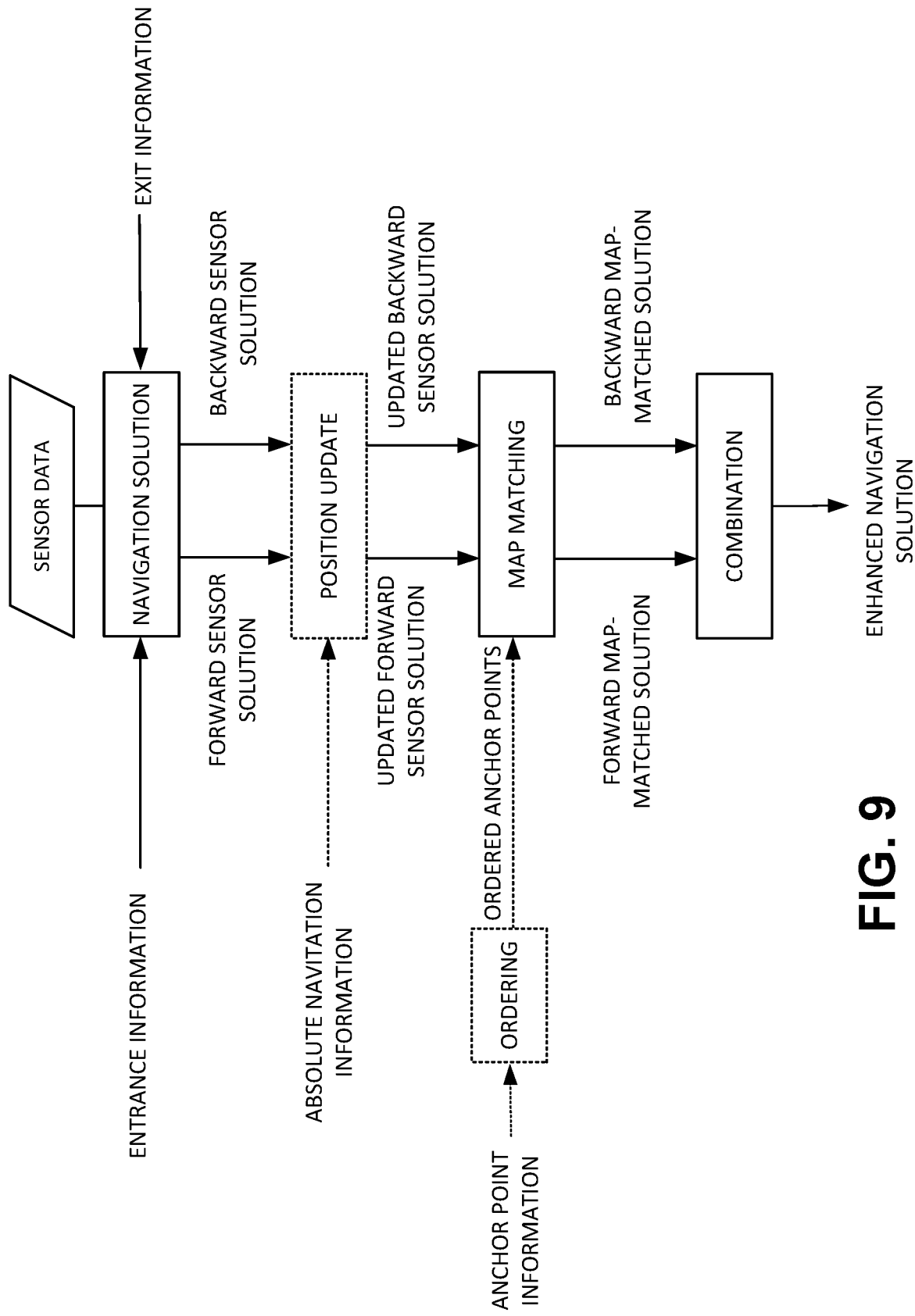
FIG. 9 describes one exemplary embodiment of an offline map matching architecture according to an embodiment.

FIG. 9 describes one exemplary embodiment of an offline map matching architecture. As indicated, a typical offline indoor map-matching solution processes the sensor data, which typically includes measurements from a triaxial accelerometer and a triaxial gyroscope. If available, additional sensor information may also be employed, such as from a triaxial magnetometer and/or a barometer. The sensor data may be forward and backward processed, such as by navigation module 120, to derive forward and backward navigation solutions. If the system is appropriately configured and if the information is available, a source of absolute navigation information may provide one or more position updates that may optionally be used to provide updated forward and backward sensor solutions as indicated. As discussed above, any one or more suitable sources of information may be optionally used, including as a Global Navigation Satellite System (GNSS) receiver, including without limitation the Global Positioning System (GPS), the Global Navigation Satellite System (GLONASS), Galileo and/or Beidou, as well as WiFi positioning, cellular tower positioning, broadcast radio station positioning, BLE beacons, visual light communication-based positioning, acoustic based positioning or other similar methods. Thus, the forward and backward solutions, which is either sensor-only based (without optional absolute navigation information updates) or with the optional absolute navigation information updates, are fed to an offline map matching routine as discussed above. Also optionally, one or more anchor points may be identified and potentially ordered. Notably, the process of ordering anchor points may be used to estimate absolute positioning updates at the associated epochs in the user's trajectory. This optional anchor point information may also be used as an input in the offline map matching routine. Forward and backward map-matched solutions may then be combined in any suitable manner to provide enhanced navigation solutions. For example, the final solution may represent the forward map-matching solution up until a specific epoch, as determined by a combination algorithm, and then may switch to the backward map-matching solution. The next paragraphs below relate to assessing uncertainty for these enhanced navigation solutions mentioned here and above.

Improving Functionality by Estimating Uncertainty

In some embodiments, non-causal filter 642 may employ instructions stored in host memory 104 and/or sensor memory 110 for execution by host processor 102 and/or sensor processor 108 for improving functionality of the enhanced navigation solution obtained above by estimating uncertainty measure (also called accuracy measure) for each epoch of the enhanced navigation solution. As an illustration, and without limitation, assessing uncertainty may include estimating the standard deviation of the enhanced navigation solution, which may be referred to as the position uncertainty of the final positioning solution.

Figure 10:
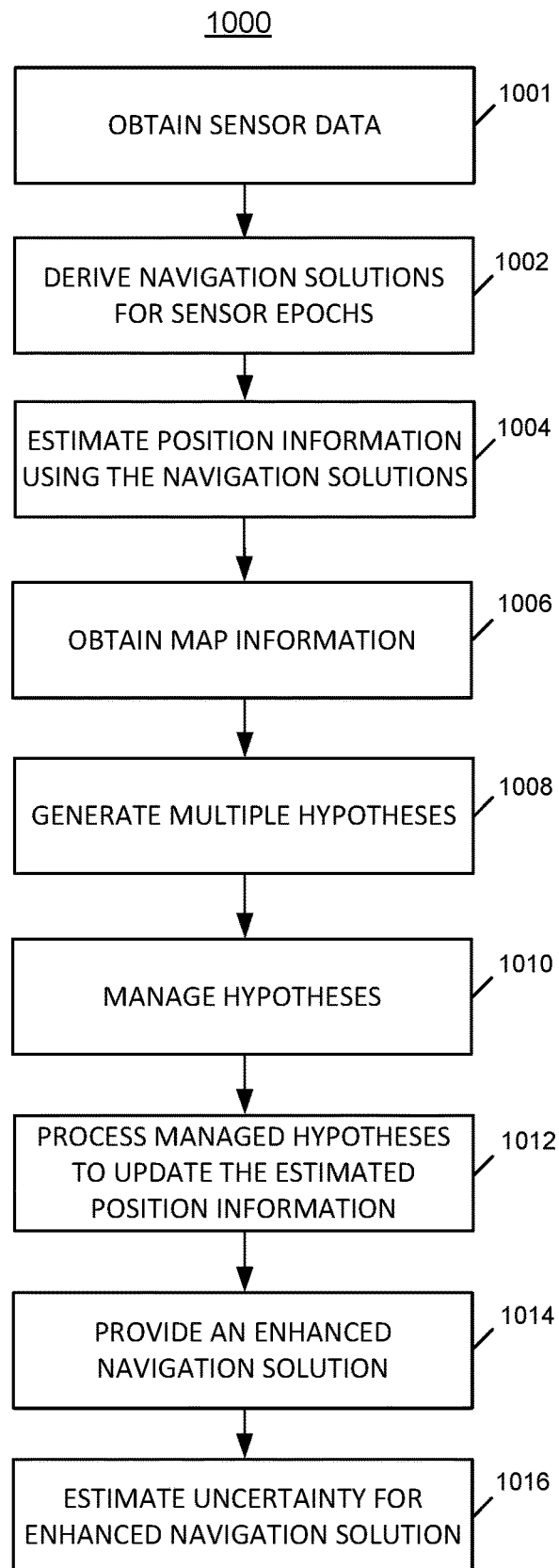
FIG. 10 is a flow diagram of a routine for enhancing a navigation solution with offline map information according to an embodiment.

FIG. 10 is a flow diagram 1000 of a routine for enhancing a navigation solution with offline map information according to an embodiment. The routine illustrated in flow diagram 1000 is only representative, and other routines may be utilized. Beginning with 1001, sensor data may be obtained for a plurality of epochs over a given time period, such as from inertial sensor 112 and/or external sensor 114, for the portable device. Using the sensor data, navigation module 120 may be directed to derive a navigation solution at each sensor epoch in 1002. This results in a plurality of navigation solutions, with one navigation solution for each of epoch of a plurality of epochs. In embodiments where offline map matching is performed remotely, either the raw sensor data, the derived navigation solutions or both may be transmitted to remote processing resources, such as server 200. For example, the derivation of navigation solutions for each sensor epoch may be performed by navigation module 120 at portable device 100 or may be performed at server 200 using the raw sensor data for each sensor epoch as transmitted by portable device 100. In other embodiments, portable device 100 may perform the offline map matching locally. Regardless of whether the offline map matching occurs locally or remotely, position information for portable device 100 may be estimated in 1004 at a time subsequent to the given time period and map information for a surrounding area may be obtained in 1006. Multiple hypotheses may be generated in 1008 for at least one of the sensor epochs from the estimated position information and the map information. Next, in 1010, the generated hypotheses are managed and then processed in 1012 to update the estimated position information. An enhanced navigation solution for the at least one sensor epoch may then be provided in 1014. The confidence (or conversely, the ambiguity) associated for such enhanced navigation solution(s) may be assessed using one or more techniques, such as by evaluating a standard deviation for each navigation solution. As will be appreciated, the offline map matching may utilize sensor data when providing the enhanced navigation solution. Correspondingly, the uncertainty estimate 1016 may reflect confidence associated with the sensor information as well as factors related to the map matching routine. When additional information is used in deriving the enhanced navigation solution, the uncertainty estimate may also account for the confidence attributable to that information. For example, in some embodiments, one or more anchor points may be used as position updates or may be used when generating and/or managing hypotheses, so that the uncertainty estimate may include related components. Likewise, when a source of absolute navigation information is available, the uncertainty estimate may include an associated degree of confidence.

Regarding uncertainty, an uncertainty measure may be estimated for the enhanced navigation solution(s), such as by deriving the standard deviation. The uncertainty estimate for the offline map matching may render the output more useful and meaningful for other tasks utilizing that output, such as crowdsourcing applications. In recognition that the map matching solution may be subject to inaccuracies due to the practical realities of sensor errors and the challenges associated with portable navigation, the techniques of this disclosure provide a representative and consistent uncertainty estimate. Further, enhanced navigation solutions and the estimated uncertainty may be used in a variety of crowdsourcing applications by leveraging information obtained from the plurality of users to achieve any suitable goal, such as acquiring more accurate location information. That is, the uncertainty (or reciprocally the certainty) of may be used to evaluate the accuracy of a given determination or given item of crowdsourced information desired or warranted. When there is a greater certainty in the accuracy of crowd sourced data it will be used more than data which has less certainty about its accuracy.

With respect to an enhanced navigation solution (which is the most refined determination of one or more values including position, velocity and/or attitude for a given epoch) the position uncertainty and thus the estimated confidence may be assessed. Likewise, uncertainty or its reciprocal, certainty, may be estimated for many factors that go into an enhanced navigation solution. In one embodiment, a position uncertainty measure may comprise the standard deviation of the error in the enhanced navigation solution. According to another embodiment, assessing the uncertainty of the enhanced navigation solution may involve calculating a weighted sum of a number of factors. Each factor comprising the overall uncertainty, and the weighting factor used in association, may be determined in any suitable manner. The materials below give specific examples, but one of ordinary skill in the art will appreciate that other techniques, as well as other factors, may be employed as warranted to estimate uncertainty.

As mentioned above, assessing the uncertainty of the enhanced navigation solution may be a weighted sum of a number of factors. In one embodiment, the positioning uncertainty measure may be expressed as Equation (1):

$$\sigma_{final} = w_{sensor}\sigma_{sensor} * w_{FP}\sigma_{FP} * w_{mm}\sigma_{mm} * w_{AP}\sigma_{AP} \quad (1)$$

where or $\sigma_{sensor}$ represents the sensor-based navigation positioning uncertainty, based upon a standard deviation of the sensor-based navigation without map matching, including misalignment quality, $\sigma_{sensor_{misalignment}}$, fidgeting related factors, $\sigma_{sensor_{fidgeting}}$, such as the time duration of fidgeting, corresponding to an intermittent fidgeting detection, and $w_{sensor}$, which may be the weight of the sensor-only uncertainty on the overall uncertainty. Further, $\sigma_{mm}$ may be the map-matching positioning uncertainty and based at least in part on a number of hypotheses, $n_{hypos}$, a spatial dispersion of hypotheses, $\sigma_{mm_{dhypos}}$, a score of map matched segment, score including a signature matching score function and a comparison of the total length of segment, and total angle change between map-matched solution and sensor only solution. The map-matching position uncertainty may be weighted by $w_{mm}$. Still further, if such information is used in deriving the enhanced navigation solution, $\sigma_{AP}$ may represent the anchor point positioning uncertainty. As such, this may be for anchor points derived from point of sale information or any other suitable position update. The value may be based on a factor representing anchor point proximity from $m^{th}$ anchor point, expressed as $d_{AP^m}$, anchor point certainty of the $m^{th}$ anchor point, $c^m$. Correspondingly, $w_{AP}$ may represent the weight of the anchor point uncertainty on the overall uncertainty. The last term in this embodiment is $\sigma_{FP}$, which may represent uncertainty of a positioning update using absolute navigation information, while $w_{FP}$ may be used to weight of this uncertainty when deriving the overall uncertainty, $\sigma_{final}$. Each factor comprising the overall uncertainty, and the weighting factor used in association, may be determined in any suitable manner. The materials below give specific examples, but one of ordinary skill in the art will appreciate that other techniques, as well as other factors, may be employed as warranted. Uncertainty for any other positioning updates may also be accommodated.

With regard to the sensor-based navigation positioning uncertainty factor, $\sigma_{sensor}$, a number of subfactors or other suitable measures may be used when deriving the value. Notably, one measure may correspond to the quality of the state estimation result used to derive the navigation solution, such as $\sigma_{sensor_{Kalman}}$ when integration of a Kalman filter is used for the state estimation. In other embodiments, such as those employing a particle filter, may use a corresponding subfactor. Other subfactors that may be included depend on availability, such as $\sigma_{sensor_{misalignment}}$, which may represent a quality assessment of calculated misalignment in orientation between the portable device and the platform $\sigma_{sensor_{steplength}}$, which may represent a quality assessment of estimated step length used in a PDR technique, $\sigma_{sensor_{stepdetection}}$, which may represent a quality assessment of step detection used in a PDR technique, and $\sigma_{sensor_{fidgeting}}$, which may represent a quality assessment of detecting periods when the user may be moving the portable device in a nonmeaningful manner, such as fidgeting.

Correspondingly, the map-matching positioning uncertainty $\sigma_{mm}$ may also be based at least in part on certain subfactors or other suitable measures, including a number of hypotheses, $n_{hypos}$, a spatial dispersion of hypotheses, $\sigma_{mm_{dhypos}}$, a score of map matched segment, score including a signature matching score function and a comparison of the total length of segment, and total angle change between map-matched solution and sensor only solution as noted. Map-matching solution may start with a sensor-only solution which usually does not fit in the expected paths of motions in a specific venue, for example the sensor-only solution may cross untraversable areas like the shelves delineating aisles. As such, one stage of the map-matching process may involve generating different hypotheses representing different possible fixed solutions between certain epochs of the trajectory. Thus, the value $p_{mmhypo_i}[u]$ may be the position of hypothesis i of the map-matching solution at epoch u and also may be expressed as a vector of x- and y-coordinates: $p_{mmhypo_i}[u] = \{x_{mmhypo_i}[u] \ y_{mmhypo_i}[u]\}$. A next stage of the map-matching process may involve using one or more suitable algorithms to select among the potential hypotheses and chose a hypothesis that most likely represents the true path, and the positioning uncertainty attributable to the map-matching algorithm at epoch u may be expressed using Equation (2):

$$\sigma_{mm}[u] = \frac{n_{hypos}[u] \cdot \sigma_{mm_{dhypos}}[u]}{\text{score}[u]} \quad (2)$$

where $n_{hypos}[u]$ may represent the number of hypotheses of generated by the map-matching process at epoch u, $\sigma_{mm_{dhypos}}[u]$ may represent the spatial dispersion of hypotheses at epoch u, and score [u] may represent the score of the map-matched segment at epoch u. Each of these subfactors may be derived according to any suitable technique, including the following examples.

The number of hypotheses per epoch, $n_{hypos}[u]$, may be the count of hypotheses of the map-matching solution during epoch u as expressed by Equation (3):

$$n_{hypos}[u] = \Sigma_{\forall i} I\{\text{exists}(p_{mmhypo_i}[u])\} \quad (3)$$

where the function exists($p_{mmhypo_i}[u]$) returns a value of true if there is a hypothesis with label i, and correspondingly I{condition} returns a value 1 if condition is true, and 0 if condition is false. The larger the number of hypotheses per epoch, the more uncertain the positioning solution is, or conversely, the smaller the number of hypotheses per epoch, the more certain the map-matching solution is about where the true position is, and therefore the uncertainty of the positioning solution may be less.

Next, the spatial dispersion of hypotheses per epoch, $\sigma_{hypos}[u]$, may be calculated as the norm of the standard deviation of the x- and y-coordinates of the locations of all the hypotheses at epoch u. Generally, when there is more dispersion of hypotheses for a given epoch, the uncertainty may be greater, reflecting that the map-matching solution is uncertain given that the final position could be at different points far apart from the chosen solution. On the other hand, if the spatial dispersion at an epoch is small, the uncertainty may be reduced, as all the possible map-matching solutions are relatively close to the chosen solution.

Further, the score subfactor of the map-matched segment at an epoch u, score [u], may be considered a measure of how similar the map-matched segment, $p_{mm}[u]$, is to the sensor-only solution, $p_{sensor}[u]$. Thus, the closer or more similar they are, the less uncertain the solution is, and vice versa. The score of map-matched segment may be calculated using any of the curve matching (a.k.a shape matching) methods known in literature. Curve matching may require matching two lines or trajectories over a number of epochs. To derive a score at each epoch, the score of map-matched segment at each epoch may be obtained by calculating the curve matching between the map-matching segment and its corresponding sensor-only solution at a window around the epoch. For example, the window may be defined as the current epoch and the previous N−1 epochs, where N is a fixed arbitrary number, as a group of epochs before and after the epoch covering a certain segment of the trajectory, such as between two consecutive turns, or using any other suitable criteria.

Next, with regard to the contribution of anchor point uncertainty, $\sigma_{AP}$, in the overall uncertainty of the enhanced navigation solution, it will be appreciated that map-matching the sensor-only solution may be challenging due to the high error rates of the sensor-only solution, as may be experienced in an indoor venue. To help address this problem, anchor points may be identified from point of sale information for use in map-matching for a retail venue as discussed above. Notably, when the position, order and/or time-tag (from the sensor-only solution) of an anchor point are known, the map-matching engine may use this information to reset the errors in the sensor-only solution, as well as using anchor points to generate new hypotheses or evaluate existing hypotheses, such as by increasing the weight of paths that pass by anchor points in the correct order relative to other paths that do not pass by anchor points or pass in the wrong order. Since offline map-matching generates many possible paths on the grid that match sensor-only solution, constraining a path to pass by all anchor points in a specific order may help narrow the number of valid solutions. Although many examples are discussed in the context of anchor points derived from point of sale information, anchor points may also be identified from a source of absolute navigation information, including WiFi access points, RFID tags, Bluetooth beacon, visual light communication-based positioning and the like.

Correspondingly, the existence of anchor points may reduce the uncertainty in the overall positioning solution, given that the certainty of the positioning solution may be positively related to how close the anchor point is to the positioning solution, as may be assessed by employing a component reflecting anchor point proximity. Further, characteristics such as whether a positioning solution has passed through an anchor point, when it passed the anchor point, and its order relative to other anchor points may all have uncertain aspects. As noted above, the process of determining whether a positioning solution passes an anchor point and the anchor point order may be referred to as the ordering process, the output of which may be a set of ordered anchor points to be used in the map-matching process and may also have a uncertainty to be assessed.

Ordering anchor points may utilize a strategy similar to generation and management of multiple hypotheses during the map-matching process, and may involve the generation of alternative candidates along the trajectory each time the probability of turn detection is above a certain threshold. Furthermore, knowing the time tag of the epoch in which the solution passed through an anchor point may reduce the uncertainty of the positioning solution during that epoch. Therefore, the accuracy associated with the time tag of a given anchor point may also be used in assessing uncertainty for the anchor points.

Figure 11:
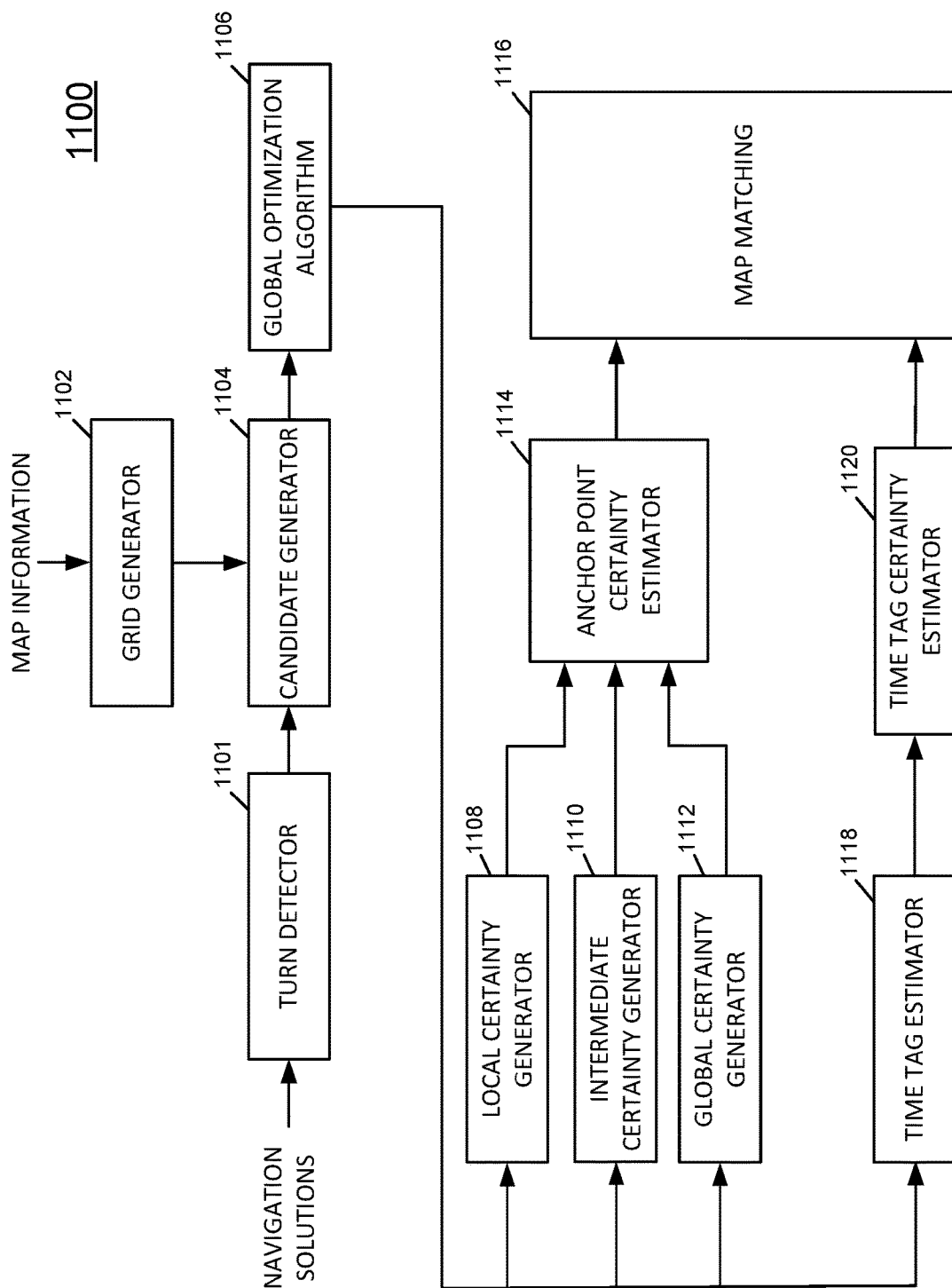
FIG. 11 is a schematic representation of an exemplary system for uncertainty estimation according to an embodiment.

FIG. 11 is a schematic representation 1100 of an exemplary system for uncertainty estimation according to an embodiment. It should be noted that anchor points are not required, but may be used in some embodiments. Anchor points are discussed in this sub-section in order to illustrate some example techniques for estimating uncertainty measures which may be utilized in a similar fashion to estimate uncertainty (or reciprocally certainty) with regard to various aspects of the technology descried herein. With reference to FIG. 11, navigation solutions representing a trajectory from a first position to a second position output by navigation module 120 may be fed to turn detector 1101. With respect to a given trajectory, the first and second positions may represent the boundary points of the trajectory, such as the starting position and the ending position. The navigation solutions may include position, velocity or attitude determinations, in any desired combination, such as position, velocity and attitude, or position and attitude only, attitude and velocity only, or even attitude or position only. As described above, any suitable turn identification technique or combination of techniques may be employed, including heading-based and position-based techniques. The main function of the turn detectors is to compute an array containing the start and the end epochs of all detected turns in the trajectory determined from the sensor readings. For example, heading-based turn detection may identify turns based on an empirically preset threshold for the rate of change of the moving platform's heading and position-based turn detection may identify turns based on an empirically preset threshold for the rate of change of the heading detected by the change in position in the forward direction of the moving platform. Turn identification segments the trajectory into a series of time-tagged segments and turns. Further, map information may be fed to grid generator 1102 to produce a grid map representing traversable regions of the venue encompassing the trajectory following the discussion above. Outputs from turn detector 1101 and grid generator 1102 may be fed to candidate generator 1104 to produce candidate links of the grid map, also following the discussion above, to allow matching the segmented trajectory to all possible routes on the grid map.

The candidate links from candidate generator 1104 are used by ordering algorithm 1106 to represent all the possible paths from the first position to the second position of the trajectory, each of which may be scored and assessed to determine the anchor point order. The estimated anchor point order produced by ordering algorithm 1106 may then be evaluated for certainty. As indicated, the order certainty may be computed for every anchor point using a weighted sum of local certainty estimator 1108, intermediate certainty estimator 1110 and global certainty estimator 1112. Every ordered anchor point may be assigned a local, intermediate and global order certainty measures and a weighting function may be used by anchor point order certainty estimator 1114 to compute one value for the order certainty. The certainty measure may guide map matching 1116, for example by ignoring anchor points with insufficient certainty measures and thus providing a more accurate map-matched solution.

Additionally, the ordered anchor points may be provided to time-tag estimator 1118 to assign a time to the anchor points corresponding to the sensor readings for the epoch of the trajectory passing by access point. Time-tag certainty estimator 1120 may assess the confidence of the time assignments and provide the information to the map matching operation 1116. As will be appreciated, map matching may be enhanced by estimating the times of the anchor points relative to the trajectory. To reduce the chance of an incorrectly time-tagged anchor point from disrupting the chosen solution, the certainty of the estimated time-tag is of significant importance. The combination of time-tag estimator 1118 and time-tag certainty estimator 1120 correspondingly provides the time-tag of each ordered anchor point along with a confidence in the computed time-tag. Map matching may then generate new hypothesis using only those anchor points with sufficient certainty measures. As an illustration, the time-tag of an ordered anchor point may be estimated by identifying portions of the trajectory with little or no change in position that may occur when the user is selecting an item for purchase, resulting in a dwell as described above. By comparing the length and position of the dwell periods to the positions of the anchor points on the candidate link, a time may be assigned to each anchor point. Time-tag certainty estimator 1120 may then utilize a weighting function based on the anchor point order certainty and the position of anchor point from the dwell periods to estimate the time-tag certainty. For example, time tag certainty factor, provided by time-tag certainty estimator 1120, may represent confidence in the estimation of which epoch the sensor-only solution passed by the anchor point. Since the time tag may be used during the map-matching process, for example by using an anchor point to generate a new hypothesis, the anchor point time tag certainty influences the positioning solution certainty. Since the anchor point might be assigned to the wrong sensor-only solution segment during the ordering process, the estimated time-tag may not be accurate and may lead to negative effects on the map-matching solution, and hence the final positioning solution. In one embodiment, the time-tag of the ordered anchor point may be estimated by finding all the dwells within the assigned sensor-only solution segment and comparing the length and position of the dwells to the position of the anchor point on the candidate link. Time-tag certainty estimator 1120 may utilize a weighting function which assesses the anchor point order certainty estimation and the position of anchor point from the dwells to estimate the time-tag certainty.

Forward, Backward, Merging (Smoothing

In some embodiments, non-causal filter 642 may employ instructions stored in host memory 104 and/or sensor memory 110 for execution by host processor 102 and/or sensor processor 108 for off-line performance of forward processing, backward processing, merging or combining the forward and backward processing (i.e., smoothing), and/or multi-pass smoothing to derive an interim navigation solution for portable device 100 using the motion sensor data at each epoch to provide the reference positions. It should be appreciated that the techniques of forward processing, backward processing, merging or combining the forward and backward processing (explained in the paragraph below), and/or multi-pass smoothing (explained in the next section) may be used alone or in conjunction with off-line map matching (which has been previously described).

Figure 12:
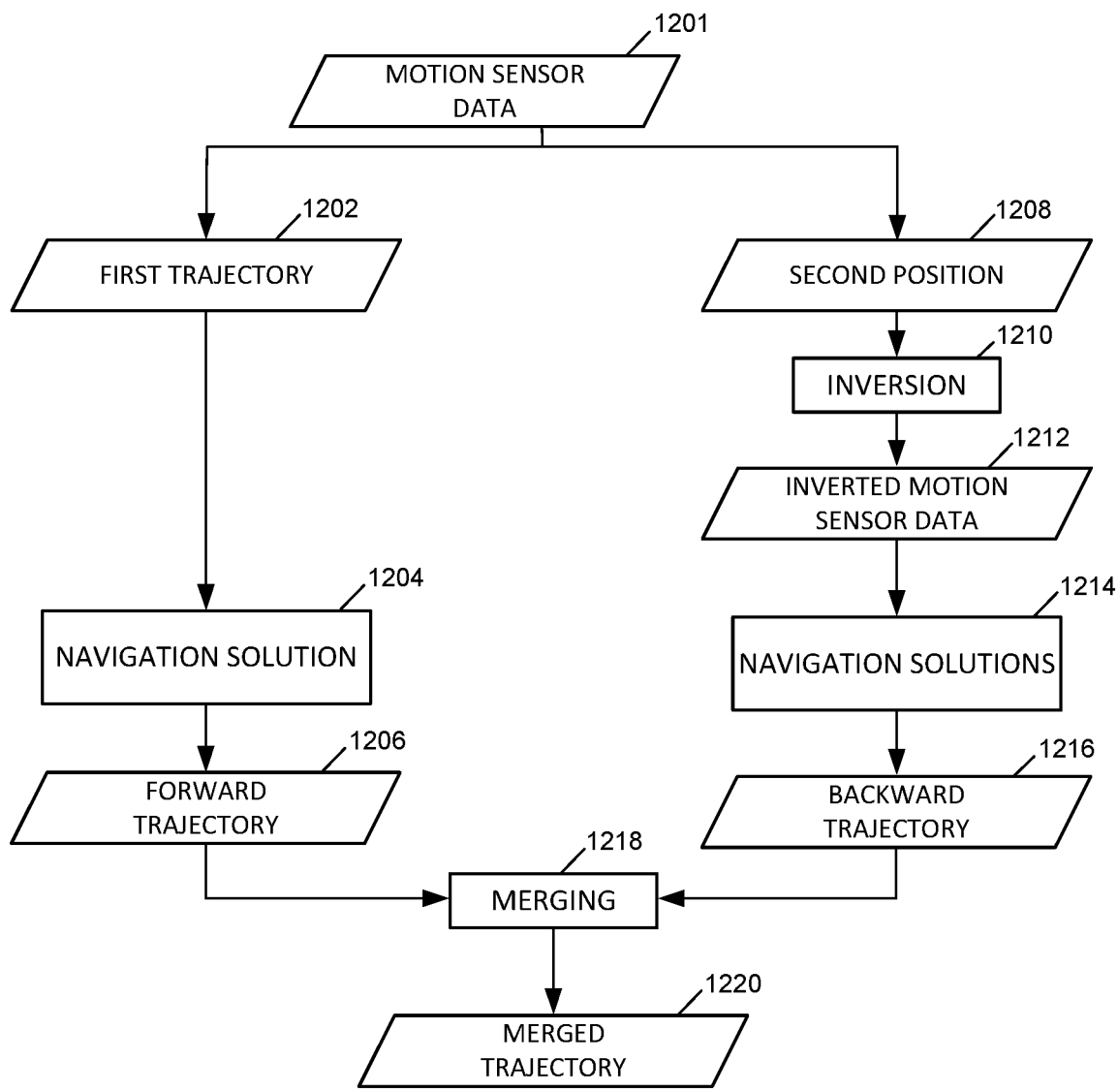
FIG. 12 is a flow diagram of a routine for enhancing a navigation solution through forward processing, backward processing, and merging according to an embodiment.

FIG. 12 is a flow diagram 1200 of a routine for enhancing a navigation solution through forward processing, backward processing, and merging (smoothing) according to an embodiment. Similarly, motion sensor data may be obtained for a plurality of epochs over a given time period, such as from inertial sensor 112 and/or external sensor 114, for the portable device in 1201. Blocks 1202, 1204, and 1206 correspond to the respective counterparts 1402, 1404, and 1406 as described with regard to FIG. 14 for estimating a forward trajectory. A parallel process beginning with 1208 receives the second position as an input. In 1210, an inversion operation may be applied to the motion sensor data to produce inverted motion sensor data as indicated in 1212. Here, the inverted sensor data may be integrated from the second position to derive navigation solutions 1214 that may be used to estimate a backward trajectory 1216. Here, this trajectory is termed "backward" because the navigation solutions are processed in the reverse order of the temporal sequence of epochs at which the motion sensor data was obtained. A merging operation is performed in 1218 to produce a merged trajectory as indicated by 1220. In an alternative embodiment, the backward trajectory obtained in this manner may be used instead of the forward trajectory 1406 noted in FIG. 14, with the modification that the first position would then be used as an input to the shortest path algorithm of global optimization 1418 rather than the second position.

Multi-Pass Smoothing

Figure 13:
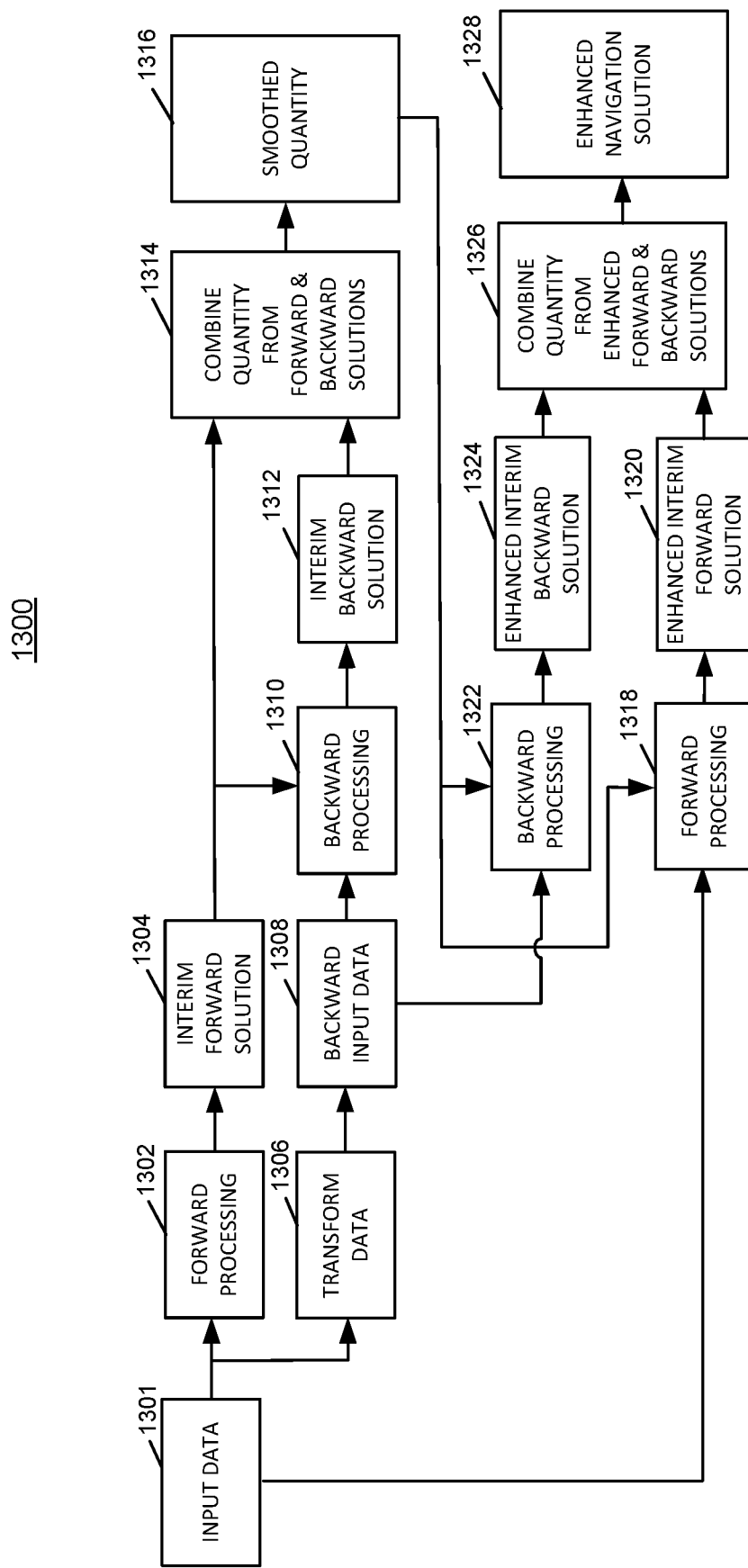
FIG. 13 is a flow diagram of a routine for enhancing a navigation solution through multiple pass smoothing according to an embodiment.

FIG. 13 is a flow diagram 1300 of a routine for enhancing a navigation solution through multiple pass smoothing according to an embodiment. The representative routine depicted in flow diagram 1300 involves techniques of such forward, backward, and/or multi-pass smoothing. Beginning with 1301, input data including sensor data, as well as information from other sources if available, is obtained. In 1302, a forward smoothing processing operation is performed for the data starting with the first instant and progressing to the second instant to derive an interim forward navigation solution in 1304. As noted above, this aspect may be performed locally with respect to the device or remotely. One or more transformations of the input data may be performed in 1306 to generate backward input data in 1308. The transformation converts the sensor data and other input data to a format corresponding to starting a trajectory at the second instant and ending the trajectory at the first instant. Accordingly, the transformed input data may be backward smoothing processed in 1310 to derive an interim backward navigation solution in 1312. Information from the interim forward navigation solution may be used during this operation. In this embodiment, the transformation of the input data allows the backward smoothing processing to employ the same algorithm as used for forward smoothing processing. In other embodiments, a different algorithm may be applied for the backward smoothing processing, which may obviate the transformation of the input depending on the nature of the algorithm.

At least one quantity of the navigation solution from the interim forward and backward smoothing navigation solutions may be combined in 1314 to generate a navigation solution that incorporates the smoothed quantity 1316. Multiple quantities may be combined at this stage of the process if they are independent. Next, in an example of multi-pass smoothing, another forward smoothing processing operation may be performed in 1318 to derive an enhanced interim forward navigation solution in 1320 using the input data and the quantity or quantities that were smoothed by combination in 1314. Similarly, another backward smoothing processing operation may be performed in 1322 to derive an enhanced interim backward navigation solution in 1324 using the quantity or quantities that were smoothed by combination in 1314. The backward smoothing processing of 1322 may be performed with the backward input data of 1308 if the same algorithm as used for the forward smoothing processing operation is employed, otherwise the backward smoothing processing of 1322 may use the input data from 1301 or the backward input data of 1308 depending on the nature of the algorithm employed.

In 1326, at least one quantity of the navigation solution that has yet to be combined from the forward and backward enhanced interim navigation solutions is smoothed by combining. As with the earlier combination, multiple quantities may be combined at this stage if they are independent. At each stage, the smoothed quantity or quantities from the previous iteration may be used in the forward and backward smoothing processing operations to update the enhanced interim navigation solutions. Accordingly, the output from 1326 is an enhanced smoothed navigation solution in 1328 that incorporates any quantities that were smoothed in 1314 and 1326.

If the quantities of the navigation solution are not independent, the operations of 1318 to 1326 may be performed iteratively until as many dependent quantities of the navigation solution have been smoothed by combination, such as by performing at least one additional smoothing pass by combining at least one additional quantity of the navigation solution from the enhanced interim forward and backward navigation solutions to obtain a smoothed version of the at least one additional combined quantity and performing forward and backward smoothing processing of the input data and the combined quantities to derive the enhanced interim forward and backward navigation solutions used to the last smoothing operation.

Global Shape Matching

In some embodiments, non-causal filter 642 may employ instructions stored in host memory 104 and/or sensor memory 110 for execution by host processor 102 and/or sensor processor 108 for global shape matching. Since the navigation solution may suffer from inaccuracies, particularly over time as noted, the shape of the trajectory may be used in combination with map information regarding the environment being navigated to regenerate an enhanced navigation solution with improved accuracy. Correspondingly, enhancing the navigation solution may occur after the trajectory has been completed, using sensor information obtained over the course of the trajectory, along with other information as described below. The trajectory may be shape matched to the map information as a solution to a global optimization problem, such that the trajectory is considered as an aggregate whole from the first position to the second position. Restated, applying these techniques results in a path that fits the map information and provides an overall shape closest to the trajectory.

As will be described in further detail below, the techniques for enhancing a navigation solution of a portable device and a platform using map information involve obtaining sensor data for the portable device. The portable device derives navigation solutions using the sensor data (i.e., one solution per epoch of each of a plurality of epochs). Subsequently, a trajectory determined from the navigation solutions may be globally shape matched to the map information. In some embodiments, the portable device may have sufficient processing capabilities and/or other resources available to perform the global shape matching routine locally, such as in the background when greater access to the processing capabilities is available. However, in other embodiments, the portable device may communicate the navigation solutions, any or all of the associated sensor data, or any combination of navigation solutions and sensor data to a remote server that may have greater processing capabilities and/or superior access to map information to be used in the global shape matching routine. The solution path may be used for any suitable purpose and need not involve the user directly, such as for the analysis of consumer metrics and behavior. However, the solution path may also be returned to the portable device, also for any suitable purpose, such as to provide the user with more accurate navigation information regarding the trajectory or to help improve future navigation performance of the portable device.

Figure 14:
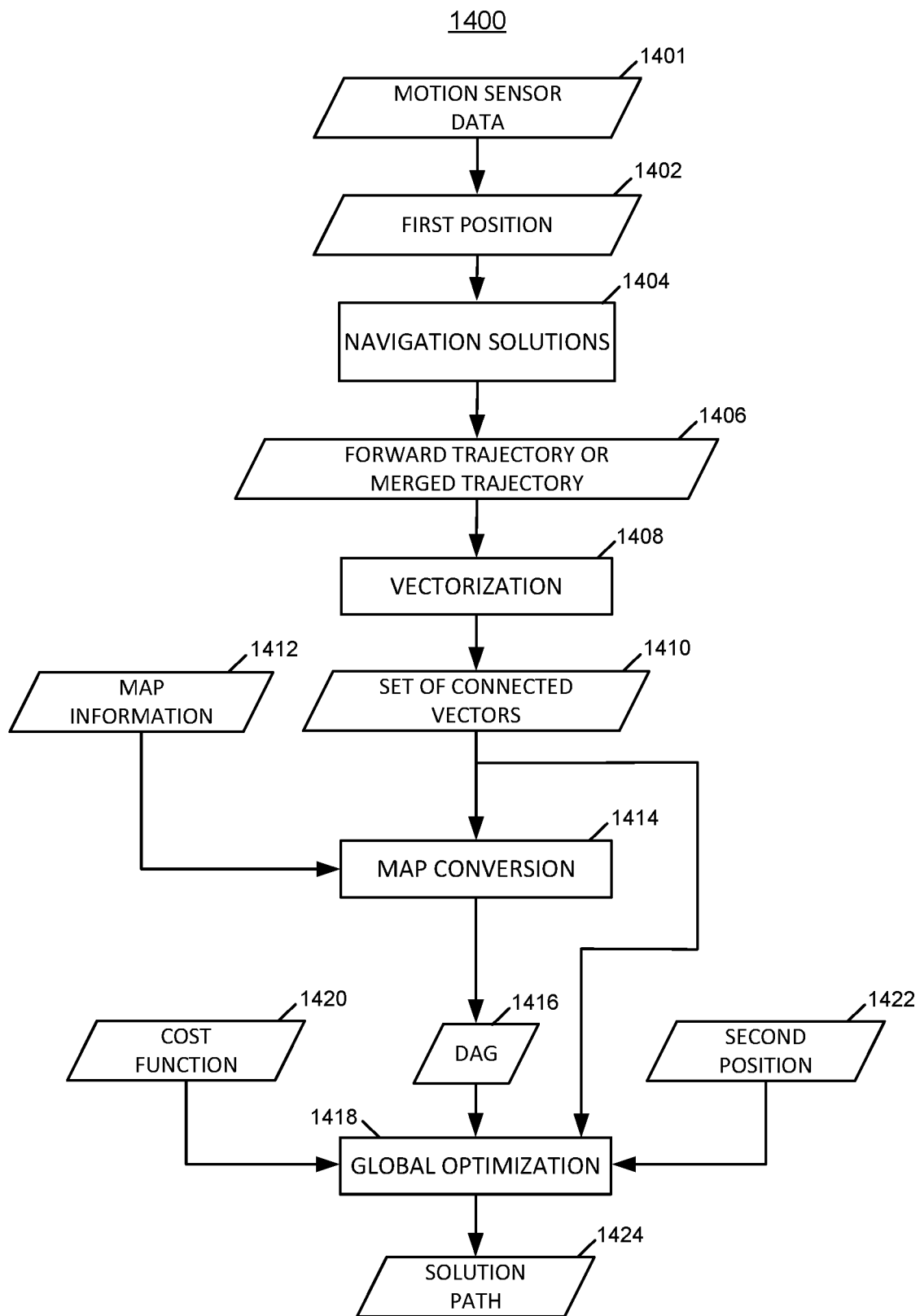
FIG. 14 is a flow diagram of a routine for global shape matching using a forward trajectory or a merged trajectory according to an embodiment.

FIG. 14 is a flow diagram 1400 of a routine for global shape matching using a forward trajectory or a merged trajectory according to an embodiment. Although a representative routine involving the techniques of this disclosure is depicted in FIG. 14, other routines for global shape matching may be utilized. In FIG. 14, operations or processes are designated with rectangles while inputs or outputs are designated with parallelograms. Beginning with 1401, sensor data may be obtained for a plurality of epochs over a given time period, such as from an inertial sensor 112 and/or an external sensor 114, for the portable device 100. A first position 1402 may be input, based on a known bounding point of the trajectory that may be determined in any suitable way, including an entrance to an area being traversed or other type of constraint. As an illustration only, suitable boundary points of the trajectory may be determined using beacons (e.g., BLE beacons) located at entrances or exits of a venue. Using the sensor data and integrating from the first position, navigation module 120 may derive a navigation solution at each sensor epoch in 1404. In embodiments where global shape matching is performed remotely, either the raw sensor data, the derived navigation solutions or both may be transmitted to remote processing resources, such as server 200. For example, the derivation of navigation solutions for each sensor epoch may be performed by navigation module 120 at portable device 100 or may be performed at server 200 using the raw sensor data for each sensor epoch as transmitted by portable device 100. In other embodiments, portable device 100 may perform the global shape matching locally.

Regardless of whether the global shape matching occurs locally or remotely, the navigation solutions of 1404 may be used to estimate a forward trajectory or merged trajectory 1406 for portable device 100. This trajectory is termed "forward or merged" because it corresponds to the temporal sequence of epochs at which the motion sensor data was obtained. In 1408, the trajectory is vectorized in a piece-wise linear manner. Accordingly, the output may be a set of connected vectors (i.e., the vectorized solution) representing the trajectory as indicated in 1410. To formulate the optimization problem, map information 1412 may be converted in 1414 to output a directed acyclic graph (DAG) 1416. This conversion step may require the number of vectors in the vectorized solution as an input to specify the number of rows in the graph. A global optimization may be performed in 1418, using as inputs the set of connected vectors 1410, a suitable cost function 1420, the second position 1422 and the DAG 1416 as shown. The optimization may be performed by applying graph theory to shape match the trajectory to the map information, such as through the execution of instructions associated with an algorithm which implements an aspect of graph theory. The second position 1422 may be determined by a suitable constraint, such as a cash register check out, an exit, another beacon, or the like, as another input. A shortest path algorithm may be applied within the optimization algorithm 1418 to produce the solution path as indicated by 1424.

Once a suitable trajectory has been estimated, either as a merged trajectory or as one of a forward and backward trajectory, the global shape matching techniques of this disclosure may be used to derive a solution path in the map information having a shape that optimizes the resemblance to the estimated trajectory. As will be discussed in further detail below, the map information for the environment encompassing the trajectory may be represented as a grid map, formed by a group of nodes that are connected to each other with links. A trajectory on such a grid map may be represented by a sequence of nodes and their connecting links. Mathematically, these may be treated as a series of vectors. Thus, to facilitate the global shape matching of the estimated trajectory to the map information, the estimated trajectory may be represented as a set of connected vectors by applying a vectorization operation, for example. This allows ready comparison of the shape of the estimated trajectory to the map information, as both may be represented in the same manner.

Generally, vectorization of the estimated trajectory may involve generating a two dimensional piecewise linear approximation to the shape of the trajectory. As will be appreciated, a number of techniques as known in the art may be employed. For example, an initial possible approximation may be established and then refined by dividing and merging segments together until suitable error criteria are satisfied. Another example is to connect points on the trajectory with local maximum k-curvature.

To help illustrate, the vectorization of an estimated trajectory may involve finding the minimum number of vectors that approximate the shape of the estimated trajectory, such that the error between the estimated trajectory and the vectorized trajectory solution is below a suitable threshold. The heads and tails of all vectors of the vectorized trajectory may be constrained to be on the curve of the estimated trajectory. Accordingly, the vectorized trajectory may be fully defined by selecting a set of points on the estimated trajectory and connecting them to form a set of connected vectors representing the estimated trajectory.

Following vectorization of the estimated trajectory, an optimization may be performed to provide a global shape match of the estimated trajectory to the map information as indicated by 1412 in FIG. 14, for example. Correspondingly, an input for the optimization is map information for the environment encompassing the trajectories. Map information may initially be obtained from any suitable source, such as from on-line map service providers. As necessary, the map information may be preprocessed into a form suitable for the global shape matching techniques, such as by creating a grid map.

The global shape matching of the estimated trajectory to the map information may be considered as deriving a solution path on the map between the first position and the second position while minimizing the cost function, which may be solved mathematically as an optimization problem. Consider for example a grid map which may be represented by a graph data structure, but may constitute an undirected cyclic graph. Such a grid map may result in infinitely many possible paths between the first position and the second position to evaluate with the available computing resources. In some embodiments, the cyclic graph can be converted into a directed acyclic graph (DAG) to enable globally solving this problem, without a separate step that explicitly generates infinitely many possible solution paths.

During a vectorization operation, the estimated trajectory may be approximated by a series of successive vectors $\{V_0, V_1, V_2, \ldots, \ldots, V_{n-1}\}$, where n is the total number of vectors in the vectorized trajectory. To match the vectorized trajectory to the map information, nodes on the vectorized trajectory may be matched to nodes on the map. Correspondingly, evaluating the possibilities to provide the desired global shape match optimization, the map information may be represented as a DAG. The trajectory may be shape matched to the map information as a solution to a global optimization problem, such that the trajectory is considered as an aggregate whole from the first position to the second position. Application of these techniques results in a path that fits the map information and provides an overall shape closest to the trajectory.

Put more succinctly, map information may be obtained for an environment encompassing locations of the portable device during the first period of time; the map information may be converted into a directed acyclic graph (DAG); an estimated trajectory may be represented using a set of connected vectors; and global shape matching may be performed for the set of connected vectors as an aggregate whole from the first position to the second position to the map information as a global optimization problem to derive a solution path.

From the map information and the vectorized trajectory, a DAG may be constructed to perform the global shape matching. Each node in the vectorized trajectory corresponds to a row in the DAG, so that the number of rows in the DAG equals the number of nodes in the vectorized trajectory. Further, each row in the DAG contains all the nodes of the grid map. Evaluation of the resemblances between the vectorized trajectory and a trajectory on the map may be performed by comparing relative angles between links. Therefore, the angle of the incoming link to each node may be used when applying the cost function. For example, reaching a node from the right is a completely different case than reaching it from the left, and the two cases may be evaluated separately. As may be appreciated, for a given row in the DAG, a node in the grid map may appear more than once due to consideration of the angle of the incoming link. Each node in the DAG corresponds to a grid map node that corresponds to this DAG node and different possibilities of incoming angles to the node on the grid map and may be just to identify different possibilities of reaching the node from different directions. The exact incoming angle to each node in the DAG may be identified from the grid map. For example, a single node in the grid map with four incoming links may be represented by four nodes in the DAG, one corresponding to each incoming angle.

Further, for each node in the grid map, a set of nodes termed "neighboring nodes" may be defined as the set of nodes that are reachable by a straight line on the grid map as. Moreover, a straight line on the grid map includes one or more collinear successive links. This definition account for the observation that a plurality of successive collinear links on the grid map may correspond to a single vector in the vectorized trajectory In the DAG, nodes in one row are not connected to nodes from the same row or to nodes from a preceding row. Connecting two rows in the DAG means that every node in the preceding row is to be connected to its neighboring nodes in the successive row with directed links. When constructing the DAG, each row is connected to the one next to it. A row can also be connected to rows after the next to represent the possibility of bypassing a node in the vectorized trajectory. For example, a node in the vectorized trajectory may be bypassed if the node separates two vectors in the vectorized trajectory that are nearly collinear or if it is a part of some noise in the trajectory. In one embodiment, a node $N_i$ may be considered to be bypassable if the difference between the slope of the vectors $|\theta_i - \theta_{i-1}|$ is within a certain threshold or if it is a part of very short vectors whose lengths are below a certain threshold $\epsilon_d$ i.e., $d_i < \epsilon_d \| d_{i-1} < \epsilon_d$. An optional aspect of the vectorization as discussed above is to combine two successive vectors having close directions.

Next, each link in the DAG may be given a weight which represents the cost of matching its end nodes to the corresponding nodes in the vectorized solution. As will be appreciated, this cost represents how similar the link connecting the map nodes is to the link that connects the corresponding nodes of the vectorized trajectory. The relative angle of any link may be defined as the difference between its slope and that of its preceding one. Accordingly, a suitable cost function may employ a parameter representing the difference between the length of the link in the grid map and the length of the link on the vectorized trajectory ($\Delta d$) and a parameter representing the difference between the relative angle of the link in the grid map and the relative angle of the corresponding link in the vectorized solution ($\Delta\Theta_r$), where the relative angle of a link in either the vectorized solution or the DAG is the difference between its angle and the angle of its predecessor. As with the vectorization optimization, the cost function may be expressed in a number of suitable forms. In exemplary embodiments, the cost function may be linear as given by Equation (4), quadratic as given by Equation (5), or a combination of both, where a and b are tunable parameters:

$$f(\Delta d, \Delta\theta_r) = a^* |\Delta d| + b^* |\Delta\theta_r| \quad (4)$$

$$f(\Delta d, \Delta\theta_r) = a^* (\Delta d)^2 + b^* (\Delta\theta_r)^2 \quad (5)$$

Any path on the DAG that starts at the start node and ends at the end node may be considered a possible match to the vectorized trajectory. The total cost of a certain path is the summation of the weights of its links, representing how similar the path on the map is to the vectorized trajectory. After calculating the weight of each link on the DAG, the global shape matching may involve finding a path that has the minimum total cost through the application of a suitable shortest path algorithm. As will be appreciated, shortest path problems are well known in the art.

One example of an algorithm having reasonable complexity that may be used to perform the global shape matching optimization is Dijkstra's algorithm. One of the nodes in the $1^{st}$ row that may be selected as corresponding to the first position on the grid map is given a weight of zero, while each remaining node on the DAG may be given an initial weight of infinity (the largest possible number). Any incoming angle may be used when selecting the node corresponding to the first position as the incoming angle to the node has no meaning for the first position, since it represents the start of the trajectory. Each row of the DAG may be processed successively. For each row, all nodes included in the row are processed. If the weight of the node is infinity, the node is skipped and if not, all links branching from the node are processed. For any link on the DAG, the node at which it starts may be termed the source node and the node at which it ends may be termed the destination node. The sum of the weight of the source node and the link may be computed, and if less than the weight of the destination node, the weight of the destination node may be set to the computed sum. Further, a parent of the destination node may be set to be the source node. Correspondingly, the parent of each node is its predecessor in the optimal path that goes from the starting node to that node. By processing the rows one by one, it may be ensured that after every node has been reached, every possible path starting from the starting node to that node has already been evaluated and the cost function minimized. Likewise, after processing all the nodes, a solution path connecting the first position to the second position may be derived in a backwards direction by starting at the node for the second position and selecting its parent, and then the parent of the parent (grandparent), repeating until the node for the first position is reached.

For crowdsourcing applications or others, an uncertainty in the position estimated by the shape matching method may be determined and used to help weight the crowdsourcing or other application. Notably, the motion sensor data is processed at a number of stages as navigation solutions are determined to estimate trajectories that are then shape matched. To estimate the overall uncertainty in the resulting solution path, errors that may arise at each stage may be considered. Further, uncertainty may be (i) cross-track uncertainty, (ii) along-track uncertainty, or (iii) a combination of cross-track and along-track uncertainties. For example, an uncertainty determination may be made with respect to the three stages discussed below.

A first stage may account for any errors that arise as the raw sensor data is processed to determine sensor-based portable navigation solutions, such as by navigation module 120 as noted above. During this stage, there may be uncertainty attributed to: i) the uncertainty of the sensor-based navigation solution; ii) the uncertainty in estimating the misalignment between the heading of the IMU device and that of the platform (e.g. a shopper), if available; and iii) the uncertainty in step detection and step length estimation for a pedestrian, if available.

A next stage may represent the transition from the sensor-based navigation solutions to the vectorized estimated trajectory. In each segment of the vectorized trajectory, there may be a point by point error difference between the vectorized trajectory and the estimated trajectory. This uncertainty may be accommodated as a point by point error, its maximum, or its average along each segment as a factor when estimating the overall uncertainty.

A further stage may represent the optimization performed when global shape matching the vectorized trajectory to the map information to derive a solution path. Uncertainty during this stage may be evaluated in light of factors including the cost function that was used for the shape matching method, as this provides the measure of resemblance between the shape of the vectorized trajectory and the solution path. In one aspect, the parameters of the cost function may be adjusted to be numerically more meaningful. The error in the distance and relative angles between the shape matching solution path and the vectorized trajectory may be evaluated at a number of nodes before and after the link of interest.

By following the above techniques, an uncertainty measure may be estimated for the full 2D or 3D position estimate, or it may be segregated into an along track uncertainty measure and a cross track uncertainty measure, or may be any combination. The along track uncertainty is the uncertainty of positioning the user or platform along the direction of motion (which would be along the map link), whereas the cross track uncertainty is the uncertainty of positioning the user or platform in the lateral direction or the perpendicular direction to the direction of motion (which would be the uncertainty in identifying the map link itself). In some embodiments, it may be desirable to express the uncertainty measure estimated for any of the above stages or for the overall solution path as a standard deviation.

Succinct Descriptions of Various Aspects

In one aspect of a method of maintenance of a location fingerprint database for an area, signal measurement data may be collected together with motion sensor data from each of a plurality of portable devices transiting a portion of the area of the location fingerprint database, wherein the motion sensor data is collected by a sensor assembly in each of the plurality of portable devices. Offline non-causal processing may be used to process the collected motion sensor data into reference positions associated with the portion of the area. The collected signal measurement data may be used together with the reference positions to update the location fingerprint database.

In one aspect, collecting signal measurement data together with motion sensor data from each of a plurality of portable devices transiting a portion of the area of the location fingerprint database may include collecting motion sensor data from at least one of an accelerometer and a gyroscope of a portable device of the portable devices.

In one aspect, collecting signal measurement data together with motion sensor data from each of a plurality of portable devices transiting a portion of the area of the location fingerprint database may include collecting signal measurement data which comprises at least one of an acoustic signal measurement, a radio signal measurement, a wireless networking signal measurement, a magnetic signal measurement, and an optical signal measurement.

In one aspect, the location fingerprint database may be one of a stable location fingerprint database and an unstable location fingerprint database.

In one aspect, using offline non-causal processing to process the collected motion sensor data into reference positions associated with the portion of the area may further include at least one of: a) using offline backward smoothing to process the collected motion sensor data into reference positions associated with the portion of the area; b) using offline map matching to process the collected motion sensor data into reference positions associated with the portion of the area; and c) using offline backward smoothing together with offline map matching to process the collected motion sensor data into reference positions associated with the portion of the area.

In one aspect, using offline non-causal processing to process the collected motion sensor data into reference positions associated with the portion of the area may include using an offline non-causal processing technique selected from the list of techniques consisting of: backwards smoothing; forward and backward smoothing; and multi-pass smoothing.

In one aspect, employing the collected signal measurement data together with the reference positions to update the location fingerprint database may include at least one of: a) building out a new location fingerprint database; b) building out a new location fingerprint database using an existing fingerprint database, wherein the new location fingerprint database comprises fingerprints of a type of signal measurement different than the type of signal comprised in the existing location fingerprint database; c) bridging a gap which exists in the location fingerprint database; d) determining the location fingerprint database is unstable by comparing signal measurement data associated with a reference position of the reference positions with existing signal measurement data in the location fingerprint database which corresponds to the reference position; e) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position; f) when the location fingerprint database is known to be unstable, updating the location fingerprint database by replacing the existing signal measurement data in the location fingerprint database which corresponds to the reference position with the signal measurement data associated with the reference position; g) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position, and h) when the location fingerprint database is known to be stable, updating the location fingerprint database by merging the existing signal measurement data in the location fingerprint database which corresponds to the reference position with the signal measurement data associated with the reference position.

In one aspect a computing system for maintenance of a location fingerprint database for an area may include an interface and a processor. The interface may be configured to receive signal measurement data together with motion sensor data from each of a plurality of portable devices transiting a portion of the area of the location fingerprint database. The processor may be configured to: use offline non-causal processing to process the received motion sensor data into reference positions associated with the portion of the area; and employ the received signal measurement data together with the reference positions to update the location fingerprint database.

In one aspect the computing system may further include a portable device, of the plurality of portable devices, the portable device comprising a sensor assembly configured to output a portion of the motion sensor data, the portion of the motion sensor data representing motions of the portable device and being collected together with a portion of the signal measurement data while the portable device is transiting the portion of the area of the location fingerprint database.

In one aspect, the computing system may further include the plurality of portable devices.

In one aspect, using offline non-causal processing to process the collected motion sensor data into reference positions associated with the portion of the area may further include at least one of: a) using offline backward smoothing to process the collected motion sensor data into reference positions associated with the portion of the area; b) using offline map matching to process the collected motion sensor data into reference positions associated with the portion of the area; and c) using offline backward smoothing together with offline map matching to process the collected motion sensor data into reference positions associated with the portion of the area.

In one aspect, where the processor may be configured to employ the collected signal measurement data together with the reference positions to update the location fingerprint database, may include the processor being configured to perform at least one of: a) building out a new location fingerprint database; b) building out a new location fingerprint database using an existing fingerprint database, wherein the new location fingerprint database comprises fingerprints of a type of signal measurement different than the type of signal comprised in the existing location fingerprint database; c) bridging a gap which exists in the location fingerprint database; d) determining the location fingerprint database is unstable by comparing signal measurement data associated with a reference position of the reference positions with existing signal measurement data in the location fingerprint database which corresponds to the reference position; e) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position; f) when the location fingerprint database is known to be unstable, updating the location fingerprint database by replacing the existing signal measurement data in the location fingerprint database which corresponds to the reference position with the signal measurement data associated with the reference position; g) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and h) when the location fingerprint database is known to be stable, updating the location fingerprint database by merging the existing signal measurement data in the location fingerprint database which corresponds to the reference position with the signal measurement data associated with the reference position.

In one aspect, the location fingerprint database may be one of a stable location fingerprint database and an unstable location fingerprint database.

In one aspect, the motion sensor data may include data from at least one of an accelerometer and a gyroscope.

In one aspect, the signal measurement data may include at least one of: an acoustic signal measurement, a radio signal measurement, a wireless networking signal measurement, a magnetic signal measurement, and an optical signal measurement. In one aspect the non-causal processing may include one of: backwards smoothing; forward and backward smoothing; and multi-pass smoothing.

In one aspect, the processor may be one of: an edge processor located local to the area associated with the location fingerprint database; and a portion of a remote processing resource located remotely from the area associated with the location fingerprint database.

In one aspect, a portable device for updating a location fingerprint database for an area, may include a means to collect signal measurement data while transiting a portion of the area of the location fingerprint database; an integrated sensor assembly configured to output sensor data, the sensor data comprising motion sensor data collected while transiting the portion of the area of the location fingerprint database, the motion sensor data representing motions of the portable device; and a processor. The processor may be configured to: use offline non-causal processing to process the collected motion sensor data into reference positions associated with the portion of the area; and employ the collected signal measurement data together with the reference positions to update the location fingerprint database.

In one aspect, the portable device may further include: a communications module configured to receive signal measurement data collected together with motion sensor data from each of a plurality of portable devices transiting the portion of the area of the location fingerprint database, and the processor may be further configured to: use offline non-causal processing to process the received motion sensor data into additional reference positions associated with the portion of the area; and employ the received signal measurement data together with the additional reference positions to update the location fingerprint database.

In one aspect, the processor may be configured to use offline non-causal processing to process the collected motion sensor data into reference positions associated with the portion of the area further comprises the processor being configured to perform at least one of: a) using offline backward smoothing to process the collected motion sensor data into reference positions associated with the portion of the area; b) using offline map matching to process the collected motion sensor data into reference positions associated with the portion of the area; and c) using offline backward smoothing together with offline map matching to process the collected motion sensor data into reference positions associated with the portion of the area.

In one aspect, the processor may be configured to employ the output signal measurement data together with the reference positions to update the location fingerprint database comprises the processor being configured to perform at least one of: a) building out a new location fingerprint database; b) building out a new location fingerprint database using an existing fingerprint database, wherein the new location fingerprint database comprises fingerprints of a type of signal measurement different than the type of signal comprised in the existing location fingerprint database; c) bridging a gap which exists in the location fingerprint database; d) determining the location fingerprint database is unstable by comparing signal measurement data associated with a reference position of the reference positions with existing signal measurement data in the location fingerprint database which corresponds to the reference position; e) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position; f) when the location fingerprint database is known to be unstable, updating the location fingerprint database by replacing the existing signal measurement data in the location fingerprint database which corresponds to the reference position with the signal measurement data associated with the reference position; g) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and h) when the location fingerprint database is known to be stable, updating the location fingerprint database by merging the existing signal measurement data in the location fingerprint database which corresponds to the reference position with the signal measurement data associated with the reference position.

In one aspect, the location fingerprint database may be one of a stable location fingerprint database and an unstable location fingerprint database.

In one aspect, the motion sensor data may include: data from at least one of an accelerometer and a gyroscope.

In one aspect, the signal measurement data may include at least one of: an acoustic signal measurement, a radio signal measurement, a wireless networking signal measurement, a magnetic signal measurement, and an optical signal measurement.

In one aspect, the non-causal processing may include one of: backwards smoothing; forward and backward smoothing; and multi-pass smoothing.

In one aspect, a non-transitory computer readable storage medium may include instructions embodied thereon for causing a computer system to perform a method of updating an unstable location fingerprint database for an area. In the method, signal measurement data may be collected together with motion sensor data from each of a plurality of portable devices transiting a portion of the area of the location fingerprint database, wherein the motion sensor data is collected by a sensor assembly in each of the plurality of portable devices; offline non-causal processing may be used to process the collected motion sensor data into reference positions associated with the portion of the area; and the collected signal measurement data may be employed together with the reference positions to update the location fingerprint database.

In one aspect, using offline non-causal processing to process the collected motion sensor data into reference positions associated with the portion of the area may further include at least one of: a) using offline backward smoothing to process the collected motion sensor data into reference positions associated with the portion of the area; b) using offline map matching to process the collected motion sensor data into reference positions associated with the portion of the area; and c) using offline backward smoothing together with offline map matching to process the collected motion sensor data into reference positions associated with the portion of the area.

In one aspect, employing the collected signal measurement data together with the reference positions to update the location fingerprint database may include building out a new location fingerprint database.

In one aspect, employing the collected signal measurement data together with the reference positions to update the location fingerprint database may include building out a new location fingerprint database using an existing fingerprint database, wherein the new location fingerprint database comprises fingerprints of a type of signal measurement different than the type of signal comprised in the existing location fingerprint database.

In one aspect, employing the collected signal measurement data together with the reference positions to update the location fingerprint database may include bridging a gap which exists in the location fingerprint database.

In one aspect, employing the collected signal measurement data together with the reference positions to update the location fingerprint database may comprise performing at least one of the actions from the list of actions consisting of: a) determining the location fingerprint database is unstable by comparing signal measurement data associated with a reference position of the reference positions with existing signal measurement data in the location fingerprint database which corresponds to the reference position; b) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position; and c) when the location fingerprint database is known to be unstable, updating the location fingerprint database by replacing the existing signal measurement data in the location fingerprint database which corresponds to the reference position with the signal measurement data associated with the reference position.

In one aspect, employing the collected signal measurement data together with the reference positions to update the location fingerprint database may include performing at least one of the actions from the list of actions consisting of: a) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and b) when the location fingerprint database is known to be stable, updating the location fingerprint database by merging the existing signal measurement data in the location fingerprint database which corresponds to the reference position with the signal measurement data associated with the reference position.

Section 4: Revising an Unstable Location Fingerprint Database for an Area

Figure 15:
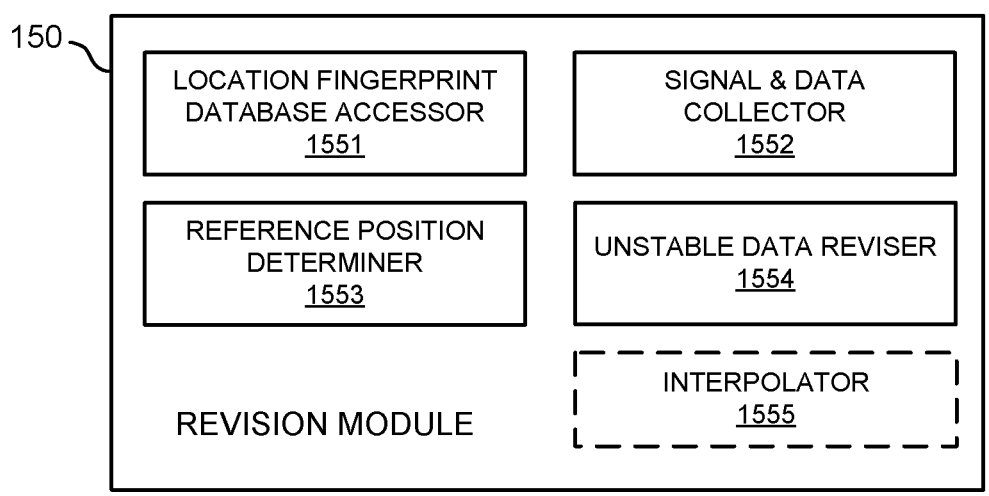
FIG. 15 is a block diagram of a revision module, in accordance with various embodiments.

FIG. 15 is a block diagram of a revision module 150, in accordance with various embodiments. Revision module 150 may be utilized in embodiments which perform revising of an unstable location fingerprint database for an area. As depicted, revision module 150 includes location fingerprint database accessor 1551, signal and data collector 1552, reference position determiner 1553, and unstable data reviser 1554. In some embodiments, revision module 150 may additionally include an interpolator 1555.

Location fingerprint database accessor 1551 of revision module 150 operates to obtain or access all or portions of a plurality of location fingerprint databases, where at least one of the location fingerprint databases is stable, and any of the others may be unstable. When a portion of an area of an unstable fingerprint database is being revised, the stable location fingerprint database overlaps at least that portion of an area of which is being revised and at least these portions of these location fingerprint databases are accessed by location fingerprint database accessor 1551. This obtaining may involve revision module 150 employing communications module 124 and/or interface 125 to remotely access some or all of the location fingerprint database and/or copy all or portions of them into host memory 104 if they are not already present. The accessed location fingerprint databases 160 may be located remotely from or local to the portable device 100 or computer 200 upon which location fingerprint database accessor 1551 is operating.

Signal and data collector 1552 of revision module 150 operates to collect motion/inertial sensor data (e.g., measurements from accelerometers and gyroscopes) or motion-based data (e.g., motion data and/or results from processed motion-data like position displacement and change of orientation as provided by a sensor/motion processing unit 106), and signal data measurements (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) of various signals. The motion/inertial sensor data, motion-based data, and signal measurement data originate from sensors (e.g., 112, 114, and/or 116) of portable device 100 and/or from a plurality of other portable devices 100. The collected measurements, motion-based data, and signal measurement data are associated with transiting a portion of an area of a location fingerprint database which is being revised or maintained. The area for which data collection is performed may be a congruence where areas of a stable location fingerprint database and an unstable location fingerprint database overlap one another. The collection may be as part of a formal (preplanned) survey or resurvey or as part of an ad hoc survey or resurvey based on data collected by device that happens to transit the portion of the area being maintained. An example of an ad hoc survey may be crowd-sourced data. In some embodiments, a person who is acting as a surveyor may not ever be aware that a portable device 100 in their possession is collecting and providing motion/inertial sensor data, motion-based data, and/or signal measurement data for a survey. The motion sensor data may be collected by a sensor assembly, such as SPU/MPU 106 in portable device 100 and each of the plurality of other portable devices 100. Motion-based data in various embodiments comprises inertial-based data which has had some amount of processing already performed upon it such that it indicates a change in orientation or a displacement from a previous position. In some embodiments, by way of demonstrative example, this inertial-based data may have a rate of 1-2 Hz when collected from a portable device 100, however other rates are possible and anticipated. Motion-based data may also include raw data from motion sensors such as an accelerometer or a gyroscope. As compared to raw motion data which may be collected at a higher data rate such as 20 Hz (by way of demonstrative example), using processed motion-based data may consume less bandwidth to transmit and less storage space to store as it comprises a smaller amount of data due to the processing which has occurred to create it.

Reference position determiner 1553 of revision module 150 determines reference positions by processing the collected measurements using at least one stable location fingerprint database. More particularly, and as will be explained in greater detail, the at least one stable location fingerprint database is used to perform likelihood evaluations for the collected signal measurement data which is provided as an input to a positioning filter which also receives the collected motion-based data as an input and provides reference positions as an output.

Unstable data reviser 1554 of revision module 150 operates to employ the collected signal measurement data (e.g., signal measurements from the environment) together with the reference positions to revise data in an unstable location fingerprint database 160 which is being revised. Revisions performed by unstable data reviser 1554 may be accomplished using collected signal measurement data (e.g., non-inertial measurement data such as magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements, etc.) together with reference positions to perform at least one of: interpolating data to fill in a small hole in an existing stable location fingerprint databases; revising an unstable location fingerprint database; and reinforcing or supplementing data in a stable location fingerprint database.

Interpolator 1555, when included in revision module 150, operates to interpolate location fingerprint data between nearby reference positions. Any type of interpolation may be utilized. In a simple case, for example, signal measurement data may be averaged for an interpolated reference position that is mid-way between two nearby measured reference positions. Similarly, weighted averaging may be utilized when the interpolated reference position is between two measured reference positions, but closer to one the measured reference position than another. Such interpolation may be utilized to add extra granularity/fidelity to a location fingerprint database 160. More sophisticated interpolation methods may also be utilized, e.g., interpolation using Gaussian processes.

Figure 16:
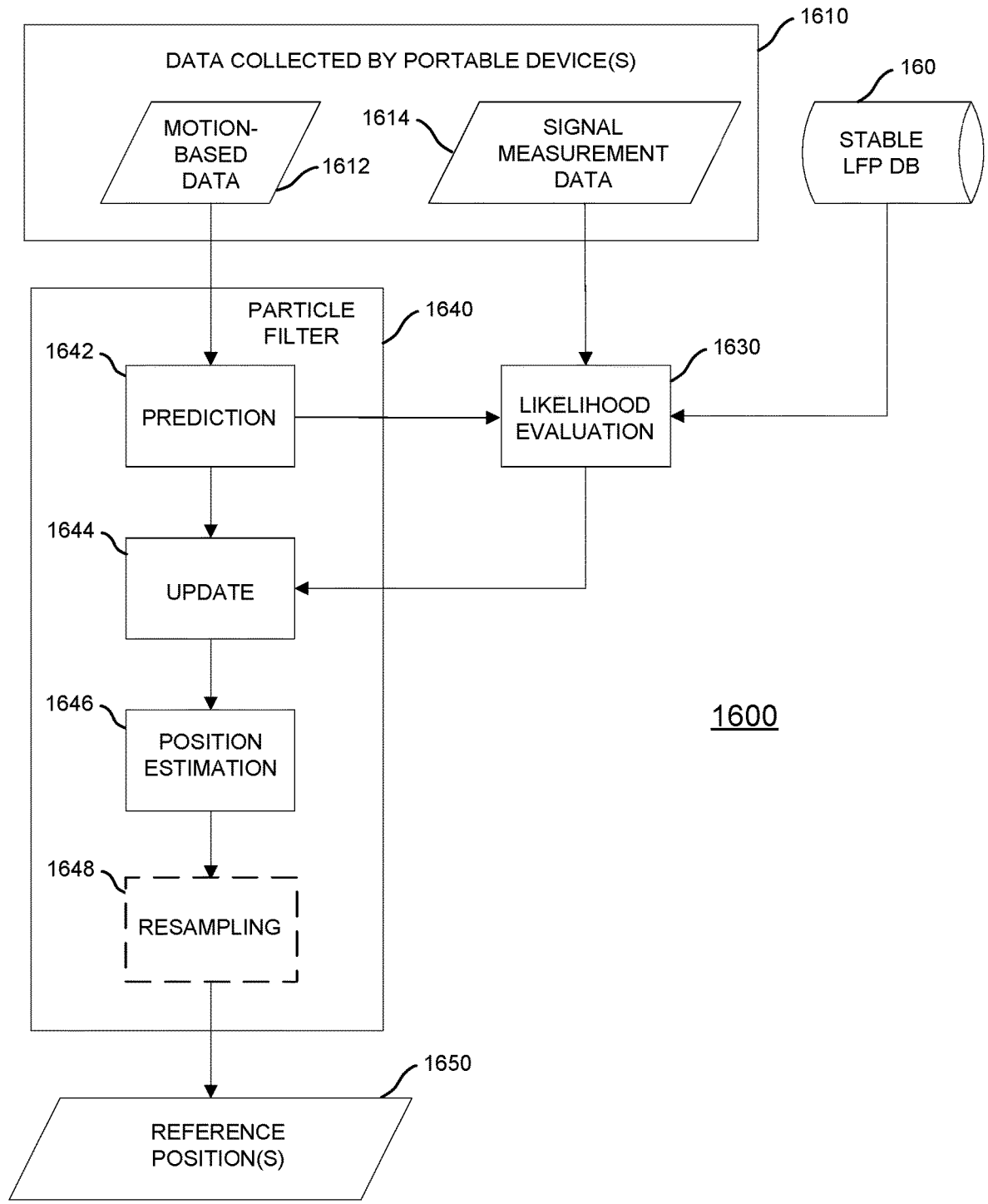
FIG. 16 is an illustrative flow diagram of using a positioning filter with a stable location fingerprint database to determine reference positions, in accordance with various embodiments.

FIG. 16 is an illustrative flow diagram 1600 of using a positioning filter with a stable location fingerprint database to determine reference positions, in accordance with various embodiments. In FIG. 16, the positioning filter is depicted by particle filter 1640, but any suitable positioning filter may be utilized that uses state estimation techniques and includes a prediction step and an update step. Some non-limiting examples of suitable positioning filters include, but are not limited to: a particle filter, a Kalman filter, or an unscented filter. Reference position determiner 1553 may carry out the actions depicted in flow diagram 1600.

As depicted, filter 1640 receives inputs in the form of data 1610 collected from one or more portable devices 100. The data 1610 includes motion-based data 1612 and signal measurement data 1614 collected during the same time period or sensing epoch. Input from at least one stable location fingerprint database 160 (which may be one or more stable location fingerprint 160-1 through 160-N) is provided for use in a likelihood evaluation 1630 that is performed on signal measurement data 1614. The particle filter uses a set of particles to represent the posterior distribution of the portable device coordinates. Each particle is assigned with a weight depending on probability density value to the particle coordinates. The signal measurement data 1614 used includes at least one measurement (e.g., magnetometer readings) corresponding to the stable location fingerprint database 160.

Motion-based data 1612 is provided to and informs the initial prediction step in prediction block 1642 of particle filter 1640 and used to predict or propagate coordinates of the particles using a motion model of a carrier of the portable device, e.g., a pedestrian motion model or an indoor vehicle motion model, etc. This predication is provided as an input to update step in update block 1644 along with the result from likelihood evaluation 1630. Likelihood evaluation 1630 determines the probability or "likelihood" that a particular item of signal measurement data was taken/measured at a particular position. The weights of particles are updated using the likelihood values and used in the position estimation step in block 1646, where particle filter estimates the position of the portable device 100 at the time where the motion-based data 1612 and the signal measurement data 1614 were collected. For example, portable device coordinates can be estimated in block 1646 by weighted averaging coordinates of all particles. In addition, an uncertainty of the portable device coordinates can be estimated at this step as well. The updating (in update block 1644) of the predicted reference position may involve matching a sequence of measurements with the stable location fingerprint database, which may be accomplished as part of update block 1644 or as part of likelihood evaluation 1630.

In some embodiments, a resampling step in block 1648 may be employed to prevent the particles form degradation. The position estimate is then output as a reference position 1650 which describes a position of a portable device at which the motion-based data 1612 and signal measurement data 1614 used for input to particle filter 1640 were collected.

Figure 17:
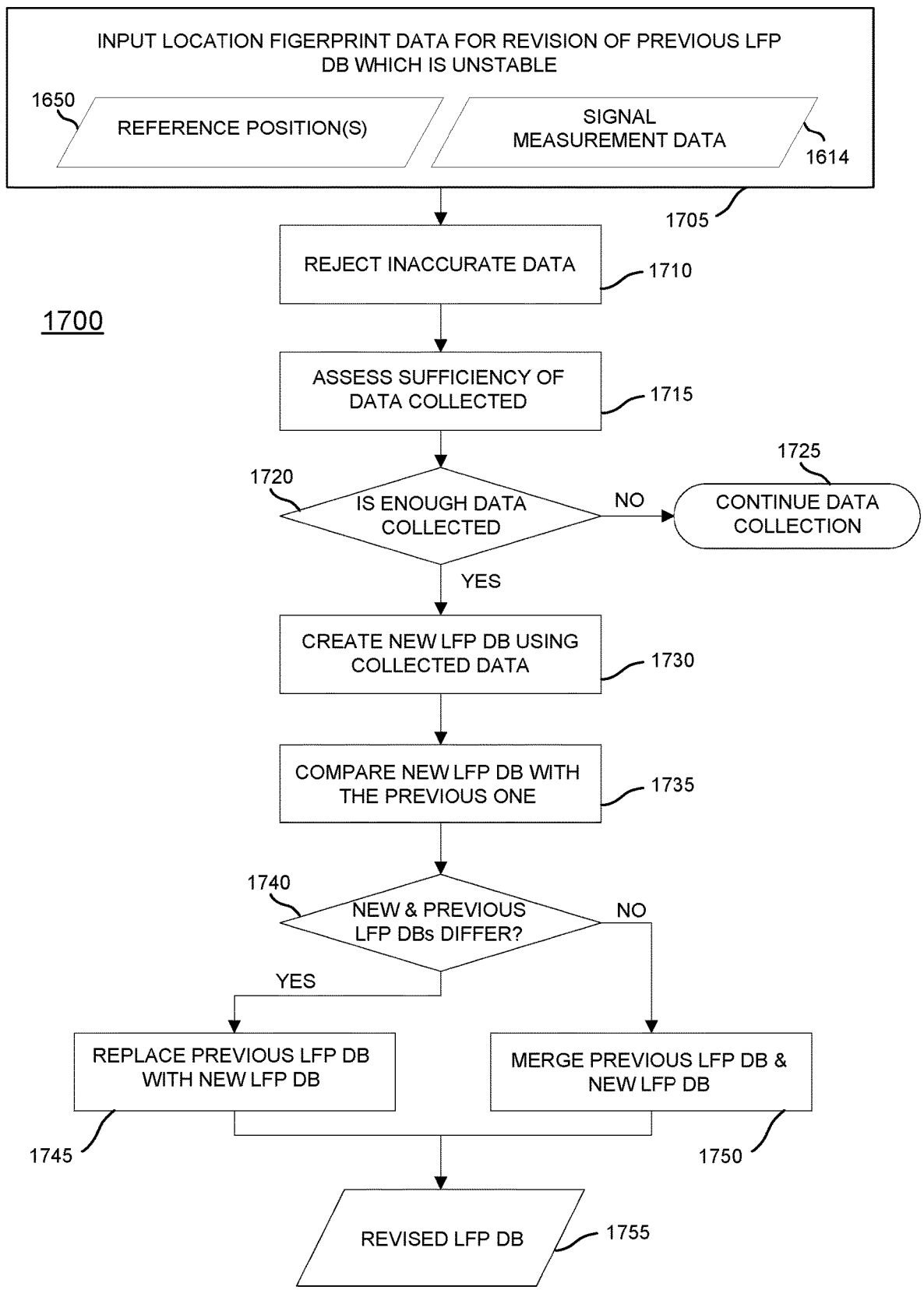
FIG. 17 is a flow diagram of revising an unstable location fingerprint database, in accordance with various embodiments.

FIG. 17 is a flow diagram 1700 of revising an unstable location fingerprint database, in accordance with various embodiments. Unstable data reviser 1554 may carry out the actions depicted in flow diagram 1700. Flow diagram 1700 is only an example, and in other embodiments more or fewer procedures may be performed.

At 1705 location fingerprint data of a previously created/existing, but unstable, location fingerprint database 160 is provided as input for revision. The revision may comprise revising a reference position in a single unstable location fingerprint database, or the revision of the same reference position in a plurality of unstable location fingerprint databases 160. The input location fingerprint data comprises the reference position 1650 computed using a stable LFP DB and the signal measurement data 1614 corresponding to an unstable LPF DB which were determined to have been collected at that reference position 1650.

At 1710 inaccurate location fingerprinting data is rejected. An item of location fingerprinting data comprises any signal measurement data 1614 that is associated with a reference position 1650. The rejection may be based upon an unacceptable level of uncertainty of the location of the reference position 1650. This level of uncertainty may be preset and may be adjustable. The rejection may additionally or alternatively be based upon preset thresholds associated with the quality of the signal measurement data 1614 and/or differences in an item of signal measurement data which are outside a bound as compared to other of the same type of signal measurement data for the same reference position 1650.

At 1715, the remaining signal measurement data 1614 is assessed to determine if the amount of data is sufficient to perform a revision. For example, a measure of sufficiency can be an average amount of measurements per some area. More sophisticated criterion can rely on uncertainty of the measurements. In some embodiments, thresholds or other mechanisms for judging the sufficiency of the data collected may be employed.

At 1720, a decision is made on the sufficiency of the collected data. If it is sufficient amount of data to perform a revision, the process continues to 1730, if not, the process is paused or stopped at 1725 to continue collection of data. Criteria for what constitutes a "sufficient" amount of data may be predetermined and may be adjustable.

At 1730 a new location fingerprint database entry is created for the reference position and the types of signal measurement data 1614 that were determined to have a sufficient amount of data collected. This may be done for a single reference position entry in a location fingerprint database, or it may be done for numerous reference position entries such that an entirely new location fingerprint database is created. New LFP DB creation can comprise dividing a building area into cells, assigning input measurements to closest cells according to their reference coordinates, and estimating, for every cell, some signal parameters. Signal parameters may, for example, be estimated by averaging all measurements assigned to a particular cell, however, other methods of estimation can also be used, e.g., robust statistical estimation techniques. Accordingly, other values can be estimated, e.g., uncertainty of signal parameters.

At 1735, the signal measurement data for the created entries for reference position(s) 1650 are compared with the like signal measurement data for the entries for like reference positions in the previously existing unstable location fingerprint database(s) which is/are being revised. For example, magnetometer measurement data would be compared with magnetometer measurement data, broadcast radio station measurement data (measured from radio signals broadcasting from one or more commercial radio stations) would be compared with broadcast radio station measurement data, etc. Comparison can be realized, for example, based on averaged absolute values of differences of signal parameter estimates in two databases, the new and the previous ones, for the same location cells.

At 1740 a determination is made as to whether the like types of signal measurement data for like new and previously existing reference position entries differ from one another, or else differ in excess of a pre-established threshold. If there is a difference (or a difference in excess of a threshold) then at 1745 the signal measurement data in the entry for the reference position in the existing/unstable location fingerprint database 160 is replaced with signal measurement data 1614 that are associated with the reference position 1650 or respective reference positions 1650 to create a revised location fingerprint database at 1755. If there is not a difference (or a difference does not exceed a threshold) then at 1750 the signal measurement data for the entry for the reference position in the existing/unstable location fingerprint database 160 are merged with signal measurement data 1614 that are associated with the reference position 1650 or respective reference positions 1650 to create a revised location fingerprint database at block 1755. The merge can be realized, for example, by weighed averaging of signal parameter estimates from two DBs for the same location cells. Weights can be determined, for example, at least partly based on signal parameter uncertainties. In some embodiments, an unstable location fingerprint database is revised in part or parts as data for specific areas being revised is collected, such as via crowdsourcing. One more opportunity is to use the method of revising an unstable DB for creating the unstable DB in a case of a low sample rate of measurements of the unstable DB. In this case, it is possible to finish initial survey as soon as enough measurements of a stable DB with high sample rate (e.g., magnetic measurements with sample rate 20 Hz, as a demonstrative example) have been collected and do not wait until the same amount of measurements of an unstable DB (e.g., Wi-Fi measurements with low sample rate 0.2-0.3 Hz, as a demonstrative example) can be collected. The rest of measurements of the unstable DB can be collected by crowdsourcing and the unstable DB can be obtained by the revision according to the embodiment. This contributes to decreasing time of initial survey.

It should be appreciated that multiple location fingerprint databases 160 may be revised simultaneously in this manner. For example, when sufficient signal measurement data 1614 exist for a reference position for both magnetic and WiFi signals, separate location fingerprint databases may be revised which include each of these types of data or a single location fingerprint database which includes both types of data may be revised for both types of data. In another embodiment, if a reference position 1650 appears in two or more different databases that use the same signal measurement data for fingerprinting (e.g., magnetic signals), then the reference position entries associated with reference position 1650 may be revised in these two or more location fingerprint databases.

With reference to FIG. 5B, consider an embodiment where reference position 512 is output as reference position 1650. In this example area 570 is associated with location fingerprint database 160-2, which is a stable location fingerprint database. In this same example, area 560 and area 580 may be respectively associated with location fingerprint databases 160-1 and 160-N which are both unstable. In this example, signal measurement data 1614 collected with a portable device 100 traversing transit path 502 and reference position 512 may be utilized to provide revisions to like signal measurement data in location fingerprint databases 160-1 and 160-N in database entries associates with reference position 512.

Illustrative Methods of Operation

FIGS. 18A and 18B illustrate a flow diagram 1800 of an illustrative method of revising an unstable location fingerprint database for an area, in accordance with various embodiments. Procedures of this method will be described with reference to elements and/or components of one or more of FIGS. 1-17. It is appreciated that in some embodiments, the procedures may be performed in a different order than described, that some of the described procedures may not be performed, and/or that one or more additional procedures to those described may be performed. Flow diagram 1800 includes some procedures that, in various embodiments, are carried out by one or more processors (e.g., sensor processor 108, host processor 102, server processor 228 or the like) under the control of computer-readable and computer-executable instructions that are stored on non-transitory computer-readable storage media (e.g., host memory 104, sensor memory 110, server memory 230, or the like). It is further appreciated that one or more procedures described in flow diagram 1800 may be implemented in hardware, or a combination of hardware with firmware and/or software.

With reference to FIG. 18A, at procedure 1810 of flow diagram 1800, in various embodiments, a plurality of initial location fingerprint databases are accessed. The plurality of location fingerprint databases comprises at least a stable location fingerprint database and an unstable location fingerprint database. For purposes of example in the description of FIG. 18A, location fingerprint database 160-2 may be considered "stable" and location fingerprint database 160-2 may be considered "unstable," where unstable means that some of the signal measurement data stored in associated with one or more reference positions is no longer correct. The accessing may be performed by location fingerprint database accessor 1551 and may involve accessing information which is stored remotely from or local to a portable device 100 or computer/server 200 upon which location fingerprint database accessor 1551 is operating. As part of the accessing, in some embodiments, all or a portion of the accessed data may be stored locally upon a portable device 100 or computer/server 200 where location fingerprint database accessor 1551 is operating. Any suitable type of location fingerprint database may be accessed. In some embodiments the at least one stable location fingerprint database selected is one of: a magnetic location fingerprint database; an optical location fingerprint database; an ultrasonic location fingerprint database; and a broadcasting radio station signals location fingerprint database. In some embodiments the at least one unstable location fingerprint database selected is one of: a wireless networking signal location fingerprint database; an acoustic location fingerprint database comprising location fingerprints in one or more of the sonic and ultrasonic ranges. An accessed stable or unstable location fingerprint database may comprise information for a plurality of types of signal measurement data, such as wireless networking signal measurement data and optical signal measurement data, in each entry for a reference location. In other embodiments, an accessed stable or unstable location fingerprint database may comprise information for a single type of signal measurement data such as magnetic signal measurement data, in each entry for a reference location.

With continued reference to FIG. 18A, at procedure 1820 of flow diagram 1800, in various embodiments, signal measurement data is collected together with motion-based data from each of a plurality of portable devices 100 transiting a portion of the area of the unstable location fingerprint database. FIG. 5B illustrates a plurality of transit paths 501, 502, 503, and 504 associated with portable devices 100-1, 100-2, 100-3, and 100-N respectively. It should be appreciated that the method may use a greater or lesser number of portable devices 100 and associated transit paths. For example, in some embodiments, a single portable device 100 and its single transit path and its associated signal measurement data collected together with motion-based data. In other embodiments, the plurality of portable devices 100 from which signal measurement data is collected together with motion-based data is collected may be dozens, hundreds, or more portable devices 100 and their respective transit paths. The collection of signal measurement data together with motion-based data may be performed by signal and data collector 1552.

With reference again to 1820 of FIG. 18A, in various embodiments, the motion-based data collected may be one or more of: a displacement and change of orientation of each portable device 100 of the plurality of portable devices; and raw (unprocessed) motion sensor data of each portable device 100 of the plurality of portable devices. The motion sensor data may be collected from an SPU/MPU 106 and may be from one or more at least one of an accelerometer and a gyroscope of a portable device 100 of the plurality of portable devices.

The collecting of signal measurement data may comprise collecting signal measurement data corresponding to the stable location fingerprint database (e.g., 160-2) and signal measurement data corresponding to the unstable location fingerprint database (e.g., 160-1). In various embodiments, the collected signal measurement data may comprise data such as magnetometer measurements, radio signal measurements (signals from any radio signals source), broadcast radio station signal measurements (from radio signals broadcasting from one or more commercial radio stations), broadcast television station signal measurements, wireless networking signal measurements, optical signal measurements, acoustic signal measurements, etc.

With continued reference to FIG. 18A, at procedure 1830 of flow diagram 1800, in various embodiments, reference positions associated with locations in the unstable location fingerprint database are determined by using at least one stable location fingerprint database (e.g., 160-2 in the ongoing example) to process the collected signal measurement data and the motion-based data into the reference positions. In the interest of brevity and clarity, the description and examples focus on the use of one stable location fingerprint database even though the techniques described herein facilitate using more than one stable location fingerprint database to assist in processing the collected signal measurement data and the motion-based data into the reference positions. Reference position determiner 1553 may be utilized to determine the reference positions 1650 in a manner as described in conjunction with flow diagram 1600 of FIG. 16.

In some embodiments, a positioning filter is used to determine the reference positions, and the positioning filter utilizes input from one or more stable location fingerprint databases such as location fingerprint database 160-2. The positioning filter may be any suitable filter including, but not limited to: a particle filter; a Kalman filter; and an unscented filter (e.g., an unscented Kalman filter), or other state estimation technique/filter. In various embodiments, the positioning filter includes a prediction step (e.g., prediction block 1642 of flow diagram 1600) and an update step (e.g., in update block 1644 of flow diagram 1600). The prediction step (e.g., block 1642 of FIG. 16) may use motion-based data to predict a reference position (e.g., motion-based data 1612 of FIG. 16) to perform an initial prediction of a position of a portable device 100 when signal measurement data (e.g., signal measurement data 1614 of FIG. 16) was collected. The update step (e.g., update block 1644 of FIG. 16) uses the collected signals measurement data (e.g., signal measurement data 1614 of FIG. 16) and the at least one stable location fingerprint database (e.g., 160-2 and others) to update the predicted reference position. For example, the stable location fingerprint database(s) may be used as part of a likelihood evaluation of the collected signals measurement data. The updating of the predicted reference position may involves matching a sequence of the collected signal measurements (e.g., signal measurement data 1614) with like measurements (i.e., optical light measurements are matched with optical light measurements, Bluetooth measurements are matched with Bluetooth measurements, etc.) at a like position in the stable location fingerprint database(s) 160 that are being utilized.

With continued reference to FIG. 18A, at procedure 1840 of flow diagram 1800, in various embodiments, the reference positions and the signal measurement data are employed to revise data in the unstable location fingerprint database(s). An item of data in an entry being revised may be stable or unstable. In the interest of brevity and clarity, the description and examples focus on the revision of one unstable location fingerprint database even though the techniques described herein facilitate revising more than one unstable location fingerprint database. Unstable data reviser 1554 may be utilized to revise the unstable data in a manner as described in conjunction with flow diagram 1700 of FIG. 17.

As part of the revision process, new location fingerprint data may be rejected as being inaccurate for a variety of reasons. In one example, new location fingerprint data may be rejected based on an uncertainty level of the reference position associated with the new location fingerprint data.

As part of the revision process, a check may be performed to determine if sufficient new location fingerprint data has been collected to perform a revision to an item of data (i.e., an entry in the unstable location fingerprint database for signal measurement data at a reference position). For example, a preset threshold may need to be exceed in order to proceed with the revision process. In one non-limiting example, the process may require two or more items of the same type of signal measurement data 1614 in the new location fingerprint data 1705 in order to have sufficient location fingerprint data 1705. If an insufficient amount of data is determined to have been collected to modify an item of data in the unstable location fingerprint database, then collection of the new location fingerprint data 1705 associated with a reference position 1650 is continued without revising the item data of the location fingerprint data. In response to a sufficient amount of data having been collected to modify an item of data in the unstable location fingerprint database, the process proceeds with revising the item of data in the unstable location fingerprint database. The revision may involve making no change, replacing an item of data, or merging an existing item of data with new data.

As part of the revising, new location fingerprint data (i.e., signal measurement data 1614) associated with a reference position may be compared to existing location fingerprint data (i.e., signal measurement data of the same type as signal measurement data 1614) for the same reference position's entry in the unstable location fingerprint database(s) being revised. For example, magnetic signal measurement data 1614 for a reference position 1650 would be compared with magnetic signal measurement data in the unstable location fingerprint database for the same reference position 1650. Based on the results of the comparison, one or more of several actions may take place. For example, in response to the comparison noting a difference, the existing location fingerprint data in the location fingerprint database being revised may be replaced with the new location fingerprint data. Conversely, based on the results of the comparison noting no difference no action may be taken with the existing location fingerprint data or the new location fingerprint data may be merged (such as by averaging or other mechanism) with the existing location fingerprint data in the location fingerprint database being revised. In the comparison, a "difference" may be any difference at all or a difference which exceeds a preset threshold. Some demonstrative examples include thresholds such as 1%, 5%, or some other threshold. Similarly, "no difference" may be no difference at all, or a difference which does not exceed a preset threshold in difference.

In some embodiments, a variety of signal measurement data 1614 exists for a reference position 1650, such as: magnetometer measurements, radio signal measurements (signals from any radio signal source), broadcast radio station signal measurements (from radio signals broadcasting from one or more commercial radio stations), wireless networking signal measurements, optical signal measurements, acoustic signal measurements. However, the location fingerprint database being revised may only contain some of these types of signal measurements, such as: magnetometer measurements and broadcast radio station signal measurements (measured from broadcasting radio signals from one or more commercial radio stations). In such an embodiment the location fingerprint database that is being revised may be supplemented or fleshed out by revising it to include the data of one or more additional signal measurements for the reference position 1650 (e.g., one or more of the wireless networking signal measurements, optical signal measurements, and acoustic signal measurements in this example).

It should be appreciated that the revising described in 1840 of flow diagram 1800 may be performed for all reference positions in an unstable location fingerprint database for an area or for only a portion (i.e., less than all of the reference positions) of an unstable location fingerprint database. For example, the revising may be performed only for unstable location fingerprint data associated with a portion (less than all) of the area for which the signal measurement data together with the motion-based data has been collected during a survey.

With reference to FIG. 18B, at procedure 1850 of flow diagram 1800, in various embodiments, the method as described in procedures 1810-1840 further comprises subsequent to employing the reference positions and the signal measurement data to revise unstable data in the unstable location fingerprint database, interpolating information between the reference positions of the unstable fingerprint database which has been revised. This may comprise selecting one or more positions between adjacent reference positions 1650 which are stable, and then using techniques such as averaging, weighted averaging, or other technique to interpolate fingerprinting data for positions between these reference positions. These interpolated reference positions and their associated interpolated fingerprinting data may provide additional granularity to a location fingerprint database for an area. With reference to FIG. 5B, for example, reference positions 514 and 515 and their associated signal measurement data can be used to interpolate signal measurement data for interpolated reference position 516. In this manner one or more interpolations can be carried out to fill in interpolated reference positions and associated interpolated signal measurement data for hole 571 in area 570 and entries in location fingerprint database 160-2.

Succinct Descriptions of Various Aspects

In one aspect of a method revising an unstable location fingerprint database for an area, a plurality of initial location fingerprint databases are accessed an include at least a stable location fingerprint database and an unstable location fingerprint database. Signal measurement data may be collected together with motion-based data from each of a plurality of portable devices transiting a portion of the area of the unstable location fingerprint database. Reference positions associated with locations in the unstable location fingerprint database may be determined by using the stable location fingerprint database to process the collected signal measurement data and the motion-based data into the reference positions. The reference positions and the signal measurement data may be employed to revise unstable data in the unstable location fingerprint database.

In one aspect, the method may further include, subsequent to employing the reference positions and the signal measurement data to revise unstable data in the unstable location fingerprint database, interpolating information between the reference positions of the unstable fingerprint database.

In one aspect, accessing a plurality of initial location fingerprint databases comprising at least a stable location fingerprint database and an unstable location fingerprint database may include accessing at least one stable location fingerprint database selected from the list consisting of: a) a magnetic location fingerprint database; b) an optical location fingerprint database; c) an ultrasonic location fingerprint database; d) a broadcasting radio signals location fingerprint database.

In one aspect, accessing a plurality of initial location fingerprint databases comprising at least a stable location fingerprint database and an unstable location fingerprint database may include accessing at least one unstable location fingerprint database selected from the list consisting of: a) a wireless networking signal location fingerprint database; and b) an acoustic location fingerprint database comprising location fingerprints in one or more of the sonic and ultrasonic ranges.

In one aspect, collecting signal measurement data together with motion-based data from each of a plurality of portable devices transiting a portion of the area of the unstable location fingerprint database may include collecting motion-based data from the list of motion-based data consisting of: a) a displacement and change of orientation of each portable device of the plurality of portable devices; and b) motion sensor data of each portable device of the plurality of portable devices.

In one aspect, collecting signal measurement data together with motion-based data from each of a plurality of portable devices transiting a portion of the area of the unstable location fingerprint database may include collecting signal measurement data corresponding to the stable location fingerprint database and signal measurement data corresponding to the unstable location fingerprint database.

In one aspect, determining reference positions associated with locations in the unstable location fingerprint database by using the stable location fingerprint database to process the collected signal measurement data and the motion-based data into the reference positions may include at least one of: a) employing a positioning filter to process the reference positions, wherein the positioning filter utilizes input from at least one stable location fingerprint database; b) employing a positioning filter to process the reference positions, wherein the positioning filter utilizes input from at least one stable location fingerprint database, and wherein the positioning filter is selected from the list of positioning filters consisting of: i) a particle filter; ii) Kalman filter; and iii) an unscented filter; c) employing a positioning filter to process the reference positions, wherein the positioning filter utilizes input from at least one stable location fingerprint database, and wherein the positioning filter includes a prediction step and an update step; d) employing a positioning filter to process the reference positions, wherein the positioning filter utilizes input from at least one stable location fingerprint database, wherein the positioning filter includes a prediction step and an update step, and wherein the prediction step uses the motion-based data to predict a reference position; e) employing a positioning filter to process the reference positions, wherein the positioning filter utilizes input from at least one stable location fingerprint database, wherein the positioning filter includes a prediction step and an update step, and wherein the update step uses the collected signals measurement data and at least one stable location fingerprint database to update the predicted reference position; f) employing a positioning filter to process the reference positions, wherein the positioning filter utilizes input from at least one stable location fingerprint database, wherein the positioning filter includes a prediction step and an update step, wherein the update step uses the collected signals measurement data and at least one stable location fingerprint database to update the predicted reference position, and wherein the updating of the predicted reference position involves a likelihood evaluation; and g) employing a positioning filter to process the reference positions, wherein the positioning filter utilizes input from at least one stable location fingerprint database, wherein the positioning filter includes a prediction step and an update step, wherein the update step uses the collected signals measurement data and at least one stable location fingerprint database to update the predicted reference position, and wherein the updating of the predicted reference position involves matching a sequence of measurements with the stable location fingerprint database.

In one aspect, employing the reference positions to revise unstable data in the unstable location fingerprint database may include rejecting new location fingerprint data as being inaccurate based on an uncertainty level of the reference position associated with the new location fingerprint data.

In one aspect, employing the reference positions to revise unstable data in the unstable location fingerprint database may include: a) comparing new location fingerprint data to existing location fingerprint data; and b) performing at least one action from the list of actions comprising: i) responsive to the comparison noting a difference, replacing the existing location fingerprint data with the new location fingerprint data; and ii) responsive to the comparison noting no difference, merging the existing location fingerprint data with the new location fingerprint data.

In one aspect, employing the reference positions to revise unstable data in the unstable location fingerprint database may include revising only a portion of the unstable location fingerprint data associated with the portion of the area for which the signal measurement data together with the motion-based data has been collected.

In one aspect, employing the reference positions to revise unstable data in the unstable location fingerprint database may include responsive to a sufficient amount of data having been collected to modify an item of unstable data in the unstable location fingerprint database, revising the item of unstable data in the unstable location fingerprint database; and responsive to an insufficient amount of data having been collected to modify the item of unstable data in the unstable location fingerprint database, continuing collection of the data without revising the item of unstable data in the unstable location fingerprint database.

In one aspect, a computing system for revising an unstable location fingerprint database for an area, may include an interface and a processor. The interface may be configured to: access a plurality of initial location fingerprint databases comprising at least a stable location fingerprint database and an unstable location fingerprint database; and receive signal measurement data together with motion-based data from each of a plurality of portable devices transiting a portion of the area of the unstable location fingerprint database. The processor may be configured to: determine reference positions associated with locations in the unstable location fingerprint database by using the stable location fingerprint database to process the received signal measurement data and the motion-based data into the reference positions; and employ the reference positions and the signal measurement data to revise unstable data in the unstable location fingerprint database.

In one aspect, the computing system may further include a portable device, of the plurality of portable devices, the portable device comprising a sensor assembly configured to output a portion of motion sensor data for obtaining the motion-based data, wherein the motion-based data represents motions of the portable device, and wherein the portion of motion sensor data is collected together with a portion of the signal measurement data while the portable device transits the portion of the area of the unstable location fingerprint database.

In one aspect, the computing system may include the plurality of portable devices.

In one aspect, motion-based data may include one of: a) displacement and change of orientation of a portable device of the plurality of portable devices; and b) motion sensor data of the plurality of portable devices.

In one aspect, the signal measurement data may include at least one measurement corresponding to the stable location fingerprint database and at least one measurement corresponding to the unstable location fingerprint database.

In one aspect, the processing system configured to determine reference positions associated with locations in the unstable location fingerprint database by using the stable location fingerprint database to process the received signal measurement data and the motion-based data into the reference positions may include the processing system configured to perform at least one of: a) employ a positioning filter to process the reference positions, wherein the positioning filter utilizes input from the stable location fingerprint database; b) employ a positioning filter to process the reference positions, wherein the positioning filter utilizes input from the stable location fingerprint database, and wherein the positioning filter is selected from the list of positioning filters consisting of: i) a particle filter; ii) Kalman filter; and iii) an unscented filter; c) employ a positioning filter to process the reference positions, wherein the positioning filter utilizes input from the stable location fingerprint database, and wherein the positioning filter includes a prediction step and an update step; d) employ a positioning filter to process the reference positions, wherein the positioning filter utilizes input from the stable location fingerprint database, wherein the positioning filter includes a prediction step and an update step, and wherein the prediction step uses the motion-based data to predict a reference position; e) employ a positioning filter to process the reference positions, wherein the positioning filter utilizes input from the stable location fingerprint database, wherein the positioning filter includes a prediction step and an update step, and wherein the update step uses the collected signals measurement data and the stable location fingerprint database to update the predicted reference position; f) employ a positioning filter to process the reference positions, wherein the positioning filter utilizes input from the stable location fingerprint database, wherein the positioning filter includes a prediction step and an update step, wherein the update step uses the collected signals measurement data and the stable location fingerprint database to update the predicted reference position, and wherein the updating of the predicted reference position involves a likelihood evaluation; and g) employ a positioning filter to process the reference positions, wherein the positioning filter utilizes input from the stable location fingerprint database, wherein the positioning filter includes a prediction step and an update step, wherein the update step uses the collected signals measurement data and the stable location fingerprint database to update the predicted reference position, and wherein the updating of the predicted reference position involves matching a sequence of measurements with the stable location fingerprint database.

In one aspect, the processor configured to employ the reference positions to revise unstable data in the unstable location fingerprint database may include the processor being configured to reject new location fingerprint data as being inaccurate based on an uncertainty level of the reference position associated with the new location fingerprint data.

In one aspect, the processor configured to employ the reference positions to update unstable data in the unstable location fingerprint database may include the processor being configured to: a) compare new location fingerprint data to existing location fingerprint data; and b) perform at least one action from the list of actions comprising: i) responsive to the comparison noting a difference, replace the existing location fingerprint data with the new location fingerprint data; and ii) responsive to the comparison noting no difference, merge the existing location fingerprint data with the new location fingerprint data.

In one aspect, the processor configured to employ the reference positions to revise unstable data in the unstable location fingerprint database may include the processor being configured to revise only a portion of the unstable location fingerprint data associated with the portion of the area for which the signal measurement data together with the motion-based data has been collected.

In one aspect, the processor configured to employ the reference positions to revise unstable data in the unstable location fingerprint database may include the processor being configured to: responsive to a sufficient amount of data having been collected to modify an item of unstable data in the unstable location fingerprint database, revise the item of unstable data in the unstable location fingerprint database; and responsive to an insufficient amount of data having been collected to modify the item of unstable data in the unstable location fingerprint database, continue collection of the data without revising the item of unstable data in the unstable location fingerprint database.

In one aspect, the stable location fingerprint database may include one of: a magnetic location fingerprint database; an optical location fingerprint database; and an ultrasonic location fingerprint database; and a broadcasting radio signals location fingerprint database; and the unstable location fingerprint database may include one of: a wireless networking signal location fingerprint database; and an acoustic location fingerprint database comprising location fingerprints in one or more of the sonic and ultrasonic ranges.

In one aspect, the processor may be one of: an edge processor located local to the area associated with the unstable location fingerprint database; and a portion of a remote processing resource located remotely from the area associated with the unstable location fingerprint database.

In one aspect, a portable device for revising an unstable location fingerprint database for an area may include an interface configured to access a plurality of initial location fingerprint databases comprising at least a stable location fingerprint database and an unstable location fingerprint database; a means to collect signal measurement data while transiting a portion of the area of the unstable location fingerprint database; a sensor assembly configured to output motion sensor data for obtaining motion-based data representing the motion of the portable device, the motion sensor data captured contemporaneously with the collection of the signal measurement data while transiting the portion of the area of the unstable location fingerprint database; and a processor. The processor may be configured to: determine reference positions associated with locations in the unstable location fingerprint database by using the stable location fingerprint database to process the collected signal measurement data and the output motion-based data into the reference positions; and employ the reference positions and the collected signal measurement data to revise unstable data in the unstable location fingerprint database.

In one aspect, the portable device may include a communications module further configured to receive signal measurement data together with motion-based data from each of a plurality of portable devices transiting the portion of the area of the location fingerprint database, and the processor may be further configured to: determine additional reference positions associated with locations in the unstable location fingerprint database by using the stable location fingerprint database to process the received signal measurement data and the received motion-based data into the additional reference positions; and employ the additional reference positions and the received signal measurement data to revise unstable data in the unstable location fingerprint database.

In one aspect, the output motion-based data may comprise one of: a) displacement and change of orientation of the plurality the portable device; and b) motion sensor data of the portable device.

In one aspect, the collected signal measurement data may include at least one measurement corresponding to the stable location fingerprint database and at least one measurement corresponding to the unstable location fingerprint database.

In one aspect using the stable location fingerprint database to process the collected signal measurement data and the output motion-based data into the reference positions may involve a positioning filter which utilizes input from the stable location fingerprint database, wherein the positioning filter includes a prediction step and an revise step.

In one aspect, a non-transitory computer readable storage medium may include instructions embodied thereon for causing a computer system to perform a method of revising an unstable location fingerprint database for an area. The method may comprise: accessing a plurality of initial location fingerprint databases comprising at least a stable location fingerprint database and an unstable location fingerprint database; collecting signal measurement data together with motion-based data from each of a plurality of portable devices transiting a portion of the area of the unstable location fingerprint database; determining reference positions associated with locations in the unstable location fingerprint database by using at least one stable location fingerprint database to process the collected signal measurement data and the motion-based data into the reference positions; and employing the reference positions and the signal measurement data to revise unstable data the unstable location fingerprint database.

CONTEMPLATED EMBODIMENTS

It is contemplated that the techniques of this disclosure can be used with a navigation solution that may optionally utilize automatic zero velocity periods or static period detection with its possible updates and inertial sensors bias recalculations, non-holonomic updates module, advanced modeling and/or calibration of inertial sensors errors, derivation of possible measurements updates for them from GNSS when appropriate, automatic assessment of GNSS solution quality and detecting degraded performance, automatic switching between loosely and tightly coupled integration schemes, assessment of each visible GNSS satellite when in tightly coupled mode, and finally possibly can be used with a backward smoothing module with any type of backward smoothing technique and either running in post mission or in the background on buffered data within the same mission.

It is further contemplated that techniques of this disclosure can also be used with a mode of conveyance technique or a motion mode detection technique to establish the mode of conveyance. This enables the detection of pedestrian mode among other modes such as for example driving mode. When pedestrian mode is detected, the method presented in this disclosure can be made operational to determine the misalignment between the device and the pedestrian.

It is further contemplated that techniques of this disclosure can also be used with a navigation solution that is further programmed to run, in the background, a routine to simulate artificial outages in the absolute navigation information and estimate the parameters of another instance of the state estimation technique used for the solution in the present navigation module to optimize the accuracy and the consistency of the solution. The accuracy and consistency is assessed by comparing the temporary background solution during the simulated outages to a reference solution. The reference solution may be one of the following examples: the absolute navigation information (e.g., GNSS); the forward integrated navigation solution in the device integrating the available sensors with the absolute navigation information (e.g., GNSS) and possibly with the optional speed or velocity readings; or a backward smoothed integrated navigation solution integrating the available sensors with the absolute navigation information (e.g., GNSS) and possibly with the optional speed or velocity readings. The background processing can run either on the same processor as the forward solution processing or on another processor that can communicate with the first processor and can read the saved data from a shared location. The outcome of the background processing solution can benefit the real-time navigation solution in its future run (i.e., real-time run after the background routine has finished running), for example, by having improved values for the parameters of the forward state estimation technique used for navigation in the present module.

It is further contemplated that the techniques of this disclosure can also be used with a navigation solution that is further integrated with maps (such as street maps, indoor maps or models, or any other environment map or model in cases of applications that have such maps or models available), and a map aided or model aided routine. Map aided or model aided can further enhance the navigation solution during the absolute navigation information (such as GNSS) degradation or interruption. In the case of model aided, a sensor or a group of sensors that acquire information about the environment can be used such as, for example, Laser range finders, cameras and vision systems, or sonar systems. These new systems can be used either as an extra help to enhance the accuracy of the navigation solution during the absolute navigation information problems (degradation or absence), or they can totally replace the absolute navigation information in some applications.

It is further contemplated that the techniques of this disclosure can also be used with a navigation solution that, when working either in a tightly coupled scheme or a hybrid loosely/tightly coupled option, need not be bound to utilize pseudorange measurements (which are calculated from the code not the carrier phase, thus they are called code-based pseudoranges) and the Doppler measurements (used to get the pseudorange rates). The carrier phase measurement of the GNSS receiver can be used as well, for example: (i) as an alternate way to calculate ranges instead of the code-based pseudoranges, or (ii) to enhance the range calculation by incorporating information from both code-based pseudorange and carrier-phase measurements; such enhancement is the carrier-smoothed pseudorange.

It is further contemplated that the techniques of this disclosure can also be used with a navigation solution that relies on an ultra-tight integration scheme between GNSS receiver and the other sensors' readings.

It is further contemplated that the techniques of this disclosure can also be used with a navigation solution that uses various wireless communication systems that can also be used for positioning and navigation either as an additional aid (which will be more beneficial when GNSS is unavailable) or as a substitute for the GNSS information (e.g., for applications where GNSS is not applicable). Examples of these wireless communication systems used for positioning are, such as, those provided by cellular phone towers and signals, radio signals, digital television signals, WiFi, or WiMax. For example, for cellular phone based applications, an absolute coordinate from cell phone towers and the ranges between the indoor user and the towers may be utilized for positioning, whereby the range might be estimated by different methods among which calculating the time of arrival or the time difference of arrival of the closest cell phone positioning coordinates. A method known as Enhanced Observed Time Difference (E-OTD) can be used to get the known coordinates and range. The standard deviation for the range measurements may depend upon the type of oscillator used in the cell phone, and cell tower timing equipment and the transmission losses. WiFi positioning can be done in a variety of ways that includes but is not limited to time of arrival, time difference of arrival, angles of arrival, received signal strength, and fingerprinting techniques, among others; all of the methods provide different level of accuracies. The wireless communication system used for positioning may use different techniques for modeling the errors in the ranging, angles, or signal strength from wireless signals, and may use different multipath mitigation techniques. All the above mentioned ideas, among others, are also applicable in a similar manner for other wireless positioning techniques based on wireless communications systems.

It is further contemplated that the techniques of this disclosure can also be used with a navigation solution that utilizes aiding information from other moving devices. This aiding information can be used as additional aid (that will be more beneficial when GNSS is unavailable) or as a substitute for the GNSS information (e.g., for applications where GNSS based positioning is not applicable). One example of aiding information from other devices may be relying on wireless communication systems between different devices. The underlying idea is that the devices that have better positioning or navigation solution (for example having GNSS with good availability and accuracy) can help the devices with degraded or unavailable GNSS to get an improved positioning or navigation solution. This help relies on the well-known position of the aiding device(s) and the wireless communication system for positioning the device (s) with degraded or unavailable GNSS. This contemplated variant refers to the one or both circumstance(s) where: (i) the device(s) with degraded or unavailable GNSS utilize the methods described herein and get aiding from other devices and communication system, (ii) the aiding device with GNSS available and thus a good navigation solution utilize the methods described herein. The wireless communication system used for positioning may rely on different communication protocols, and it may rely on different methods, such as for example, time of arrival, time difference of arrival, angles of arrival, and received signal strength, among others. The wireless communication system used for positioning may use different techniques for modeling the errors in the ranging and/or angles from wireless signals, and may use different multipath mitigation techniques.

The embodiments and techniques described above may be implemented in software as various interconnected functional blocks or distinct software modules. This is not necessary, however, and there may be cases where these functional blocks or modules are equivalently aggregated into a single logic device, program or operation with unclear boundaries. In any event, the functional blocks and software modules implementing the embodiments described above, or features of the interface can be implemented by themselves, or in combination with other operations in either hardware or software, either within the device entirely, or in conjunction with the device and other processor enabled devices in communication with the device, such as a server.

Although a few embodiments have been shown and described, it will be appreciated by those skilled in the art that various changes and modifications can be made to these embodiments without changing or departing from their scope, intent or functionality. The terms and expressions used in the preceding specification have been used herein as terms of description and not of limitation, and there is no intention in the use of such terms and expressions of excluding equivalents of the features shown and described or portions thereof, it being recognized that the disclosure is defined and limited only by the claims that follow.

CONCLUSION

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. It will be appreciated by those skilled in the art that various changes and modifications can be made to these embodiments without changing or departing from their scope, intent, or functionality. The description as set forth is not intended to be exhaustive or to limit the embodiments to the precise form, terms, or expressions disclosed, and there is no intention of excluding equivalents of the features and acts shown and described. Rather, the specific features and acts described above are disclosed as example forms of implementing the claims.

What is claimed is:

1. A method of maintenance of a location fingerprint database for an area, the method comprising:
   collecting signal measurement data together with motion sensor data from each of a plurality of portable devices transiting a portion of the area of the location fingerprint database at a first period of time, wherein the motion sensor data comprises inertial sensor data and wherein the motion sensor data is collected by a sensor assembly in each of the plurality of portable devices;
   using offline non-causal processing to process the collected motion sensor data into reference positions associated with the portion of the area at a subsequent period of time, wherein the non-causal processing provides an output at a certain instant of time that is a function of past, present and future inputs that are obtained from the motion sensor data at past, present and future points in time, as compared to the certain instant of time; and
   employing the collected signal measurement data together with the reference positions using at least one of a plurality of processing techniques, in order to update the location fingerprint database.

2. The method as recited in claim 1, wherein the collecting signal measurement data together with motion sensor data from each of a plurality of portable devices transiting a portion of the area of the location fingerprint database comprises: collecting motion sensor data from at least one of an accelerometer and a gyroscope of a portable device of the portable devices.

3. The method as recited in claim 1, wherein the collecting signal measurement data together with motion sensor data from each of a plurality of portable devices transiting a portion of the area of the location fingerprint database comprises: collecting signal measurement data which comprises at least one of an acoustic signal measurement, a radio signal measurement, a wireless networking signal measurement, a magnetic signal measurement, and an optical signal measurement.

4. The method as recited in claim 1, wherein the location fingerprint database is one of a stable location fingerprint database and an unstable location fingerprint database.

5. The method as recited in claim 1, wherein the using offline non-causal processing to process the collected motion sensor data into reference positions associated with the portion of the area further comprises at least one of:
   a) using offline backward smoothing to process the collected motion sensor data into reference positions associated with the portion of the area;
   b) using offline map matching to process the collected motion sensor data into reference positions associated with the portion of the area; and
   c) using offline backward smoothing together with offline map matching to process the collected motion sensor data into reference positions associated with the portion of the area.

6. The method as recited in claim 1, wherein the using offline non-causal processing to process the collected motion sensor data into reference positions associated with the portion of the area comprises: using an offline non-causal processing technique selected from the list of techniques consisting of: backwards smoothing; forward and backward smoothing; and multi-pass smoothing.

7. The method as recited in claim 1, wherein the employing the collected signal measurement data together with the reference positions to update the location fingerprint database comprises at least one of:
   a) building out a new location fingerprint database;
   b) building out a new location fingerprint database using an existing fingerprint database, wherein the new location fingerprint database comprises fingerprints of a type of signal measurement different than the type of signal comprised in the existing location fingerprint database;
   c) bridging a gap which exists in the location fingerprint database;
   d) determining the location fingerprint database is unstable by comparing signal measurement data associated with a reference position of the reference positions with existing signal measurement data in the location fingerprint database which corresponds to the reference position;

e) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position;

f) when the location fingerprint database is known to be unstable, updating the location fingerprint database by replacing existing signal measurement data in the location fingerprint database which corresponds to the reference position with the signal measurement data associated with the reference position; g) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and h) when the location fingerprint database is known to be stable, updating the location fingerprint database by merging existing signal measurement data in the location fingerprint database which corresponds to the reference position with the signal measurement data associated with the reference position.

8. A computing system for maintenance of a location fingerprint database for an area, the computing system comprising:

an interface configured to receive signal measurement data together with motion sensor data from each of a plurality of portable devices transiting a portion of the area of the location fingerprint database at a first period of time, wherein the motion sensor data comprises inertial sensor data collected by a sensor assembly in each of the plurality of portable devices; and a processor configured to:
use offline non-causal processing to process the received motion sensor data into reference positions associated with the portion of the area at a subsequent period of time, wherein the non-causal processing provides an output at a certain instant of time that is a function of past, present and future inputs that are obtained from the motion sensor data at past, present and future points in time, as compared to the certain instant of time; and employ the received signal measurement data together with the reference positions using at least one of a plurality of processing techniques, in order to update the location fingerprint database.

9. The computing system of claim 8, further comprising: a portable device, of the plurality of portable devices, the portable device comprising a sensor assembly configured to output a portion of motion sensor data, the portion of motion sensor data representing motions of the portable device and being collected together with a portion of the signal measurement data while the portable device is transiting the portion of the area of the location fingerprint database.

10. The computing system of claim 8, further comprising: the plurality of portable devices.

11. The computing system of claim 8, wherein the using offline non-causal processing to process the received motion sensor data into reference positions associated with the portion of the area further comprises at least one of:
a) using offline backward smoothing to process the received motion sensor data into reference positions associated with the portion of the area;
b) using offline map matching to process the received motion sensor data into reference positions associated with the portion of the area; and
c) using offline backward smoothing together with offline map matching to process the received motion sensor data into reference positions associated with the portion of the area.

12. The computing system of claim 8, wherein the processor configured to employ the received signal measurement data together with the reference positions to update the location fingerprint database comprises the processor being configured to perform at least one of:
a) building out a new location fingerprint database;
b) building out a new location fingerprint database using an existing fingerprint database, wherein the new location fingerprint database comprises fingerprints of a type of signal measurement different than the type of signal comprised in the existing location fingerprint database;
c) bridging a gap which exists in the location fingerprint database;
d) determining the location fingerprint database is unstable by comparing signal measurement data associated with a reference position of the reference positions with existing signal measurement data in the location fingerprint database which corresponds to the reference position;
e) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position;
f) when the location fingerprint database is known to be unstable, updating the location fingerprint database by replacing existing signal measurement data in the location fingerprint database which corresponds to the reference position with the signal measurement data associated with the reference position; g) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and
h) when the location fingerprint database is known to be stable, updating the location fingerprint database by merging existing signal measurement data in the location fingerprint database which corresponds to the reference position with the signal measurement data associated with the reference position.

13. The computing system of claim 8, wherein the location fingerprint database is one of a stable location fingerprint database and an unstable location fingerprint database.

14. The computing system of claim 8, wherein the received motion sensor data comprises: data from at least one of an accelerometer and a gyroscope.

15. The computing system of claim 8, wherein the signal measurement data comprises at least one of: an acoustic signal measurement, a radio signal measurement, a wireless networking signal measurement, a magnetic signal measurement, and an optical signal measurement.

16. The computing system of claim 8, wherein the non-causal processing comprises one of: backwards smoothing; forward and backward smoothing; and multi-pass smoothing.

17. The computing system of claim 8, wherein the processor is one of: an edge processor located local to the area associated with the location fingerprint database; and a portion of a remote processing resource located remotely from the area associated with the location fingerprint database.

18. A portable device for updating a location fingerprint database for an area, the portable device comprising:
  a means to collect signal measurement data while transiting a portion of the area of the location fingerprint database;
  an integrated sensor assembly configured to output sensor data, the sensor data comprising motion sensor data collected while transiting the portion of the area of the location fingerprint database, the motion sensor data representing motions of the portable device and the motion sensor data comprising inertial sensor data; and
  a processor configured to:
    use offline non-causal processing to process the collected motion sensor data into reference positions associated with the portion of the area, wherein the non-causal processing provides an output at a certain instant of time that is a function of past, present and future inputs that are obtained from the motion sensor data at past, present and future points in time, as compared to the certain instant of time; and
    employ the collected signal measurement data together with the reference positions using at least one of a plurality of processing techniques, in order to update the location fingerprint database.

19. The portable device of claim 18, further comprising:
a communications module configured to receive signal measurement data collected together with motion sensor data from each of a plurality of portable devices transiting the portion of the area of the location fingerprint database, and wherein the processor is further configured to: use offline non-causal processing to process the received motion sensor data into additional reference positions associated with the portion of the area; and employ the received signal measurement data together with the additional reference positions to update the location fingerprint database.

20. The portable device of claim 18, wherein the processor being configured to use offline non-causal processing to process the collected motion sensor data into reference positions associated with the portion of the area further comprises the processor being configured to perform at least one of:
  a) using offline backward smoothing to process the collected motion sensor data into reference positions associated with the portion of the area;
  b) using offline map matching to process the collected motion sensor data into reference positions associated with the portion of the area; and
  c) using offline backward smoothing together with offline map matching to process the collected motion sensor data into reference positions associated with the portion of the area.

21. The portable device of claim 18, wherein the processor configured to employ the collected signal measurement data together with the reference positions to update the location fingerprint database comprises the processor being configured to perform at least one of:
  a) building out a new location fingerprint database;
  b) building out a new location fingerprint database using an existing fingerprint database, wherein the new location fingerprint database comprises fingerprints of a type of signal measurement different than the type of signal comprised in the existing location fingerprint database;
  c) bridging a gap which exists in the location fingerprint database;
  d) determining the location fingerprint database is unstable by comparing signal measurement data associated with a reference position of the reference positions with existing signal measurement data in the location fingerprint database which corresponds to the reference position;
  e) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position;
  f) when the location fingerprint database is known to be unstable, updating the location fingerprint database by replacing existing signal measurement data in the location fingerprint database which corresponds to the reference position with the signal measurement data associated with the reference position;
  g) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and
  h) when the location fingerprint database is known to be stable, updating the location fingerprint database by merging existing signal measurement data in the location fingerprint database which corresponds to the reference position with the signal measurement data associated with the reference position.

22. The portable device of claim 18, wherein the location fingerprint database is one of a stable location fingerprint database and an unstable location fingerprint database.

23. The portable device of claim 18, wherein the collected motion sensor data comprises: data from at least one of an accelerometer and a gyroscope.

24. The portable device of claim 18, wherein the signal measurement data comprises at least one of: an acoustic signal measurement, a radio signal measurement, a wireless networking signal measurement, a magnetic signal measurement, and an optical signal measurement.

25. The portable device of claim 18, wherein the non-causal processing comprises one of: backwards smoothing; forward and backward smoothing; and multi-pass smoothing.

26. A non-transitory computer readable storage medium comprising instructions embodied thereon for causing a computer system to perform a method of updating an unstable location fingerprint database for an area, the method comprising:
- collecting signal measurement data together with motion sensor data from each of a plurality of portable devices transiting a portion of the area of the location fingerprint database at a first period of time, wherein the motion sensor data comprises inertial sensor data and wherein the motion sensor data is collected by a sensor assembly in each of the plurality of portable devices;
- using offline non-causal processing to process the collected motion sensor data into reference positions associated with the portion of the area at a subsequent period of time, wherein the non-causal processing provides an output at a certain instant of time that is a function of past, present and future inputs that are obtained from the motion sensor data at past, present and future points in time, as compared to the certain instant of time; and
- employing the collected signal measurement data together with the reference positions using at least one of a plurality of processing techniques, in order to update the location fingerprint database.

27. The non-transitory computer readable storage medium of claim 26, wherein the using offline non-causal processing to process the collected motion sensor data into reference positions associated with the portion of the area further comprises at least one of:
- a) using offline backward smoothing to process the collected motion sensor data into reference positions associated with the portion of the area;
- b) using offline map matching to process the collected motion sensor data into reference positions associated with the portion of the area; and
- c) using offline backward smoothing together with offline map matching to process the collected motion sensor data into reference positions associated with the portion of the area.

28. The non-transitory computer readable storage medium of claim 26, wherein the employing the collected signal measurement data together with the reference positions to update the location fingerprint database comprises: building out a new location fingerprint database.

29. The non-transitory computer readable storage medium of claim 26, wherein the employing the collected signal measurement data together with the reference positions to update the location fingerprint database comprises: building out a new location fingerprint database using an existing fingerprint database, wherein the new location fingerprint database comprises fingerprints of a type of signal measurement different than the type of signal comprised in the existing location fingerprint database.

30. The non-transitory computer readable storage medium of claim 26, wherein the employing the collected signal measurement data together with the reference positions to update the location fingerprint database comprises: bridging a gap which exists in the location fingerprint database.

31. The non-transitory computer readable storage medium of claim 26, wherein the employing the collected signal measurement data together with the reference positions to update the location fingerprint database comprises performing at least one of the actions from the list of actions consisting of:
- a) determining the location fingerprint database is unstable by comparing signal measurement data associated with a reference position of the reference positions with existing signal measurement data in the location fingerprint database which corresponds to the reference position;
- b) determining the location fingerprint database is unstable by comparing signal measurement data associated with a reference position of the reference positions with existing signal measurement data in the location fingerprint database which corresponds to the reference position, and responsive to determining the location fingerprint database is unstable, updating the location fingerprint database by replacing the existing signal measurement data with the signal measurement data associated with the reference position; and
- c) when the location fingerprint database is known to be unstable, updating the location fingerprint database by replacing existing signal measurement data in the location fingerprint database which corresponds to the reference position with the signal measurement data associated with the reference position.

32. The non-transitory computer readable storage medium of claim 26, wherein the employing the collected signal measurement data together with the reference positions to update the location fingerprint database comprises performing at least one of the actions from the list of actions consisting of:
- a) determining the location fingerprint database is stable by comparing signal measurement data associated with a reference position of the reference positions with existing signal measurement data in the location fingerprint database which corresponds to the reference position, and responsive to determining the location fingerprint database is stable, merging the existing signal measurement data with the signal measurement data associated with the reference position; and
- b) when the location fingerprint database is known to be stable, updating the location fingerprint database by merging existing signal measurement data in the location fingerprint database which corresponds to the reference position with the signal measurement data associated with the reference position.

* * * * *